United States Patent
Roh et al.

(10) Patent No.: US 8,793,550 B2
(45) Date of Patent: *Jul. 29, 2014

(54) CHANNEL CODING METHOD OF VARIABLE LENGTH INFORMATION USING BLOCK CODE

(75) Inventors: Dong Wook Roh, Gyeonggi-do (KR); Joon Kui Ahn, Gyeonggi-do (KR); Nam Yul Yu, Gyeonggi-do (KR); Jung Hyun Cho, Gyeonggi-do (KR); Yu Jin Noh, Gyeonggi-do (KR); Ki Jun Kim, Gyeonggi-do (KR); Dae Won Lee, Gyeonggi-do (KR)

(73) Assignee: LG Electronics Inc., Seoul (KR)

( * ) Notice: Subject to any disclaimer, the term of this patent is extended or adjusted under 35 U.S.C. 154(b) by 994 days.

This patent is subject to a terminal disclaimer.

(21) Appl. No.: 12/343,673

(22) Filed: Dec. 24, 2008

(65) Prior Publication Data

US 2009/0175361 A1 Jul. 9, 2009

Related U.S. Application Data

(60) Provisional application No. 61/016,492, filed on Dec. 24, 2007, provisional application No. 61/021,018, filed on Jan. 14, 2008, provisional application No. 61/021,337, filed on Jan. 16, 2008, provisional application No. 61/026,464, filed on Feb. 5, 2008, provisional application No. 61/028,016, filed on Feb. 12, 2008.

(30) Foreign Application Priority Data

Jul. 30, 2008 (KR) .................. 10-2008-0074681

(51) Int. Cl.
*H03M 13/00* (2006.01)
*H03M 13/03* (2006.01)
*H03M 13/05* (2006.01)

(52) U.S. Cl.
USPC ............ 714/752; 714/759; 714/777; 714/779

(58) Field of Classification Search
None
See application file for complete search history.

(56) References Cited

U.S. PATENT DOCUMENTS 6,813,506 B1 11/2004 Song
2002/0013926 A1 1/2002 Kim et al.

(Continued)

FOREIGN PATENT DOCUMENTS

CN 1393071 1/2003
CN 1531236 9/2004

(Continued)

OTHER PUBLICATIONS

Samsung, "New Optimal Coding for Extended TFCI with Almost no Complexity Increase (rev 2)," TSG-RAN Working Group 1 meeting #7, TSGR1#7(99)99b60, XP-002254198, Aug. 30, 1999.

(Continued)

*Primary Examiner* — Albert Decady
*Assistant Examiner* — Justin R Knapp
(74) *Attorney, Agent, or Firm* — Lee, Hong, Degerman, Kang & Waimey

(57) ABSTRACT

A channel coding method of variable length information using block code is disclosed. A method for channel-coding information bits using a code generation matrix including 20 rows and A columns corresponding to length of the information bits includes, channel-coding the information bits having "A" length using basis sequences having 20-bit length corresponding to columns of the code generation matrix. If "A" is 10, individual basis sequences of the code generation matrix correspond to column-directional sequences of a specific matrix composed of 20 rows and 10 columns. The specific matrix is made from 20 rows of the (32,10) code matrix used for TFCI coding were selected.

6 Claims, 7 Drawing Sheets

(56) References Cited

U.S. PATENT DOCUMENTS

| | | | |
|---|---|---|---|
| 2003/0174669 A1* | 9/2003 | Roh et al. | 370/328 |
| 2004/0052236 A1 | 3/2004 | Hwang et al. | |
| 2004/0140914 A1 | 7/2004 | Aldridge et al. | |
| 2004/0216025 A1* | 10/2004 | Kim et al. | 714/755 |
| 2005/0105502 A1 | 5/2005 | Kim et al. | |
| 2006/0077947 A1* | 4/2006 | Kim et al. | 370/349 |
| 2007/0177566 A1 | 8/2007 | Xu et al. | |
| 2008/0043867 A1 | 2/2008 | Blanz et al. | |
| 2008/0192705 A1 | 8/2008 | Suzuki | |
| 2009/0168904 A1* | 7/2009 | Roh et al. | 375/253 |
| 2009/0180461 A1 | 7/2009 | Song | |

FOREIGN PATENT DOCUMENTS

| | | |
|---|---|---|
| CN | 1567730 | 1/2005 |
| CN | 1633761 | 6/2005 |
| CN | 101019348 | 8/2007 |
| GB | 2412553 | 9/2005 |
| JP | 2004-519161 | 6/2004 |
| JP | 2005-518136 | 6/2005 |
| JP | 3-847078 | 11/2006 |
| JP | 2011-501557 | 1/2011 |
| KR | 10-2001-0014778 | 2/2001 |
| KR | 1020010015268 | 2/2001 |
| KR | 1020020028860 | 4/2002 |
| KR | 1020030041728 | 5/2003 |
| KR | 10-0393618 | 8/2003 |
| KR | 1020030068749 | 8/2003 |
| KR | 1020060051349 | 5/2006 |
| KR | 10-0834662 | 6/2008 |
| KR | 10-0879942 | 1/2009 |
| WO | 0215409 | 2/2002 |
| WO | 2006/031070 | 3/2006 |
| WO | 2007-092816 | 8/2007 |

OTHER PUBLICATIONS

European Telecommunications Standards Institute (ESTI), "Universal Mobile Telecommunications System (UMTS); Multiplexing and Channel Coding (FDD) (3GPP TS 25.212 version 6.8.0 Release 6)," ETSI TS 125 212 V6.8.0, XP014034259, Jun. 2006.

LG Electronics, "Coding for CQI Moved from PUCCH to PUSCH," 3GPP TSG RAN WG1 #52, R1-081098, XP050109548, Feb. 11, 2008.

Wilson, S., "Linear Block Codes," Digital Modulation and Coding, XP-002275914, pp. 411-493, 1996.

LG Electronics and Philips, "Consideration on Basis Sequences for CQI Coding," 3GPP TSG RAN WG1 #25, TSGR1#25-02-0653, XP050096204, Apr. 9, 2002.

LG Electronics: "On the Design of CQI coding in PUCCH" 3GPP Draft; R1-080548_LG TFCI Based PUCCH, 3rd Generation Partnership Project (3GPP), Mobile Competence Centre; 650, Route Des Lucioles, F-06921 Sophia-Antipolis Cedex; France, XP050109057.

Samsung: "Coding scheme for Quality Indicator (rev. 1)" 3GPP Draft; R1-01-1324-Samsung Qi Coding, 3rd Generation Partnership Project (3GPP), Mobile Competence Centre; 650, Route Des Lucioles; F-06921 Sophia-Antipolis Cedex; France, XP050095582.

Y. Song, "Optimized Channel Coding of Control Channels for Mobile Packet Communication," Journal of the Korea Electromagnetic Engineering Society, vol. 3, No. 1, May 2003.

In the USPTO U.S. Appl. No. 13/605,867, Non-Final Office Action dated Oct. 26, 2012, 9 pages.

LG Electronics, et al., "Way Forward on PUCCH CQI coding," 3GPP TSG RAN WG1 #51bis, R1-080575, Jan. 2008, 2 pages.

MCC Support, "Report of 3GPP TSG RAN WG1 #51bis v1.0.0," 3GPP TSG RAN WG1 Meeting #52, R1-080631, Feb. 2008, 75 pages.

European Patent Office Application Serial No. 08022392.8, Search Report dated May 6, 2013, 10 pages.

Kwon, et al., "Analysis of TFCI Coding Performance of WCDMA Systems," IEEE Communications Letters, vol. 9, No. 11, Nov. 2005, pp. 979-981.

Motorola, "Details of A/N Subcode for Extended CP," 3GPP TSG RAN1 #52, R1-080740, Feb. 2008, 3 pages.

* cited by examiner

CHANNEL CODING METHOD OF VARIABLE LENGTH INFORMATION USING BLOCK CODE

CROSS-REFERENCE TO RELATED APPLICATIONS

This application claims the benefit of the U.S. Provisional Application Nos. 61/016,492, 61/021,018, 61/021,337, 61/026,464 and 61/028,016 filed on Dec. 24, 2007, Jan. 14, 2008, Jan. 16, 2008, Feb. 5, 2008 and Feb. 12, 2008, respectively, which are hereby incorporated by reference as if fully set forth herein. This application also claims the benefit and right of priority to Korean Patent Application No. 10-2008-0074681, filed on Jul. 30, 2008, the contents of which are hereby incorporated by reference herein in its entirety.

BACKGROUND OF THE INVENTION

1. Field of the Invention

The present invention relates to a coding method for a mobile communication system, and more particularly to a method for effectively performing a channel-coding process on information with various lengths using a block code.

2. Discussion of the Related Art

For the convenience of description and better understanding of the present invention, some concepts requisite for the present invention from among several basic coding theories will hereinafter be described in detail.

Generally, a general binary error correction code is denoted by [n, k, d], where "n" is the number of bits of coded codewords, "k" is the number of information bits created prior to the coding process, and "d" is a minimum distance between codewords. In this case, only the binary code has been considered for the above-mentioned binary error correction code, such that a number of possible codeword points in code space is denoted by $2^n$, and a total number of coded codewords is denoted by $2^k$. Also, if the minimum distance is not substantially considered to be important, the aforementioned binary error correction code may also be denoted by [n, k]. If there is no mention of the above error correction code in this application, it should be noted that individual values of "n", "k", and "d" be set to the above-mentioned values.

In this case, the above-mentioned error correction code should not be confused with a matrix-type block code composed of X number of rows (i.e., X rows) and Y number of columns (i.e., Y columns).

In the meantime, the coding rate R is defined as a specific value acquired when the number of information bits is divided by the number of bits of each codeword. In other words, the coding rate R is denoted by "k/n", i.e., R=k/n.

Next, the Hamming distance will hereinafter be described in detail.

If two binary codes having the same number of bits include some bits having different bit values, the above-mentioned Hamming distance is indicative of the number of the above bits having the different bit values. Generally, if the Hamming distance "d" is denoted by d=2a+1, "a" number of errors can be corrected. For example, if one of two codewords is 101011 and the other one is 110010, the Hamming distance between the two codewords is 3.

In the meantime, the term "minimum distance" for use in the coding theory is indicative of a minimum value between two arbitrary codewords contained in a code. The minimum distance is considered to be one of criteria to evaluate the performance of a code. The longer the distance between the codewords generated by the coding process, the lower the probability of misdetecting a corresponding codeword to be another codeword. As a result, the coding performance becomes better.

Performance of a total code is estimated by a minimum distance between codewords having the worst performance. In conclusion, if a minimum distance of a specific code is maximized, this specific code may have a superior performance.

In the next-generation mobile communication system, control information carries system constituent information and transmission channel information, such that it is considered to be very important information to determine a system performance. Generally, this control information has a short length to use a relatively small amount of system resources. The above-mentioned control information is coded by the coding technique very resistant to a channel error, and is then transmitted. A variety of coding schemes for the above control information have been considered in the 3GPP mobile communication system, for example, a short-length block code based on a Reed-Muller (RM) code, a tail-biting convolution code, and a repetition code of a complex code.

In the meantime, the control information for use in the 3GPP LTE system acting as an improved format of the above-mentioned mobile communication system is coded by means of block codes, such that the block-coded control information is then transmitted. In more detail, if the length of a transmission (Tx) information bit is "A", many developers and companies are conducting intensive research into various methods for transmitting control information using a block code composed of 20 rows and A columns (i.e., (20,A) block code).

The (20,A) block code may have various formats. It is difficult for a user to search for an optimum format after checking individual coding performances of each length of information bits associated with individual block codes.

SUMMARY OF THE INVENTION

Accordingly, the present invention is directed to a method of channel-coding various lengths of information using a block code that substantially obviates one or more problems due to limitations and disadvantages of the related art.

An object of the present invention is to provide an effective (20,A) block coding method of various lengths of information. In other words, under the condition that the length of an information bit is changed in various ways and the bit length of a coded codeword is also changed in various ways, the present invention provides the (20,A) block coding method for effectively supporting the combination of various bit lengths.

In the meantime, the number of coded bits may be equal to or less than 20, and the number of information bits may be changed in various ways. Therefore, according to the following embodiments of the present invention, the present invention provides a method for effectively using only some necessary parts of the proposed block codes associated with the number of long-length information bits or the number of long-length coding bits.

To achieve these objects and other advantages and in accordance with the purpose of the invention, as embodied and broadly described herein, a method for channel-coding information bits using a code generation matrix which includes 20 rows and A columns corresponding to a length of the information bits, the method comprising: channel-coding the information bits having the length of A using basis sequences having a 20-bit length corresponding to individual columns of the code generation matrix, in which if the A value is "10", each basis sequence of the code generation matrix corresponds to a column-directional sequence of a first or second matrix, in which the first matrix includes 20 rows and 10 columns, which are constructed when 20 rows other than 2nd, 5-th, 8-th, 11-th, 15-th, 16-th, 21-th, 22-th, 25-th, 29-th, 30-th, and 31-th rows were selected from a code matrix composed of 32 rows and 10 columns used for coding Transport Format Combination Indicator (TFCI) information, and the second matrix is made when at least one of the order of rows and the order of columns of the first matrix was permuted.

Preferably, if the A value is higher than "10", each basis sequence of the code generation matrix corresponds to a column-direction sequence of a third matrix, in which the third matrix is generated when (A-10) number of basis sequences from among several additional basis sequences were added as column-directional sequences to the first or second matrix, and each additional basis sequence has a length "20" and satisfies a predetermined condition in which a maximum value of a minimum Hamming distance is 4.

Preferably, if the A value is higher than "10", each basis sequence of the code generation matrix corresponds to a column-direction sequence of a third matrix, in which the third matrix is generated when (A-10) number of basis sequences from among several additional basis sequences were added as column-directional sequences to the first or second matrix, and each additional basis sequence has a length "20" composed of four "0" values.

Preferably, the additional basis sequences include at least one of [1, 1, 1, 1, 1, 1, 1, 1, 1, 1, 1, 1, 1, 1, 1, 0, 0, 0, 0], [1, 1, 1, 1, 1, 1, 1, 1, 1, 1, 1, 1, 1, 0, 0, 1, 1, 0, 0, 0], [0, 0, 1, 1, 1, 1, 1, 1, 1, 1, 1, 1, 1, 1, 1, 1, 1, 0, 0], and [0, 0, 1, 1, 1, 0, 0, 1, 1, 1, 1, 1, 1, 1, 1, 1, 1, 1, 1, 1].

Preferably, if the A value is equal to or less than "14", a predetermined number of column-direction sequences corresponding to the A length on the basis of a left side of column-directional sequences of a fourth matrix sequentially correspond to the individual basis sequences of the code generation matrix, in which the fourth matrix is represented by the following Table.

TABLE

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ | $M_{i,13}$ |
|---|---|---|---|---|---|---|---|---|---|---|---|---|---|---|
| 0  | 1 | 1 | 0 | 0 | 0 | 0 | 0 | 0 | 0 | 0 | 1 | 1 | 0 | 0 |
| 1  | 1 | 1 | 1 | 0 | 0 | 0 | 0 | 0 | 0 | 1 | 1 | 1 | 0 | 0 |
| 2  | 1 | 0 | 0 | 1 | 0 | 0 | 1 | 0 | 1 | 1 | 1 | 1 | 1 | 1 |
| 3  | 1 | 0 | 1 | 1 | 0 | 0 | 0 | 0 | 1 | 0 | 1 | 1 | 1 | 1 |
| 4  | 1 | 1 | 1 | 1 | 0 | 0 | 0 | 1 | 0 | 0 | 1 | 1 | 1 | 1 |
| 5  | 1 | 1 | 0 | 0 | 1 | 0 | 1 | 1 | 1 | 0 | 1 | 1 | 1 | 0 |
| 6  | 1 | 0 | 1 | 0 | 1 | 0 | 1 | 0 | 1 | 1 | 1 | 1 | 1 | 0 |
| 7  | 1 | 0 | 0 | 1 | 1 | 0 | 0 | 1 | 1 | 0 | 1 | 1 | 1 | 1 |
| 8  | 1 | 1 | 0 | 1 | 1 | 0 | 0 | 1 | 0 | 1 | 1 | 1 | 1 | 1 |
| 9  | 1 | 0 | 1 | 1 | 1 | 0 | 1 | 0 | 0 | 1 | 1 | 1 | 1 | 1 |
| 10 | 1 | 0 | 1 | 0 | 0 | 1 | 1 | 1 | 0 | 1 | 1 | 1 | 1 | 1 |
| 11 | 1 | 1 | 1 | 0 | 0 | 1 | 1 | 0 | 1 | 0 | 1 | 1 | 1 | 1 |
| 12 | 1 | 0 | 0 | 1 | 0 | 1 | 0 | 1 | 1 | 1 | 1 | 1 | 1 | 1 |
| 13 | 1 | 1 | 0 | 1 | 0 | 1 | 0 | 1 | 0 | 1 | 1 | 1 | 1 | 1 |
| 14 | 1 | 0 | 0 | 0 | 1 | 1 | 0 | 1 | 0 | 0 | 1 | 0 | 1 | 1 |
| 15 | 1 | 1 | 0 | 0 | 1 | 1 | 1 | 1 | 0 | 1 | 1 | 0 | 1 | 1 |
| 16 | 1 | 1 | 1 | 0 | 1 | 1 | 1 | 0 | 0 | 1 | 0 | 1 | 1 | 1 |
| 17 | 1 | 0 | 0 | 1 | 1 | 1 | 0 | 0 | 1 | 0 | 0 | 1 | 1 | 1 |
| 18 | 1 | 1 | 0 | 1 | 1 | 1 | 1 | 1 | 0 | 0 | 0 | 0 | 0 | 1 |
| 19 | 1 | 0 | 0 | 0 | 0 | 1 | 1 | 0 | 0 | 0 | 0 | 0 | 0 | 1 |

Preferably, if the A value is equal to or less than "13", a predetermined number of column-direction sequences corresponding to the A length on the basis of a left side of column-directional sequences of a fifth matrix sequentially correspond to the individual basis sequences of the code generation matrix, in which the fifth matrix is represented by the following Table.

TABLE

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|
| 0  | 1 | 1 | 0 | 0 | 0 | 0 | 0 | 0 | 0 | 0 | 1 | 1 | 0 |
| 1  | 1 | 1 | 1 | 0 | 0 | 0 | 0 | 0 | 0 | 1 | 1 | 1 | 0 |
| 2  | 1 | 0 | 0 | 1 | 0 | 0 | 1 | 0 | 1 | 1 | 1 | 1 | 1 |
| 3  | 1 | 0 | 1 | 1 | 0 | 0 | 0 | 0 | 1 | 0 | 1 | 1 | 1 |
| 4  | 1 | 1 | 1 | 1 | 0 | 0 | 0 | 1 | 0 | 0 | 1 | 1 | 1 |
| 5  | 1 | 1 | 0 | 0 | 1 | 0 | 1 | 1 | 1 | 0 | 1 | 1 | 1 |
| 6  | 1 | 0 | 1 | 0 | 1 | 0 | 1 | 0 | 1 | 1 | 1 | 1 | 1 |
| 7  | 1 | 0 | 0 | 1 | 1 | 0 | 0 | 1 | 1 | 0 | 1 | 1 | 1 |
| 8  | 1 | 1 | 0 | 1 | 1 | 0 | 0 | 1 | 0 | 1 | 1 | 1 | 1 |
| 9  | 1 | 0 | 1 | 1 | 1 | 0 | 1 | 0 | 0 | 1 | 1 | 1 | 1 |
| 10 | 1 | 0 | 1 | 0 | 0 | 1 | 1 | 1 | 0 | 1 | 1 | 1 | 1 |
| 11 | 1 | 1 | 1 | 0 | 0 | 1 | 1 | 0 | 1 | 0 | 1 | 1 | 1 |
| 12 | 1 | 0 | 0 | 1 | 0 | 1 | 0 | 1 | 1 | 1 | 1 | 1 | 1 |
| 13 | 1 | 1 | 0 | 1 | 0 | 1 | 0 | 1 | 0 | 1 | 1 | 1 | 1 |
| 14 | 1 | 0 | 0 | 0 | 1 | 1 | 0 | 1 | 0 | 0 | 1 | 0 | 1 |
| 15 | 1 | 1 | 0 | 0 | 1 | 1 | 1 | 1 | 0 | 1 | 1 | 0 | 1 |
| 16 | 1 | 1 | 1 | 0 | 1 | 1 | 1 | 0 | 0 | 1 | 0 | 1 | 1 |

TABLE-continued

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|
| 17 | 1 | 0 | 0 | 1 | 1 | 1 | 0 | 0 | 1 | 0 | 0 | 1 | 1 |
| 18 | 1 | 1 | 0 | 1 | 1 | 1 | 1 | 1 | 0 | 0 | 0 | 0 | 0 |
| 19 | 1 | 0 | 0 | 0 | 0 | 1 | 1 | 0 | 0 | 0 | 0 | 0 | 0 |

In another aspect of the present invention, there is provided a method for channel-coding information bits using a code generation matrix which includes 20 rows and A columns corresponding to a length of the information bits, the method comprising: channel-coding the information bits having the length of A using basis sequences having a 20-bit length corresponding to individual columns of the code generation matrix, in which if the A value is "10", each basis sequence of the code generation matrix corresponds to a column-directional sequence of a first or second matrix, in which the second matrix is made when at least one of the order of rows and the order of the columns of the first matrix was permuted, and the first matrix is represented by the following Table.

[Table]

TABLE

| | | | | | | | | | |
|---|---|---|---|---|---|---|---|---|---|
| 1 | 0 | 1 | 1 | 1 | 1 | 1 | 1 | 0 | 0 |
| 0 | 0 | 1 | 1 | 1 | 1 | 0 | 0 | 1 | 0 |
| 1 | 1 | 0 | 1 | 1 | 1 | 1 | 0 | 0 | 1 |
| 1 | 0 | 0 | 1 | 1 | 1 | 1 | 1 | 0 | 1 |
| 0 | 0 | 0 | 1 | 1 | 1 | 0 | 1 | 0 | 0 |
| 1 | 0 | 1 | 0 | 1 | 1 | 0 | 1 | 0 | 1 |
| 0 | 0 | 1 | 0 | 1 | 1 | 0 | 1 | 1 | 1 |
| 1 | 1 | 0 | 0 | 1 | 1 | 1 | 0 | 1 | 0 |
| 0 | 1 | 0 | 0 | 1 | 1 | 1 | 1 | 0 | 1 |
| 0 | 0 | 0 | 0 | 1 | 1 | 1 | 0 | 0 | 0 |
| 0 | 1 | 1 | 1 | 0 | 1 | 1 | 0 | 0 | 1 |

TABLE-continued

| | | | | | | | | | |
|---|---|---|---|---|---|---|---|---|---|
| 1 | 0 | 1 | 1 | 0 | 1 | 0 | 1 | 0 | 1 |
| 0 | 0 | 1 | 1 | 0 | 1 | 0 | 1 | 1 | 0 |
| 0 | 1 | 0 | 1 | 0 | 1 | 1 | 0 | 1 | 1 |
| 1 | 0 | 0 | 1 | 0 | 1 | 1 | 1 | 1 | 0 |
| 1 | 1 | 1 | 0 | 0 | 1 | 0 | 1 | 0 | 0 |
| 0 | 1 | 1 | 0 | 0 | 1 | 0 | 0 | 1 | 0 |
| 0 | 0 | 1 | 0 | 0 | 1 | 1 | 0 | 1 | 1 |
| 1 | 1 | 0 | 0 | 0 | 1 | 0 | 0 | 0 | 1 |
| 1 | 0 | 0 | 0 | 0 | 1 | 0 | 0 | 0 | 0 |

Preferably, if the A value is higher than "10", each basis sequence of the code generation matrix corresponds to a column-direction sequence of a third matrix, in which the third matrix is generated when (A-10) number of sequences from among several sequences were added as column-directional sequences to the first or second matrix, and the several sequences are [1, 1, 1, 1, 1, 1, 1, 1, 1, 1, 1, 1, 1, 1, 1, 1, 0, 0, 0, 0], [1, 1, 1, 1, 1, 1, 1, 1, 1, 1, 1, 1, 1, 0, 0, 1, 1, 0, 0], [0, 0, 1, 1, 1, 1, 1, 1, 1, 1, 1, 1, 1, 1, 1, 1, 0, 0], and [0, 0, 1, 1, 1, 0, 0, 1, 1, 1, 1, 1, 1, 1, 1, 1, 1, 1, 1, 1].

Preferably, if the A value is equal to or less than "14", a predetermined number of column-direction sequences corresponding to the A length on the basis of a left side of column-directional sequences of a fourth matrix sequentially correspond to the individual basis sequences of the code generation matrix, in which the fourth matrix is represented by the following Table.

TABLE

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ | $M_{i,13}$ |
|---|---|---|---|---|---|---|---|---|---|---|---|---|---|---|
| 0 | 1 | 1 | 0 | 0 | 0 | 0 | 0 | 0 | 0 | 0 | 1 | 1 | 0 | 0 |
| 1 | 1 | 1 | 1 | 0 | 0 | 0 | 0 | 0 | 0 | 1 | 1 | 1 | 0 | 0 |
| 2 | 1 | 0 | 0 | 1 | 0 | 0 | 1 | 0 | 1 | 1 | 1 | 1 | 1 | 1 |
| 3 | 1 | 0 | 1 | 1 | 0 | 0 | 0 | 0 | 1 | 0 | 1 | 1 | 1 | 1 |
| 4 | 1 | 1 | 1 | 1 | 0 | 0 | 0 | 1 | 0 | 0 | 1 | 1 | 1 | 1 |
| 5 | 1 | 1 | 0 | 0 | 1 | 0 | 1 | 1 | 1 | 0 | 1 | 1 | 1 | 0 |
| 6 | 1 | 0 | 1 | 0 | 1 | 0 | 1 | 0 | 1 | 1 | 1 | 1 | 1 | 0 |
| 7 | 1 | 0 | 0 | 1 | 1 | 0 | 0 | 1 | 1 | 0 | 1 | 1 | 1 | 1 |
| 8 | 1 | 1 | 0 | 1 | 1 | 0 | 0 | 1 | 0 | 1 | 1 | 1 | 1 | 1 |
| 9 | 1 | 0 | 1 | 1 | 1 | 0 | 1 | 0 | 0 | 1 | 1 | 1 | 1 | 1 |
| 10 | 1 | 0 | 1 | 0 | 0 | 1 | 1 | 1 | 0 | 1 | 1 | 1 | 1 | 1 |
| 11 | 1 | 1 | 1 | 0 | 0 | 1 | 1 | 0 | 1 | 0 | 1 | 1 | 1 | 1 |
| 12 | 1 | 0 | 0 | 1 | 0 | 1 | 0 | 1 | 1 | 1 | 1 | 1 | 1 | 1 |
| 13 | 1 | 1 | 0 | 1 | 0 | 1 | 0 | 1 | 0 | 1 | 1 | 1 | 1 | 1 |
| 14 | 1 | 0 | 0 | 0 | 1 | 1 | 0 | 1 | 0 | 0 | 1 | 0 | 1 | 1 |
| 15 | 1 | 1 | 0 | 0 | 1 | 1 | 1 | 1 | 0 | 1 | 1 | 0 | 1 | 1 |
| 16 | 1 | 1 | 1 | 0 | 1 | 1 | 1 | 0 | 0 | 1 | 0 | 1 | 1 | 1 |
| 17 | 1 | 0 | 0 | 1 | 1 | 1 | 0 | 0 | 1 | 0 | 0 | 1 | 1 | 1 |
| 18 | 1 | 1 | 0 | 1 | 1 | 1 | 1 | 1 | 0 | 0 | 0 | 0 | 0 | 1 |
| 19 | 1 | 0 | 0 | 0 | 0 | 1 | 1 | 0 | 0 | 0 | 0 | 0 | 0 | 1 |

Preferably, if the A value is equal to or less than "13", a predetermined number of column-direction sequences corresponding to the A length on the basis of a left side of column-directional sequences of a fourth matrix sequentially correspond to the individual basis sequences of the code generation matrix, in which the fourth matrix is represented by the following Table.

TABLE

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|
| 0  | 1 | 1 | 0 | 0 | 0 | 0 | 0 | 0 | 0 | 0 | 1 | 1 | 0 |
| 1  | 1 | 1 | 1 | 0 | 0 | 0 | 0 | 0 | 0 | 1 | 1 | 1 | 0 |
| 2  | 1 | 0 | 0 | 1 | 0 | 0 | 1 | 0 | 1 | 1 | 1 | 1 | 1 |
| 3  | 1 | 0 | 1 | 1 | 0 | 0 | 0 | 0 | 1 | 0 | 1 | 1 | 1 |
| 4  | 1 | 1 | 1 | 1 | 0 | 0 | 0 | 1 | 0 | 0 | 1 | 1 | 1 |
| 5  | 1 | 1 | 0 | 0 | 1 | 0 | 1 | 1 | 1 | 0 | 1 | 1 | 1 |
| 6  | 1 | 0 | 1 | 0 | 1 | 0 | 1 | 0 | 1 | 1 | 1 | 1 | 1 |
| 7  | 1 | 0 | 0 | 1 | 1 | 0 | 0 | 1 | 1 | 0 | 1 | 1 | 1 |
| 8  | 1 | 1 | 0 | 1 | 1 | 0 | 0 | 1 | 0 | 1 | 1 | 1 | 1 |
| 9  | 1 | 0 | 1 | 1 | 1 | 0 | 1 | 0 | 0 | 1 | 1 | 1 | 1 |
| 10 | 1 | 0 | 1 | 0 | 0 | 1 | 1 | 1 | 0 | 1 | 1 | 1 | 1 |
| 11 | 1 | 1 | 1 | 0 | 0 | 1 | 1 | 0 | 1 | 0 | 1 | 1 | 1 |
| 12 | 1 | 0 | 0 | 1 | 0 | 1 | 0 | 1 | 1 | 1 | 1 | 1 | 1 |
| 13 | 1 | 1 | 0 | 1 | 0 | 1 | 0 | 1 | 0 | 1 | 1 | 1 | 1 |
| 14 | 1 | 0 | 0 | 0 | 1 | 1 | 0 | 1 | 0 | 0 | 1 | 0 | 1 |
| 15 | 1 | 1 | 0 | 0 | 1 | 1 | 1 | 1 | 0 | 1 | 1 | 0 | 1 |
| 16 | 1 | 1 | 1 | 0 | 1 | 1 | 1 | 0 | 0 | 1 | 0 | 1 | 1 |
| 17 | 1 | 0 | 0 | 1 | 1 | 1 | 0 | 0 | 1 | 0 | 0 | 1 | 1 |
| 18 | 1 | 1 | 0 | 1 | 1 | 1 | 1 | 1 | 0 | 0 | 0 | 0 | 0 |
| 19 | 1 | 0 | 0 | 0 | 0 | 1 | 1 | 0 | 0 | 0 | 0 | 0 | 0 |

Preferably, the information bit includes at least one of a channel quality information (CQI) bit, a precoding matrix indicator (PMI), a channel rank indicator (RI), and ACK/NACK data.

Preferably, the channel-coded information bits are transmitted via a physical uplink control channel (PUCCH).

It is to be understood that both the foregoing general description and the following detailed description of the present invention are exemplary and explanatory and are intended to provide further explanation of the invention as claimed.

According to the above-mentioned embodiments of the present invention, the present invention reuses a part of code generation matrix used for TFCI (Transport Format Combination Indicator) information coding of a conventional 3GPP system, such that it can easily implement the (20,k) block coding. As a result, a maximum- or minimum-distance between the generated codewords increases, resulting in an increased system performance.

BRIEF DESCRIPTION OF THE DRAWINGS

The accompanying drawings, which are included to provide a further understanding of the invention, illustrate embodiments of the invention and together with the description serve to explain the principle of the invention.

In the drawings.

DETAILED DESCRIPTION OF THE INVENTION

Figure 1:
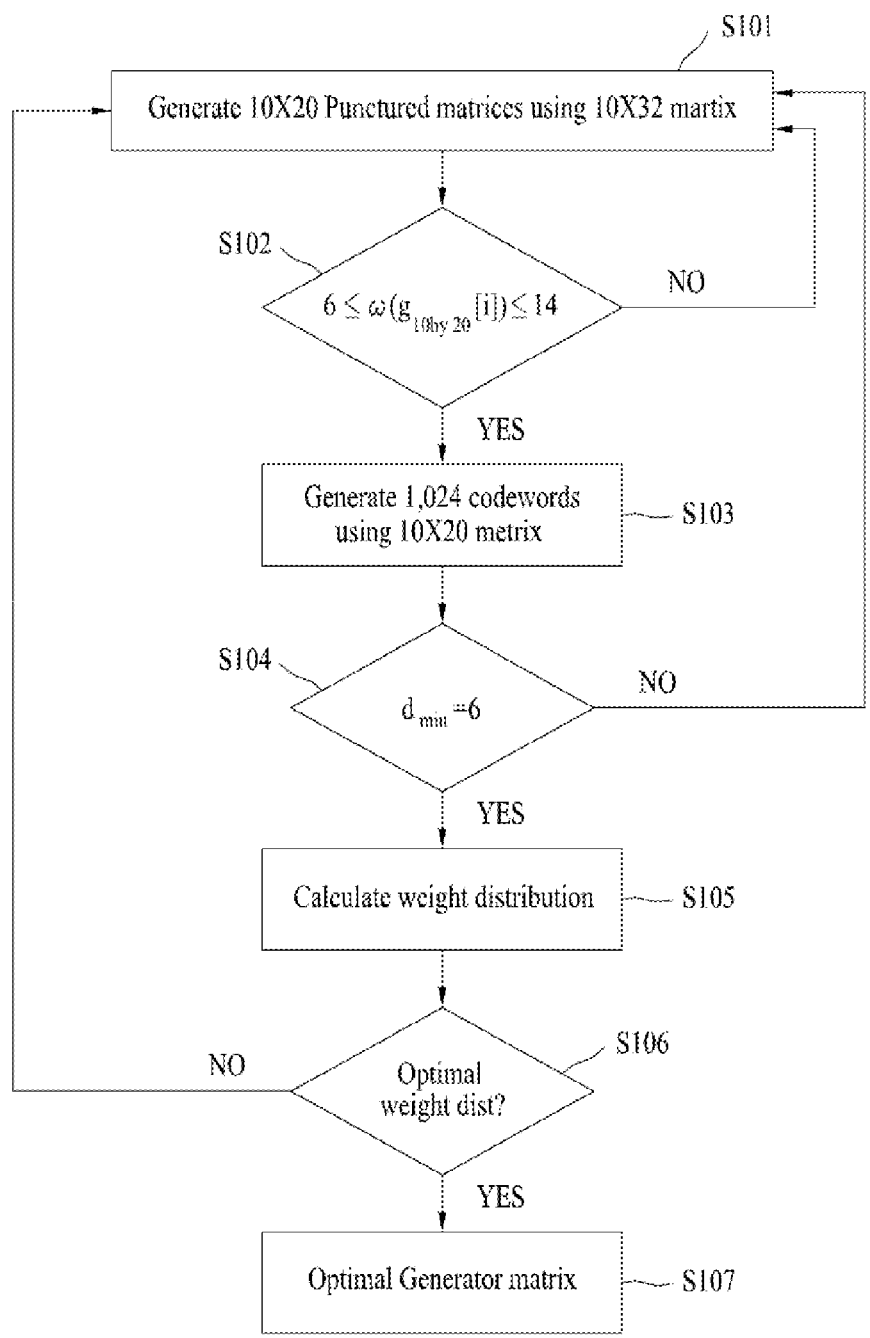
FIG. 1 is a flow chart illustrating a method for effectively generating the (20,10) block code from the (32,10) TFCI information code according to an embodiment of the present invention.

Reference will now be made in detail to the preferred embodiments of the present invention, examples of which are illustrated in the accompanying drawings.

Wherever possible, the same reference numbers will be used throughout the drawings to refer to the same or like parts.

Prior to describing the present invention, it should be noted that most terms disclosed in the present invention correspond to general terms well known in the art, but some terms have been selected by the applicant as necessary and will hereinafter be disclosed in the following description of the present invention. Therefore, it is preferable that the terms defined by the applicant be understood on the basis of their meanings in the present invention. For example, although the following description relates to a detailed example applied to the 3GPP LTE (3rd Generation Partnership Project Long Term Evolution) system, the present invention can also be applied to not only the above 3GPP LTE system but also other arbitrary communication systems which need to perform the channel coding process on variable-length control information using the block code.

For the convenience of description and better understanding of the present invention, general structures and devices well known in the art will be omitted or be denoted by a block diagram or a flow chart. Wherever possible, the same reference numbers will be used throughout the drawings to refer to the same or like parts.

According to one aspect of the present invention, the present invention provides a method for effectively performing the (20,A) block coding on various lengths of information. For this purpose, the present invention configures a code on the basis of a generation matrix of a block code used for a conventional system, such that it reduces the number of coding- and decoding-times. In more detail, the present invention adds a specific condition to a searching process of a generation matrix for coding long-length information, such that it can quickly and effectively search for a large-sized generation matrix.

In the meantime, according to another aspect of the present invention, the present invention provides a method for effectively using only some necessary parts of the proposed block codes associated with the long-length information bits or the long-length coding bits. For this purpose, while various-length information is block-coded, the present invention maximally and commonly implements generation matrixes corresponding to individual lengths, such that it can effectively perform the coding process. In other words, according to a large-sized generation matrix based on the length of maximum information amount, the present invention configures a specific generation matrix for coding the information of which length is equal to or shorter than the maximum length, such that it can maximally maintains common points between generation matrixes for individual lengths.

According to a first method for implementing the above-mentioned embodiment, the present invention optimizes each generation matrix according to an amount of individual information, the length of which is equal to or shorter than the maximum length, such that it can configure the optimum generation matrix. A second method for implementing the above-mentioned embodiment, in constructing a generation matrix for coding the information, the length of which is equal to or shorter than the maximum length, can configure a generation matrix for long-length information to include a generation matrix for short-length information such that the generation matrix for long-length information has a nested structure. According to a third method, the present invention can configure an optimum generation matrix for each information length with a hybrid structure, such that it has a nested structure as much as possible.

According to the above one aspect of the present invention, the channel coding method according to the present invention extends the (20,A) block code to the range of the (20,14) block code, and performs the channel coding on A-length information using the extended result.

In a first process, the present invention generates the (20, 10) code from the (32,10) code used for coding Transport Format Combination Indicator (TFCI) information, and a detailed description thereof will hereinafter be described.

In a second process, if the length of information bits (i.e., the information-bit length) is equal to or longer than 10 bits, the present invention adds a basis sequence to the (20,10) code according to the number of information bits, such that it can generate a maximum of the (20,14) code. A detailed description thereof will hereinafter be described.

In a third process, the present invention corrects the (20,14) code to improve a performance.

In the meantime, the present invention will disclose the block coding method capable of generating the 18-bits or 16-bits length codeword on the basis of the above-mentioned (20,14) code, and a detailed description thereof will hereinafter be described.

The present invention can be appropriately applied to the channel coding executed when the 3GPP LTE system transmits CQI (Channel Quality Information) information over a Physical Uplink Control CHannel (PUCCH). However, the application scope of the present invention is not limited to only the above-mentioned examples, but it can be applied to a variety of systems which need to channel-code various-length control information.

1. First Aspect (20,A) Block Coding (1) First Step—(20,10) Block Code Generation This embodiment of the present invention provides a generation matrix of a Punctured Reed-Muller (PRM) code for use in the next-generation mobile communication system. This PRM-code generation matrix is based on a generation matrix of the (32,10) code used for the channel coding of Transport Format Combination Indicator (TFCI) information, such that it is punctured according to the length of a coded codeword.

The reuse of the (32,10) TFCI information code has a variety of advantages. Firstly, the TFCI information code has been designed on the basis of the Reed-Muller (RM) code, such that the punctured TFCI code may have a modified Reed-Muller (RM) code structure. This Reed-Muller (RM)-based code has an advantage in that it can be quickly decoded by a fast Hadamard transform method during the decoding process. Secondly, the TFCI coding method supports a various-length information bit and a various-length coding bit. In this way, the information-bit length or the coding-bit length can be changed in various ways, such that requirements for CQI transmission of the 3GPP LTE can be well satisfied.

The following Table 1 shows the (32,10)-code generation matrix used for the channel coding of TFCI information in the 3GPP Rel' 99. In this case, the (32,10)-code generation matrix generates a specific codeword which has the length of 32 bits and the value of $d_{min}=12$.

TABLE 1

| TFCI Index | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ |
|---|---|---|---|---|---|---|---|---|---|---|
| 0 | 1 | 0 | 0 | 0 | 0 | 1 | 0 | 0 | 0 | 0 |
| 1 | 0 | 1 | 0 | 0 | 0 | 1 | 1 | 0 | 0 | 0 |
| 2 | 1 | 1 | 0 | 0 | 0 | 1 | 0 | 0 | 0 | 1 |
| 3 | 0 | 0 | 1 | 0 | 0 | 1 | 1 | 0 | 1 | 1 |
| 4 | 1 | 0 | 1 | 0 | 0 | 1 | 0 | 0 | 0 | 1 |
| 5 | 0 | 1 | 1 | 0 | 0 | 1 | 0 | 0 | 1 | 0 |
| 6 | 1 | 1 | 1 | 0 | 0 | 1 | 0 | 1 | 0 | 0 |
| 7 | 0 | 0 | 0 | 1 | 0 | 1 | 0 | 1 | 1 | 0 |
| 8 | 1 | 0 | 0 | 1 | 0 | 1 | 1 | 1 | 1 | 0 |
| 9 | 0 | 1 | 0 | 1 | 0 | 1 | 1 | 0 | 1 | 1 |

TABLE 1-continued

| TFCI Index | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ |
|---|---|---|---|---|---|---|---|---|---|---|
| 10 | 1 | 1 | 0 | 1 | 0 | 1 | 0 | 0 | 1 | 1 |
| 11 | 0 | 0 | 1 | 1 | 0 | 1 | 0 | 1 | 1 | 0 |
| 12 | 1 | 0 | 1 | 1 | 0 | 1 | 0 | 1 | 0 | 1 |
| 13 | 0 | 1 | 1 | 1 | 0 | 1 | 1 | 0 | 0 | 1 |
| 14 | 1 | 1 | 1 | 1 | 0 | 1 | 1 | 1 | 1 | 1 |
| 15 | 1 | 0 | 0 | 0 | 1 | 1 | 1 | 1 | 0 | 0 |
| 16 | 0 | 1 | 0 | 0 | 1 | 1 | 1 | 1 | 0 | 1 |
| 17 | 1 | 1 | 0 | 0 | 1 | 1 | 1 | 0 | 1 | 0 |
| 18 | 0 | 0 | 1 | 0 | 1 | 1 | 0 | 1 | 1 | 1 |
| 19 | 1 | 0 | 1 | 0 | 1 | 1 | 0 | 1 | 0 | 1 |
| 20 | 0 | 1 | 1 | 0 | 1 | 1 | 0 | 0 | 1 | 1 |
| 21 | 1 | 1 | 1 | 0 | 1 | 1 | 0 | 1 | 1 | 1 |
| 22 | 0 | 0 | 0 | 1 | 1 | 1 | 0 | 1 | 0 | 0 |
| 23 | 1 | 0 | 0 | 1 | 1 | 1 | 1 | 1 | 0 | 1 |
| 24 | 0 | 1 | 0 | 1 | 1 | 1 | 1 | 0 | 1 | 0 |
| 25 | 1 | 1 | 0 | 1 | 1 | 1 | 1 | 0 | 0 | 1 |
| 26 | 0 | 0 | 1 | 1 | 1 | 1 | 0 | 0 | 1 | 0 |
| 27 | 1 | 0 | 1 | 1 | 1 | 1 | 1 | 1 | 0 | 0 |
| 28 | 0 | 1 | 1 | 1 | 1 | 1 | 1 | 1 | 1 | 0 |
| 29 | 1 | 1 | 1 | 1 | 1 | 1 | 1 | 1 | 1 | 1 |
| 30 | 0 | 0 | 0 | 0 | 0 | 1 | 0 | 0 | 0 | 0 |
| 31 | 0 | 0 | 0 | 0 | 1 | 1 | 1 | 0 | 0 | 0 |

In the following description, the (32,10) block code shown in Table 1 will hereinafter be called a TFCI information code or a TFCI information coding block code.

Generally, as well known in the art, although the order of rows or the order of columns is changed in the block code, there is no difference in performance between the generated codewords. The following Table 2 shows a specific block code, which is equivalent to the (32,10) block code used for the aforementioned TFCI-information coding using the above-mentioned advantage.

TABLE 2

| | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| $g_{10by32}[1]$ | 1 | 0 | 1 | 0 | 1 | 0 | 1 | 0 | 1 | 0 | 1 | 0 | 1 | 0 | 1 | 0 |
| $g_{10by32}[2]$ | 1 | 1 | 0 | 0 | 1 | 1 | 0 | 0 | 1 | 1 | 0 | 0 | 1 | 1 | 0 | 0 |
| $g_{10by32}[3]$ | 1 | 1 | 1 | 1 | 0 | 0 | 0 | 0 | 1 | 1 | 1 | 1 | 0 | 0 | 0 | 0 |
| $g_{10by32}[4]$ | 1 | 1 | 1 | 1 | 1 | 1 | 1 | 1 | 0 | 0 | 0 | 0 | 0 | 0 | 0 | 0 |
| $g_{10by32}[5]$ | 1 | 1 | 1 | 1 | 1 | 1 | 1 | 1 | 1 | 1 | 1 | 1 | 1 | 1 | 1 | 1 |
| $g_{10by32}[6]$ | 1 | 1 | 1 | 1 | 1 | 1 | 1 | 1 | 1 | 1 | 1 | 1 | 1 | 1 | 1 | 1 |
| $g_{10by32}[7]$ | 1 | 1 | 1 | 0 | 1 | 1 | 1 | 0 | 0 | 0 | 0 | 0 | 1 | 1 | 1 | 1 |
| $g_{10by32}[8]$ | 1 | 1 | 1 | 0 | 0 | 0 | 1 | 1 | 1 | 0 | 1 | 1 | 0 | 1 | 1 | 0 |
| $g_{10by32}[9]$ | 1 | 1 | 0 | 1 | 0 | 1 | 0 | 0 | 1 | 1 | 0 | 1 | 1 | 0 | 0 | 0 |
| $g_{10by32}[10]$ | 1 | 0 | 0 | 0 | 1 | 0 | 1 | 0 | 1 | 1 | 1 | 1 | 0 | 1 | 0 | 0 |

| | 17 | 18 | 19 | 20 | 21 | 22 | 23 | 24 | 25 | 26 | 27 | 28 | 29 | 30 | 31 | 32 |
|---|---|---|---|---|---|---|---|---|---|---|---|---|---|---|---|---|
| $g_{10by32}[1]$ | 1 | 0 | 1 | 0 | 1 | 0 | 1 | 0 | 1 | 0 | 1 | 0 | 1 | 0 | 1 | 0 |
| $g_{10by32}[2]$ | 1 | 1 | 0 | 0 | 1 | 1 | 0 | 0 | 1 | 1 | 0 | 0 | 1 | 1 | 0 | 0 |
| $g_{10by32}[3]$ | 1 | 1 | 1 | 1 | 0 | 0 | 0 | 0 | 1 | 1 | 1 | 1 | 0 | 0 | 0 | 0 |
| $g_{10by32}[4]$ | 1 | 1 | 1 | 1 | 1 | 1 | 1 | 1 | 0 | 0 | 0 | 0 | 0 | 0 | 0 | 0 |
| $g_{10by32}[5]$ | 0 | 0 | 0 | 0 | 0 | 0 | 0 | 0 | 0 | 0 | 0 | 0 | 0 | 0 | 0 | 0 |
| $g_{10by32}[6]$ | 1 | 1 | 1 | 1 | 1 | 1 | 1 | 1 | 1 | 1 | 1 | 1 | 1 | 1 | 1 | 1 |
| $g_{10by32}[7]$ | 1 | 1 | 0 | 0 | 0 | 1 | 1 | 0 | 0 | 0 | 1 | 0 | 1 | 0 | 0 | 0 |
| $g_{10by32}[8]$ | 1 | 0 | 1 | 1 | 0 | 0 | 1 | 1 | 1 | 0 | 0 | 0 | 0 | 0 | 0 | 0 |
| $g_{10by32}[9]$ | 1 | 0 | 0 | 1 | 1 | 1 | 1 | 1 | 0 | 1 | 0 | 1 | 0 | 0 | 0 | 0 |
| $g_{10by32}[10]$ | 1 | 1 | 1 | 0 | 1 | 1 | 0 | 0 | 0 | 0 | 1 | 1 | 1 | 0 | 0 | 0 |

As can be seen from the block code shown in Table 2, the row- and column-locations of the (32,10) code used for the TFCI coding are changed to other locations, and locations between some columns (or locations between some rows on the basis of the TFCI information code) are exchanged with each other.

In other words, according to this embodiment of the present invention, 12 rows in either the (32,10)-format TFCI information code (Table 1) or its equivalent matrix (Table 2) may be punctured, or 20 rows are selected from the (32,10)-format TFCI information code (Table 1) or its equivalent matrix (Table 2), such that the (20,10) block code is configured. In this case, from the viewpoint of the block code of Table 2, 12 columns may be punctured, and 20 columns may be selected. There is no difference in mode performance between the first case of using Table 1 and the second case of using Table 2. For the convenience of description and better understanding of the present invention, it is assumed that the present invention uses the equivalent format (See Table 2) of the TFCI information code if there is no mention in the above-mentioned description.

In the meantime, the (32,10) code used for coding the TFCI information has been generated on the basis of the Reed- Muller (RM) code. In this case, in order to implement an error correction performance, it is very important to search for a puncturing pattern which enables a codeword to have the longest distance ($d_{min}$).

Compared with this embodiment, an exhaustive search capable of searching for an optimum puncturing pattern in a generation matrix of the (32,10) code used for TFCI coding will hereinafter be described in detail. Provided that the number of columns of a generation matrix to be punctured in the (32×10) matrix (also denoted by (32*10) matrix) is set to "p", the number of all available puncturing patterns is denoted by $$\binom{32}{p}.$$

In this case, $$\binom{32}{p}$$

is indicative of the number of cases, each of which selects the p columns from among 32 columns.

For example, if the value of "p" is 12 (p=12), there are different (10×20) generation matrixes (i.e., $$\binom{32}{12} = 225{,}792{,}840$$

number of (10×20) generation matrixes), 10-bit information (i.e., $2^{10}=1{,}024$ number of information segments) is coded into a codeword of 20 bits. A minimum Hamming distance ($d_{min}$) between codewords generated by individual matrixes is calculated, such that a generation matrix having the highest value is found in the above minimum Hamming distance ($d_{min}$). If a puncturing pattern is used to make the generation matrix having the maximum ($d_{min}$) value, this puncturing pattern is considered to be the last pattern to be finally found. Associated operations of individual steps are as follows.

Step 1: 12 arbitrary rows of the (32*10) matrix are punctured, such that $$\binom{32}{12} = 225{,}792{,}840$$

number of (20×10) generation matrixes are configured.

Step 2: 1,024 codewords created by ($2^{10}=1024$) information units are generated from each of the 225,792,840 generation matrixes, and a minimum Hamming distance between the codewords is calculated.

Step 3: The present invention searches for a desired puncturing pattern from a generation matrix which has a maximum value from among minimum Hamming distances between the codewords.

However, the generation of the optimum (20,10) block code on the basis of the above steps requires a large number of calculations, resulting in greater inconvenience of use.

Therefore, this embodiment of the present invention adds specific restriction conditions to the process for deciding the puncturing pattern, such that it reduces the range of a searching space for acquiring an optimum ($d_{min}$) value.

Next, a method for more effectively searching for a generation matrix of the (20,10) code which generates a codeword having $d_{min}=d$ will hereinafter be described in detail. Provided that a target ($d_{min}$) value is denoted by d, the Hamming weight w($g_{10by20}[i]$) of each row vector $g_{10by20}[i]$ (1≤i≤10) of the (20,10)-code generation matrix has some requirements shown in the following Equation 1.

$d \leq w(g_{10by20}[i]) \leq 20-d$ $i=0,1,\ldots,10$ $i \neq 6$ (There are all ones in this row vector)  [Equation 1]

For example, if the value of d is 6 (d=6), Equation 1 can be represented by the following Equation 2.

$6 \leq w(g_{10by20}[i]) \leq 14$  [Equation 2]

Therefore, if the above restriction of Equation 2 is added to individual row vectors $g_{10by20}[i]$ of the (10*20) matrix generated from the above-mentioned exhaustive search process, the added result can reduce the number $$\left(N << \binom{32}{12}\right)$$

of searching spaces capable of searching for a generation matrix generating a codeword having $d_{min}=6$. Generally, based on various cited references, it is well known in the art that a maximum ($d_{min}$) value of the (20,10) code is 6, and its detailed description has been disclosed in "The Theory of Error-Correcting Codes (by F. J. MacWilliams and N. J. A. Sloane)". Therefore, the condition of $d_{min}=6$ is applied to the condition of Equation 1, such that the present invention can generate the (20,1) code using the following method.

FIG. 1 is a flow chart illustrating a method for effectively generating the (20,10) block code from the (32,10) TFCI information code according to an embodiment of the present invention.

Referring to FIG. 1, the channel coding method according to the present invention arbitrarily generates the (20,10) block code from the (32,10)-format TFCI information code at step S101. Thereafter, the channel coding method determines whether a weight of a basis sequence corresponding to each row satisfies the condition of Equation 2 at step S102. In this case, if the condition of Equation 2 is not satisfied, the channel coding method returns to the above step S101. If the condition of Equation 2 is satisfied, the channel coding method goes to the next step S103. The channel coding method generates 1,024 codewords using the (20,10) code generated at step S103. The channel coding method determines whether the 1,024 codewords satisfy the condition ($d_{min}=6$). In this case, if the condition ($d_{min}=6$) is not satisfied, the channel coding method returns to step S101. If the condition ($d_{min}=6$) is satisfied, the channel coding method goes to step S105, such that it calculates a weight distribution at step S105. Thereafter, if the optimum weight distribution has not been decided at step S106, the channel coding method returns to step S101. Otherwise, if the optimum weight distribution has been decided at step S106, the channel coding method goes to step S107, such that one of the optimum matrix patterns is selected at step S107.

As can be seen from the above-mentioned steps of FIG. 1, a maximum value of a minimum distance $d_{min}$ is 6 (i.e., $d_{min}=6$), and a total number of generation matrixes capable of generating the codeword which satisfies the condition of $d_{min}=6$ is 360. A maximum $d_{min}$ value of the (20,10) code is 6.

As shown in FIG. 1, the codeword having the maximum $d_{min}$ value of 6 can be generated by the method shown in this embodiment, such that the present invention can more effectively search for the (20,10) code generation matrix for generating an optimum codeword using the above method shown in this embodiment.

In this case, an optimum codeword is decided by minimum-distance characteristics. In other words, the longer the minimum distance, the better the code performance. The less the number of codewords corresponding to the minimum distance, the better the code performance. Therefore, an optimum code is as follows. If a maximum value of the minimum distance is provided and the number of codewords having the minimum distance is a minimum value, a corresponding code is decided to be the optimum code. In more detail, if the Hamming weight distribution of a specific code is represented by a polynomial expression, the lowest order other than constant terms is denoted by a maximum value and a coefficient of a corresponding order is denoted by a minimum value. Provided that two codes exist, and a Hamming weight distribution of the two codes is represented by a polynomial expression, performances of the two codes can be compared with each other on the basis of their orders and coefficients. In other words, if a minimum order of the Hamming weight distribution of the first code is higher than that of the second code, the first code has a higher performance. If the minimum order of the first code is equal to that of the second code, a coefficient of the corresponding minimum order of the first code is compared with that of the second code, such that a corresponding code having a lower coefficient may have a higher performance. In the meantime, if minimum orders of the two codes are same and coefficients of the minimum orders of the two codes are same when polynomial expressions of Hamming weight distributions of two codes are compared with each other, the next minimum orders of the two codes are compared with each other to compare performances of the two codes.

In the case of using the above-mentioned method in FIG. 1, the present invention can acquire 360 (i.e., $d_{min}=6$) number of (10*20) matrixes from the TFCI information code using the puncturing process. In the meantime, if the Hamming weight distributions of the above generation matrixes are calculated, the calculated Hamming weight distributions can be classified into the following three cases shown in Equations 1, 2, and 3, respectively. A first case from among the three cases is represented by the following polynomial equation 3. A second case is represented by the following polynomial equation 4. A third case is represented by the following polynomial equation 5.

$$A_{A1,20}(x) = x^{20} + 90x^{14} + 255x^{12} + 332x^{8} + 255x^{8} + 90x^{6} + 1 \quad \text{[Equation 3]}$$

$$A_{A2,20}(x) = x^{20} + 94x^{14} + 239x^{12} + 356x^{10} + 239x^{8} + 94x^{6} + 1 \quad \text{[Equation 4]}$$

$$A_{A3,20}(x) = x^{20} + 98x^{14} + 223x^{12} + 380x^{10} + 223x^{8} + 98x^{6} + 1 \quad \text{[Equation 5]}$$

The following Table 3 shows an exemplary generation matrix ($A_{A1,20}(x)$) for satisfying the Hamming weight distribution of Equation 3. The following Table 4 shows an exemplary generation matrix ($A_{A2,20}(x)$) for satisfying the Hamming weight distribution of Equation 4. The following Table 5 shows an example ($A_{A3,20}(x)$) of the (10*20) generation matrix for satisfying the Hamming weight distribution of Equation 3. The (10*20) matrixes generated by all puncturing patterns having the Hamming weight distributions of Equations 3 to 5 have the same error correction capability in a minimum distance aspect.

TABLE 3

|  | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|
| $g_{10by20}[1]$ | 1 | 0 | 1 | 0 | 1 | 0 | 1 | 1 | 1 | 0 | 1 | 0 | 1 | 1 | 1 | 0 | 0 | 1 | 0 | 1 |
| $g_{10by20}[2]$ | 1 | 1 | 0 | 0 | 1 | 1 | 0 | 1 | 0 | 0 | 1 | 1 | 1 | 0 | 1 | 1 | 0 | 1 | 1 | 0 |
| $g_{10by20}[3]$ | 1 | 1 | 1 | 1 | 0 | 0 | 0 | 1 | 1 | 1 | 0 | 0 | 1 | 1 | 0 | 0 | 0 | 1 | 1 | 1 |
| $g_{10by20}[4]$ | 1 | 1 | 1 | 1 | 1 | 1 | 1 | 0 | 0 | 0 | 0 | 0 | 1 | 1 | 1 | 1 | 1 | 0 | 0 | 0 |
| $g_{10by20}[5]$ | 1 | 1 | 1 | 1 | 1 | 1 | 1 | 1 | 1 | 1 | 1 | 0 | 0 | 0 | 0 | 0 | 0 | 0 | 0 | 0 |
| $g_{10by20}[6]$ | 1 | 1 | 1 | 1 | 1 | 1 | 1 | 1 | 1 | 1 | 1 | 1 | 1 | 1 | 1 | 1 | 1 | 1 | 1 | 1 |
| $g_{10by20}[7]$ | 1 | 1 | 1 | 0 | 1 | 1 | 1 | 0 | 0 | 0 | 1 | 1 | 1 | 0 | 0 | 1 | 0 | 0 | 0 | 0 |
| $g_{10by20}[8]$ | 1 | 1 | 1 | 0 | 0 | 0 | 1 | 1 | 1 | 1 | 0 | 1 | 1 | 1 | 0 | 0 | 1 | 1 | 0 | 0 |
| $g_{10by20}[9]$ | 1 | 1 | 0 | 1 | 0 | 1 | 0 | 1 | 0 | 1 | 1 | 0 | 1 | 0 | 1 | 1 | 1 | 0 | 1 | 0 |
| $g_{10by20}[10]$ | 1 | 0 | 0 | 0 | 1 | 0 | 1 | 1 | 1 | 1 | 0 | 1 | 1 | 1 | 1 | 1 | 0 | 0 | 0 | 1 |

TABLE 4

|  | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|
| $g_{10by20}[1]$ | 1 | 0 | 1 | 1 | 0 | 0 | 1 | 1 | 1 | 0 | 0 | 0 | 0 | 1 | 0 | 1 | 1 | 0 | 0 | 1 |
| $g_{10by20}[2]$ | 1 | 1 | 0 | 1 | 1 | 0 | 1 | 0 | 1 | 0 | 1 | 0 | 1 | 0 | 0 | 0 | 1 | 1 | 1 | 1 |
| $g_{10by20}[3]$ | 1 | 1 | 1 | 0 | 0 | 0 | 0 | 0 | 1 | 1 | 0 | 0 | 1 | 1 | 1 | 0 | 1 | 0 | 1 | 0 |
| $g_{10by20}[4]$ | 1 | 1 | 1 | 1 | 1 | 1 | 0 | 0 | 1 | 1 | 1 | 1 | 0 | 0 | 0 | 0 | 0 | 0 | 1 | 1 |
| $g_{10by20}[5]$ | 1 | 1 | 1 | 1 | 1 | 1 | 1 | 1 | 0 | 0 | 0 | 0 | 0 | 0 | 0 | 1 | 1 | 0 | 0 | 0 |
| $g_{10by20}[6]$ | 1 | 1 | 1 | 1 | 1 | 1 | 1 | 1 | 1 | 1 | 1 | 1 | 1 | 1 | 1 | 1 | 1 | 1 | 1 | 1 |
| $g_{10by20}[7]$ | 1 | 1 | 1 | 1 | 1 | 0 | 1 | 1 | 1 | 0 | 1 | 0 | 0 | 0 | 1 | 0 | 0 | 1 | 1 | 0 |
| $g_{10by20}[8]$ | 1 | 1 | 1 | 0 | 0 | 1 | 0 | 1 | 1 | 1 | 0 | 1 | 0 | 0 | 0 | 0 | 1 | 1 | 0 | 0 |
| $g_{10by20}[9]$ | 1 | 1 | 0 | 0 | 1 | 0 | 1 | 0 | 1 | 1 | 1 | 1 | 0 | 1 | 0 | 1 | 0 | 0 | 0 | 1 |
| $g_{10by20}[10]$ | 1 | 0 | 0 | 1 | 0 | 0 | 0 | 0 | 1 | 0 | 1 | 0 | 0 | 1 | 1 | 0 | 1 | 1 | 1 | 1 |

TABLE 5

|  | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|
| $g_{10by20}[1]$ | 1 | 1 | 0 | 1 | 0 | 1 | 0 | 1 | 1 | 0 | 1 | 1 | 0 | 1 | 0 | 1 | 0 | 1 | 1 | 0 |
| $g_{10by20}[2]$ | 1 | 0 | 0 | 1 | 1 | 0 | 0 | 1 | 0 | 0 | 1 | 0 | 1 | 0 | 0 | 1 | 1 | 0 | 0 | 0 |
| $g_{10by20}[3]$ | 1 | 1 | 1 | 0 | 0 | 1 | 1 | 0 | 0 | 0 | 1 | 1 | 0 | 0 | 0 | 1 | 1 | 1 | 0 | 0 |

TABLE 5-continued

|  | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|
| $g_{10by20}[4]$ | 1 | 1 | 1 | 1 | 1 | 0 | 0 | 0 | 0 | 0 | 1 | 1 | 1 | 1 | 1 | 0 | 0 | 0 | 0 | 0 |
| $g_{10by20}[5]$ | 1 | 1 | 1 | 1 | 1 | 1 | 1 | 1 | 1 | 1 | 0 | 0 | 0 | 0 | 0 | 0 | 0 | 0 | 0 | 0 |
| $g_{10by20}[6]$ | 1 | 1 | 1 | 1 | 1 | 1 | 1 | 1 | 1 | 1 | 1 | 1 | 1 | 1 | 1 | 1 | 1 | 1 | 1 | 1 |
| $g_{10by20}[7]$ | 1 | 1 | 0 | 1 | 1 | 0 | 0 | 1 | 1 | 1 | 1 | 0 | 1 | 1 | 0 | 0 | 0 | 0 | 0 | 0 |
| $g_{10by20}[8]$ | 1 | 1 | 0 | 0 | 0 | 1 | 1 | 0 | 1 | 0 | 1 | 1 | 0 | 1 | 1 | 1 | 0 | 0 | 0 | 0 |
| $g_{10by20}[9]$ | 1 | 0 | 1 | 0 | 1 | 0 | 1 | 1 | 0 | 0 | 1 | 0 | 1 | 1 | 1 | 0 | 1 | 0 | 0 | 0 |
| $g_{10by20}[10]$ | 1 | 0 | 0 | 1 | 0 | 1 | 1 | 0 | 0 | 0 | 1 | 1 | 1 | 0 | 0 | 0 | 0 | 1 | 0 | 0 |

In fact, there are several generation matrixes having the same Hamming weight distribution. If all cases are found by the exhaustive search process, 360 generation matrixes exist.

The above 360 puncturing patterns have been disclosed in Appendix "A" of U.S. Provisional Application No. 61/016, 492, entitled "GENERATION METHOD OF VARIOUS SHORT LENGTH BLOCK CODES WITH NESTED STRUCTURE BY PUNCTURING A BASE CODE" filed by the same applicant as the present invention. Specifically, indexes of punctured columns based on Table 2 have been disclosed in the Appendix "A". For the convenience of description, the above-mentioned indexes will herein be omitted.

If the 360 puncturing patterns are classified according to the Hamming weight distributions, the following result can be acquired. There are a total of 290 puncturing patterns for the (20,10) code generation matrix indicating the Hamming weight distribution of Equation 3. Also, there are a total of 60 puncturing patterns for the (20,10) code generation matrix indicating the Hamming weight distribution of Equation 4. In the meantime, there are a total of 10 puncturing patterns for the (20,10) code generation matrix indicating the Hamming weight distribution of Equation 5.

The following patterns from among the 360 puncturing patterns according to the present invention will be used as an example.

One of 60 puncturing patterns indicating the Hamming weight distribution of Equation 4 is shown in the following Table 6:

TABLE 6

| 10 × 32 matrix | 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|---|
| Table 2 | 0 | 0 | 1 | 1 | 1 | 0 | 1 | 1 | 0 | 0 | 1 | 1 | 1 | 1 | 0 | 1 | 0 | 1 |

| 10 × 32 matrix | 19 | 20 | 21 | 22 | 23 | 24 | 25 | 26 | 27 | 28 | 29 | 30 | 31 | 32 |
|---|---|---|---|---|---|---|---|---|---|---|---|---|---|---|
| Table 2 | 1 | 1 | 0 | 1 | 1 | 0 | 1 | 1 | 0 | 1 | 1 | 0 | 1 | 0 |

The puncturing patterns shown in Table 6 correspond to the sixth index of Table A.2 of the Appendix "A" of U.S. Provisional Application No. 61/016,492. In this case, the value "0" of Table 6 indicates that a column corresponding to the location of "0" is punctured. The value "1" of Table 6 indicates that a column corresponding to the location of "1" is not punctured but selected for the (20,10) block code.

In the case where the puncturing pattern of Table 6 is applied to Table 2, the result is shown as the following Table 7.

TABLE 7

| Index | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | puncturing for (20, 10) |
|---|---|---|---|---|---|---|---|---|---|---|---|
| 0 | 1 | 1 | 1 | 1 | 1 | 1 | 1 | 1 | 1 | 1 | Punctured |
| 1 | 0 | 1 | 1 | 1 | 1 | 1 | 1 | 1 | 1 | 0 | Punctured |
| 2 | 1 | 0 | 1 | 1 | 1 | 1 | 1 | 1 | 0 | 0 |  |
| 3 | 0 | 0 | 1 | 1 | 1 | 0 | 0 | 1 | 1 | 0 |  |
| 4 | 1 | 1 | 0 | 1 | 1 | 1 | 1 | 0 | 0 | 1 |  |
| 5 | 0 | 1 | 0 | 1 | 1 | 1 | 0 | 1 | 1 | 0 | Punctured |
| 6 | 1 | 0 | 0 | 1 | 1 | 1 | 1 | 1 | 0 | 1 |  |
| 7 | 0 | 0 | 0 | 1 | 1 | 0 | 1 | 0 | 0 | 0 |  |
| 8 | 1 | 1 | 1 | 0 | 1 | 1 | 0 | 1 | 1 | 1 | Punctured |
| 9 | 0 | 1 | 1 | 0 | 1 | 0 | 0 | 1 | 1 | 1 | Punctured |
| 10 | 1 | 0 | 1 | 0 | 1 | 0 | 1 | 0 | 1 | 1 |  |
| 11 | 0 | 0 | 1 | 0 | 1 | 0 | 1 | 1 | 1 | 1 |  |
| 12 | 1 | 1 | 0 | 0 | 1 | 1 | 0 | 1 | 0 | 1 |  |
| 13 | 0 | 1 | 0 | 0 | 1 | 1 | 1 | 0 | 0 | 1 |  |
| 14 | 1 | 0 | 0 | 0 | 1 | 1 | 1 | 1 | 0 | 0 | Punctured |
| 15 | 0 | 0 | 0 | 0 | 1 | 1 | 1 | 0 | 0 | 0 |  |
| 16 | 1 | 1 | 1 | 1 | 0 | 1 | 1 | 1 | 1 | 1 | Punctured |

TABLE 7-continued

| Index | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | puncturing for (20, 10) |
|---|---|---|---|---|---|---|---|---|---|---|---|
| 17 | 0 | 1 | 1 | 1 | 0 | 1 | 1 | 0 | 0 | 1 | |
| 18 | 1 | 0 | 1 | 1 | 0 | 1 | 0 | 1 | 0 | 1 | |
| 19 | 0 | 0 | 1 | 1 | 0 | 1 | 0 | 1 | 1 | 0 | |
| 20 | 1 | 1 | 0 | 1 | 0 | 1 | 0 | 0 | 1 | 1 | Punctured |
| 21 | 0 | 1 | 0 | 1 | 0 | 1 | 1 | 0 | 1 | 1 | |
| 22 | 1 | 0 | 0 | 1 | 0 | 1 | 1 | 1 | 1 | 0 | |
| 23 | 0 | 0 | 0 | 1 | 0 | 1 | 0 | 1 | 1 | 0 | Punctured |
| 24 | 1 | 1 | 1 | 0 | 0 | 1 | 0 | 1 | 0 | 0 | |
| 25 | 0 | 1 | 1 | 0 | 0 | 1 | 0 | 0 | 1 | 0 | |
| 26 | 1 | 0 | 1 | 0 | 0 | 1 | 0 | 0 | 0 | 1 | Punctured |
| 27 | 0 | 0 | 1 | 0 | 0 | 1 | 1 | 0 | 1 | 1 | |
| 28 | 1 | 1 | 0 | 0 | 0 | 1 | 0 | 0 | 0 | 1 | |
| 29 | 0 | 1 | 0 | 0 | 0 | 1 | 1 | 0 | 0 | 0 | Punctured |
| 30 | 1 | 0 | 0 | 0 | 0 | 1 | 0 | 0 | 0 | 0 | |
| 31 | 0 | 0 | 0 | 0 | 0 | 1 | 0 | 0 | 0 | 0 | Punctured |

In this case, compared with Table 2, row- and column-directions of Table 7 are changed, but Table 4 has the same meaning as Table 2. 12 punctured rows from among individual row-directional sequences are shown at the right side of Table 4. As a result, the generated (20,10) block code can be represented by Table 8.

TABLE 8

| Index | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ |
|---|---|---|---|---|---|---|---|---|---|---|
| 2 | 1 | 0 | 1 | 1 | 1 | 1 | 1 | 1 | 0 | 0 |
| 3 | 0 | 0 | 1 | 1 | 1 | 1 | 0 | 0 | 1 | 0 |
| 4 | 1 | 1 | 0 | 1 | 1 | 1 | 1 | 0 | 0 | 1 |
| 6 | 1 | 0 | 0 | 1 | 1 | 1 | 1 | 1 | 0 | 1 |
| 7 | 0 | 0 | 0 | 1 | 1 | 1 | 0 | 1 | 0 | 0 |
| 10 | 1 | 0 | 1 | 0 | 1 | 1 | 0 | 1 | 0 | 1 |
| 11 | 0 | 0 | 1 | 0 | 1 | 1 | 0 | 1 | 1 | 1 |
| 12 | 1 | 1 | 0 | 0 | 1 | 1 | 1 | 0 | 1 | 0 |
| 13 | 0 | 1 | 0 | 0 | 1 | 1 | 1 | 1 | 0 | 1 |
| 15 | 0 | 0 | 0 | 0 | 1 | 1 | 1 | 0 | 0 | 0 |
| 17 | 0 | 1 | 1 | 1 | 0 | 1 | 1 | 0 | 0 | 1 |
| 18 | 1 | 0 | 1 | 1 | 0 | 1 | 0 | 1 | 0 | 1 |
| 19 | 0 | 0 | 1 | 1 | 0 | 1 | 0 | 1 | 1 | 0 |
| 21 | 0 | 1 | 0 | 1 | 0 | 1 | 1 | 0 | 1 | 1 |
| 22 | 1 | 0 | 0 | 1 | 0 | 1 | 1 | 1 | 1 | 0 |
| 24 | 1 | 1 | 1 | 0 | 0 | 1 | 0 | 1 | 0 | 0 |
| 25 | 0 | 1 | 1 | 0 | 0 | 1 | 0 | 0 | 1 | 0 |
| 27 | 0 | 0 | 1 | 0 | 0 | 1 | 1 | 0 | 1 | 1 |
| 28 | 1 | 1 | 0 | 0 | 0 | 1 | 0 | 0 | 0 | 1 |
| 30 | 1 | 0 | 0 | 0 | 0 | 1 | 0 | 0 | 0 | 0 |

In the meantime, there is a little difference between the order of rows of Table 7 or Table 8 and the matrix order of the 3GPP-based TFCI coding. As described above, although the location of each row is changed to another location according to the above-mentioned coding theory, there is no difference in performance between generated codewords. If the row order of Table 7 or Table 8 is adjusted in the same manner as in the TFCI code matrix, the following Table 9 is acquired.

TABLE 9

| Table 7 Index | TFCI Index | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | Puncturing for (20, 10) |
|---|---|---|---|---|---|---|---|---|---|---|---|---|
| 30 | 0 | 1 | 0 | 0 | 0 | 0 | 1 | 0 | 0 | 0 | 0 | |
| 29 | 1 | 0 | 1 | 0 | 0 | 0 | 1 | 1 | 0 | 0 | 0 | Punctured |
| 28 | 2 | 1 | 1 | 0 | 0 | 0 | 1 | 0 | 0 | 0 | 1 | |
| 27 | 3 | 0 | 0 | 1 | 0 | 0 | 1 | 1 | 0 | 1 | 1 | |
| 26 | 4 | 1 | 0 | 1 | 0 | 0 | 1 | 0 | 0 | 0 | 1 | Punctured |
| 25 | 5 | 0 | 1 | 1 | 0 | 0 | 1 | 0 | 0 | 1 | 0 | |
| 24 | 6 | 1 | 1 | 1 | 0 | 0 | 1 | 0 | 1 | 0 | 0 | |
| 23 | 7 | 0 | 0 | 0 | 1 | 0 | 1 | 0 | 1 | 1 | 0 | Punctured |
| 22 | 8 | 1 | 0 | 0 | 1 | 0 | 1 | 1 | 1 | 1 | 0 | |
| 21 | 9 | 0 | 1 | 0 | 1 | 0 | 1 | 1 | 0 | 1 | 1 | |
| 20 | 10 | 1 | 1 | 0 | 1 | 0 | 1 | 0 | 0 | 1 | 1 | Punctured |
| 19 | 11 | 0 | 0 | 1 | 1 | 0 | 1 | 0 | 1 | 1 | 0 | |

TABLE 9-continued

| Table 7 Index | TFCI Index | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | Puncturing for (20, 10) |
|---|---|---|---|---|---|---|---|---|---|---|---|---|
| 18 | 12 | 1 | 0 | 1 | 1 | 0 | 1 | 0 | 1 | 0 | 1 | |
| 17 | 13 | 0 | 1 | 1 | 1 | 0 | 1 | 1 | 0 | 0 | 1 | |
| 16 | 14 | 1 | 1 | 1 | 1 | 0 | 1 | 1 | 1 | 1 | 1 | Punctured |
| 14 | 15 | 1 | 0 | 0 | 0 | 1 | 1 | 1 | 1 | 0 | 0 | Punctured |
| 13 | 16 | 0 | 1 | 0 | 0 | 1 | 1 | 1 | 1 | 0 | 1 | |
| 12 | 17 | 1 | 1 | 0 | 0 | 1 | 1 | 1 | 0 | 1 | 0 | |
| 11 | 18 | 0 | 0 | 1 | 0 | 1 | 1 | 0 | 1 | 1 | 1 | |
| 10 | 19 | 1 | 0 | 1 | 0 | 1 | 1 | 0 | 1 | 0 | 1 | |
| 9 | 20 | 0 | 1 | 1 | 0 | 1 | 1 | 0 | 0 | 1 | 1 | Punctured |
| 8 | 21 | 1 | 1 | 1 | 0 | 1 | 1 | 0 | 1 | 1 | 1 | Punctured |
| 7 | 22 | 0 | 0 | 0 | 1 | 1 | 1 | 0 | 1 | 0 | 0 | |
| 6 | 23 | 1 | 0 | 0 | 1 | 1 | 1 | 1 | 1 | 0 | 1 | |
| 5 | 24 | 0 | 1 | 0 | 1 | 1 | 1 | 1 | 0 | 1 | 0 | Punctured |
| 4 | 25 | 1 | 1 | 0 | 1 | 1 | 1 | 1 | 0 | 0 | 1 | |
| 3 | 26 | 0 | 0 | 1 | 1 | 1 | 1 | 0 | 0 | 1 | 0 | |
| 2 | 27 | 1 | 0 | 1 | 1 | 1 | 1 | 1 | 1 | 0 | 0 | |
| 1 | 28 | 0 | 1 | 1 | 1 | 1 | 1 | 1 | 1 | 1 | 0 | Punctured |
| 0 | 29 | 1 | 1 | 1 | 1 | 1 | 1 | 1 | 1 | 1 | 1 | Punctured |
| 31 | 30 | 0 | 0 | 0 | 0 | 0 | 1 | 0 | 0 | 0 | 0 | Punctured |
| 15 | 31 | 0 | 0 | 0 | 0 | 1 | 1 | 1 | 0 | 0 | 0 | |

As described above, only the row order of Table 9 is different from that of Table 7, but the remaining features of Table 6 are exactly equal to those of Table 4. The representation method of Table 9 has an advantage in that the last 2-bits be punctured during the puncturing time from the (20,10) code to the (18,10) code. A detailed description thereof will hereinafter be described.

(2) Second Step—(20,14) Block Code Generation

As for the (20,A) block code according to this embodiment, it is assumed that a CQI value indicating channel quality information (CQI) of the 3GPP LTE system be applied to the channel coding method for PUCCH transmission. Also, in the above-mentioned first step, the bit number of the CQI information of the 3GPP LTE system can be decided in the range from 4 bits to 10 bits, such that it can be maximally extended to the (20,10) block code. However, in the case of the MIMO system, the bit number of the CQI information may be higher than 10 bits as necessary. However, a transmission (Tx) amount of actual CQI is decided according to a CQI generation method. For the coding process, the present invention may consider a method for supporting all the information bit numbers ranging from 4 bits to 14 bits.

Therefore, the (20,14) block coding method will hereinafter be described, which is capable of supporting a maximum of 14 bits by adding a column to the above (20,10) block code according to the number of information bits.

In order to search for the added column during the exhaustive search, a large number of calculations must be carried out. For example, in order to add a single row to the (20,10) block code of Table 9, $2^{20} \approx 10^{24}$ number of astronomical cases must be searched. Therefore, the execution of the exhaustive search in all the cases may be ineffective or undesirable.

In this step, it should be noted that the sixth column of Table 6 is set to "1" and is used as a basis sequence. Therefore, if the added column must satisfy the minimum distance "d", a minimum number of "0" must be equal to or higher than "d". In this example, the number of "0" is equal to a minimum distance between codewords.

In more detail, a difference between the added column and the old sixth column composed of "1" is indicative of a distance between two codewords, such that the number of "0" contained in the added column is equal to the distance between codewords.

Generally, a maximum of a minimum distance available for the (20,10) code is 6. In the present invention, a minimum of a maximum distance available for the (20,11) code corresponding to an extended version of the (20,10) code is 4. In more detail, the maximum-/minimum-distance characteristics based on various information bit numbers of the 20-bit codeword can be represented by Table 10.

TABLE 10

| | k | | | | | | | | | | |
|---|---|---|---|---|---|---|---|---|---|---|---|
| n | 4 | 5 | 6 | 7 | 8 | 9 | 10 | 11 | 12 | 13 | 14 |
| 20 | 8 | 8 | 8 | 6 | 6 | 6 | 6 | 4 | 4 | 4 | 4 |

Therefore, this embodiment of the present invention provides a column adding method, which allows the maximum-/minimum-distance of the added column to be "4". According to this column adding method, a column having at least four "0" values is added to the added column.

In order to minimize the number of searching times, it is assumed that the added column of this embodiment includes 4 number of "0" values (i.e., four "0" values). In this way, if the added column includes the four "0" values and 16 number of "1" values, this added column can be configured in various ways. A representative example of the added column is shown in the following Table 11. If the (20,10) code of Table 9 is extended to the (20,14) code, Table 11 can be acquired.

TABLE 11

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ | $M_{i,13}$ |
|---|---|---|---|---|---|---|---|---|---|---|---|---|---|---|
| 0 | 1 | 0 | 0 | 0 | 0 | 1 | 0 | 0 | 0 | 0 | 1 | 1 | 0 | 0 |
| 2 | 1 | 1 | 0 | 0 | 0 | 1 | 0 | 0 | 0 | 1 | 1 | 1 | 0 | 0 |
| 3 | 0 | 0 | 1 | 0 | 0 | 1 | 1 | 0 | 1 | 1 | 1 | 1 | 1 | 1 |

TABLE 11-continued

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ | $M_{i,13}$ |
|---|---|---|---|---|---|---|---|---|---|---|---|---|---|---|
| 5 | 0 | 1 | 1 | 0 | 0 | 1 | 0 | 0 | 1 | 0 | 1 | 1 | 1 | 1 |
| 6 | 1 | 1 | 1 | 0 | 0 | 1 | 0 | 1 | 0 | 0 | 1 | 1 | 1 | 1 |
| 8 | 1 | 0 | 0 | 1 | 0 | 1 | 1 | 1 | 1 | 0 | 1 | 1 | 1 | 0 |
| 9 | 0 | 1 | 0 | 1 | 0 | 1 | 1 | 0 | 1 | 1 | 1 | 1 | 1 | 0 |
| 11 | 0 | 0 | 1 | 1 | 0 | 1 | 0 | 1 | 1 | 0 | 1 | 1 | 1 | 1 |
| 12 | 1 | 0 | 1 | 1 | 0 | 1 | 0 | 1 | 0 | 1 | 1 | 1 | 1 | 1 |
| 13 | 0 | 1 | 1 | 1 | 0 | 1 | 1 | 0 | 0 | 1 | 1 | 1 | 1 | 1 |
| 16 | 0 | 1 | 0 | 0 | 1 | 1 | 1 | 1 | 0 | 1 | 1 | 1 | 1 | 1 |
| 17 | 1 | 1 | 0 | 0 | 1 | 1 | 1 | 0 | 1 | 0 | 1 | 1 | 1 | 1 |
| 18 | 0 | 0 | 1 | 0 | 1 | 1 | 0 | 1 | 1 | 1 | 1 | 1 | 1 | 1 |
| 19 | 1 | 0 | 1 | 0 | 1 | 1 | 0 | 1 | 0 | 1 | 1 | 1 | 1 | 1 |
| 22 | 0 | 0 | 0 | 1 | 1 | 1 | 0 | 1 | 0 | 0 | 1 | 0 | 1 | 1 |
| 23 | 1 | 0 | 0 | 1 | 1 | 1 | 1 | 1 | 0 | 1 | 1 | 0 | 1 | 1 |
| 25 | 1 | 1 | 0 | 1 | 1 | 1 | 1 | 0 | 0 | 1 | 0 | 1 | 1 | 1 |
| 26 | 0 | 0 | 1 | 1 | 1 | 1 | 0 | 0 | 1 | 0 | 0 | 1 | 1 | 1 |
| 27 | 1 | 0 | 1 | 1 | 1 | 1 | 1 | 1 | 0 | 0 | 0 | 0 | 0 | 1 |
| 31 | 0 | 0 | 0 | 0 | 1 | 1 | 1 | 0 | 0 | 0 | 0 | 0 | 0 | 1 |

With reference to Table 11, the four added columns are indicative of four columns located at the right side. In each added column, "0" is denoted by a bold line.

(3) Third Step—Modifying/Optimizing Of Block Code

In one embodiment of the present invention, according to a large-sized generation matrix based on the length of maximum information amount, the present invention configures a specific generation matrix for coding the information of which length is equal or shorter than the maximum length, such that it can maximally maintains common points between generation matrixes for individual lengths.

According to a first method for implementing the above-mentioned embodiment, the present invention optimizes each generation matrix according to an amount of individual information, the length of which is equal to or shorter than the maximum length, such that it can configure the optimum generation matrix. According to a second method for implementing the above-mentioned embodiment, while in constructing a generation matrix for coding the information, the length of which is equal to or shorter than the maximum length, a generation matrix for the long-length information of the present invention can be also configured to include a generation matrix for short-length information such that it has a nested structure. According to a third method, the present invention can configure an optimum generation matrix for each information length with a hybrid structure, such that it has a nested structure as much as possible.

Firstly, the Hamming weight distribution based on the information-bit length shown in Equation 1 is represented by Table 12.

TABLE 12

| k | 4 | 5 | 6 | 7 | 8 | 9 | 10 | 11 | 12 | 13 | 14 |
|---|---|---|---|---|---|---|---|---|---|---|---|
| column | [1~4] | [1~5] | [1~6] | [1~7] | [1~8] | [1~9] | [1~10] | [1~11] | [1~12] | [1~13] | [1~14] |
| 0 | 1 | 1 | 1 | 1 | 1 | 1 | 1 | 1 | 1 | 1 | 1 |
| 1 | 0 | 0 | 0 | 0 | 0 | 0 | 0 | 0 | 0 | 0 | 0 |
| 2 | 0 | 0 | 0 | 0 | 0 | 0 | 0 | 0 | 0 | 0 | 0 |
| 3 | 0 | 0 | 0 | 0 | 0 | 0 | 0 | 0 | 0 | 0 | 0 |
| 4 | 0 | 0 | 0 | 0 | 0 | 0 | 0 | 10 | 33 | 77 | 165 |
| 5 | 0 | 0 | 0 | 0 | 0 | 0 | 0 | 0 | 0 | 0 | 0 |
| 6 | 0 | 0 | 0 | 7 | 18 | 44 | 94 | 170 | 312 | 608 | 1200 |
| 7 | 0 | 0 | 0 | 0 | 0 | 0 | 0 | 0 | 0 | 0 | 0 |
| 8 | 2 | 5 | 15 | 27 | 63 | 119 | 239 | 485 | 990 | 1970 | 3930 |
| 9 | 0 | 0 | 0 | 0 | 0 | 0 | 0 | 0 | 0 | 0 | 0 |
| 10 | 10 | 16 | 32 | 58 | 92 | 184 | 356 | 716 | 1424 | 2880 | 5792 |
| 11 | 0 | 0 | 0 | 0 | 0 | 0 | 0 | 0 | 0 | 0 | 0 |
| 12 | 3 | 10 | 15 | 27 | 63 | 119 | 239 | 485 | 990 | 1970 | 3930 |
| 13 | 0 | 0 | 0 | 0 | 0 | 0 | 0 | 0 | 0 | 0 | 0 |
| 14 | 0 | 0 | 0 | 7 | 18 | 44 | 94 | 170 | 312 | 608 | 1200 |
| 15 | 0 | 0 | 0 | 0 | 0 | 0 | 0 | 0 | 0 | 0 | 0 |
| 16 | 0 | 0 | 0 | 0 | 0 | 0 | 0 | 10 | 33 | 77 | 165 |
| 17 | 0 | 0 | 0 | 0 | 0 | 0 | 0 | 0 | 0 | 0 | 0 |
| 18 | 0 | 0 | 0 | 0 | 0 | 0 | 0 | 0 | 0 | 0 | 0 |
| 19 | 0 | 0 | 0 | 0 | 0 | 0 | 0 | 0 | 0 | 0 | 0 |
| 20 | 0 | 0 | 1 | 1 | 1 | 1 | 1 | 1 | 1 | 1 | 1 |

In Table 12, a minimum Hamming distance is represented by the shaded parts. For the convenience of the present invention, this invention is concerned about only the specific case in which a minimum number k of information bits is at least 4 (i.e., k≥4), such that the remaining cases denoted by k<3 will herein be omitted. Also, individual "k" values may be grouped according to minimum distances. In more detail, the case of k=4~6 can be classified by a group having a minimum distance of 8. The case of k=7~10 can be classified by a group having a minimum distance of 6. The case of k=11~14 can be classified by a group having a minimum distance of 4. It can be recognized that the above-mentioned classified results have been shown in Table 10.

In this step, the present invention configures a code having a low coding rate, in which the configured code enables a minimum distance between codewords to reach a maximum value. Also, the present invention can easily configure the above code using a simple method.

For example, if the information-bit length of Table 4 is set to 4, the conventional art selects the front 4 rows, and controls the selected 4 rows to sequentially correspond to the left columns. However, in fact, although any 4 columns have been selected from 14 columns, a desired code can be configured. However, it is preferable that a minimum distance of the code be maximized. In the case of selecting four columns from among 14 columns, although any 4 columns are selected from among No. 7 to No. 14 columns, a minimum distance "8" capable of being acquired when the front 4 columns are selected may not be maintained. However, referring to Tables 12 and 10, the Column 10 (i.e., No. 10 column) and the Column 5 (i.e., No. 5 column) are indicative of a group having a minimum distance of 8, such that arbitrary 4 columns may be selected from several columns reaching the Column 6 (i.e., No. 6 column).

Therefore, in the case of selecting columns according to individual information bits, the present invention can select the best column from among minimum-distance-characteristic columns, each of which has a minimum distance equal to or longer than the other minimum distance capable of being acquired by a corresponding information bit number.

For example, in order to optimize the information bits of which number is in the range from 11 to 14, the present invention firstly fixes No. 1 to No. 10 columns, (i.e., Columns 1~10), and refers to the following Hamming weight distributions of Tables 13, 14, and 15 according to the number of information bits.

TABLE 13

| k | 14 | 13 | | | |
|---|---|---|---|---|---|
| Selected column | [1~10]+ [11, 12, 13, 14] | [1~10]+ [11, 12, 13] | [1~10]+ [11, 12, 14] | [1~10]+ [11, 13, 14] | [1~10]+ [12, 13, 14] |
| 0 | 1 | 1 | 1 | 1 | 1 |
| 1 | 0 | 0 | 0 | 0 | 0 |
| 2 | 0 | 0 | 0 | 0 | 0 |
| 3 | 0 | 0 | 0 | 0 | 0 |
| 4 | 165 | 77 | 79 | 75 | 77 |
| 5 | 0 | 0 | 0 | 0 | 0 |
| 6 | 1200 | 608 | 596 | 620 | 608 |
| 7 | 0 | 0 | 0 | 0 | 0 |
| 8 | 3930 | 1970 | 2000 | 1940 | 1970 |
| 9 | 0 | 0 | 0 | 0 | 0 |
| 10 | 5792 | 2880 | 2840 | 2920 | 2880 |
| 11 | 0 | 0 | 0 | 0 | 0 |
| 12 | 3930 | 1970 | 2000 | 1940 | 1970 |
| 13 | 0 | 0 | 0 | 0 | 0 |
| 14 | 1200 | 608 | 596 | 620 | 608 |
| 15 | 0 | 0 | 0 | 0 | 0 |
| 16 | 165 | 77 | 79 | 75 | 77 |
| 17 | 0 | 0 | 0 | 0 | 0 |
| 18 | 0 | 0 | 0 | 0 | 0 |
| 19 | 0 | 0 | 0 | 0 | 0 |
| 20 | 1 | 1 | 1 | 1 | 1 |

TABLE 14

| k | 12 | | | | | |
|---|---|---|---|---|---|---|
| Selected column | [1~10]+ [11,12] | [1~10]+ [11,13] | [1~10]+ [11,14] | [1~10]+ [12,13] | [1~10]+ [12,14] | [1~10]+ [13,14] |
| 0 | 1 | 1 | 1 | 1 | 1 | 1 |
| 1 | 0 | 0 | 0 | 0 | 0 | 0 |
| 2 | 0 | 0 | 0 | 0 | 0 | 0 |
| 3 | 0 | 0 | 0 | 0 | 0 | 0 |
| 4 | 33 | 31 | 33 | 33 | 33 | 33 |
| 5 | 0 | 0 | 0 | 0 | 0 | 0 |
| 6 | 312 | 324 | 312 | 312 | 312 | 312 |
| 7 | 0 | 0 | 0 | 0 | 0 | 0 |
| 8 | 990 | 960 | 990 | 990 | 990 | 990 |
| 9 | 0 | 0 | 0 | 0 | 0 | 0 |
| 10 | 1424 | 1464 | 1424 | 1424 | 1424 | 1424 |
| 11 | 0 | 0 | 0 | 0 | 0 | 0 |
| 12 | 990 | 960 | 990 | 990 | 990 | 990 |
| 13 | 0 | 0 | 0 | 0 | 0 | 0 |
| 14 | 312 | 324 | 312 | 312 | 312 | 312 |
| 15 | 0 | 0 | 0 | 0 | 0 | 0 |
| 16 | 33 | 31 | 33 | 33 | 33 | 33 |
| 17 | 0 | 0 | 0 | 0 | 0 | 0 |
| 18 | 0 | 0 | 0 | 0 | 0 | 0 |
| 19 | 0 | 0 | 0 | 0 | 0 | 0 |
| 20 | 1 | 1 | 1 | 1 | 1 | 1 |

TABLE 15

| k | 11 | | | |
|---|---|---|---|---|
| Selected column | [1~10]+ [11] | [1~10]+ [12] | [1~10]+ [13] | [1~10]+ [14] |
| 0 | 1 | 1 | 1 | 1 |
| 1 | 0 | 0 | 0 | 0 |
| 2 | 0 | 0 | 0 | 0 |
| 3 | 0 | 0 | 0 | 0 |
| 4 | 10 | 12 | 10 | 11 |
| 5 | 0 | 0 | 0 | 0 |
| 6 | 170 | 166 | 170 | 164 |
| 7 | 0 | 0 | 0 | 0 |
| 8 | 485 | 483 | 485 | 500 |
| 9 | 0 | 0 | 0 | 0 |
| 10 | 716 | 724 | 716 | 696 |
| 11 | 0 | 0 | 0 | 0 |
| 12 | 485 | 483 | 485 | 500 |
| 13 | 0 | 0 | 0 | 0 |
| 14 | 170 | 166 | 170 | 164 |
| 15 | 0 | 0 | 0 | 0 |
| 16 | 10 | 12 | 10 | 11 |
| 17 | 0 | 0 | 0 | 0 |
| 18 | 0 | 0 | 0 | 0 |
| 19 | 0 | 0 | 0 | 0 |
| 20 | 1 | 1 | 1 | 1 |

The best weight distributions of Tables 13 to 15 are distributed by the shaded parts. The best-performance code indicates that a weight value other than "0" (i.e., a weight value having a minimum distance) is very high. The less the number of codewords corresponding to the above weight value, the higher the performance. If a minimum-weight performance of one code is equal to that of the other code, the code performance is decided by characteristics of the next minimum weight (i.e., a second minimum weight). In other words, the higher the next minimum weight, the higher the performance. If the second minimum weights of the two codes are equal to each other, the less the number of codewords constructing a corresponding weight value, the higher the performance.

If column allocation is carried out by repeating the above processes of Tables 13 to 15 such that individual information bit lengths indicate optimum performances, the allocated columns are represented by the following Table 16. The present invention is concerned about only the information-bit length of at least 4. Original columns are fixedly used for up to 3 bits, and optimum columns are searched in the range of 4 bits or more, such that the searched optimum columns are shown in the following Table 16.

TABLE 16

| k | optimal mapping pattern | | | |
|---|---|---|---|---|
| 4 | [1~3] + [5] | | | |
| 5 | [1~3] + [4,5] | | | |
| 6 | [1~3] + [4,5,6] | | | |
| 7 | [1~6] + [8] | [1~6] + [9] | | |
| 8 | [1~6] + [8,9] | [1~6] + [9,10] | [1~6] + [7,8] | |
| 9 | [1~6] + [8,9,10] | [1~6] + [7,8,9] | [1~6] + [7,8,10] | [1~6] + [7,9,10] |
| 10 | [1~6] + [7,8,9,10] | | | |
| 11 | [1~10] + [11] | [1~10] + [13] | | |
| 12 | [1~10] + [11,13] | | | |
| 13 | [1~10] + [11,13,14] | | | |
| 14 | [1~10] + [11,12,13,14] | | | |

If the value "k" is equal to or less than 3, provided that the permutation for changing the order of columns must be considered in the case of k≤3, optimum column allocations of individual information bits are shown in Table 16. As shown in Table 16, columns used for the increasing number of information bits do not always include columns allocated to small-sized information bits. In other words, a nested structure, that the columns allocated to the large information bits includes the columns allocated to the small-sized information bits, is not maintained.

If the nested structure is not maintained, columns allocated to individual information bits must be designated separately from each other, resulting in greater inconvenience of use. Therefore, the present invention provides a method for maintaining the optimum allocation, and at the same time maximally forming the nested structure.

Firstly, a permutation for changing the order of columns to another order in groups having the same minimum-distance will hereinafter be described in detail. For example, a first group includes four columns 11, 12, 13, and 14 having the same minimum distance of 4. The order of the four columns 11, 12, 13, and 14 is changed to another order of columns 11, 13, 14, and 12 in the first group. In the optimum mapping pattern, if the k value is 11 (i.e., k=11), the optimum mapping pattern is denoted by [1~10]+[11]. If the k value is 12 (i.e., k=12), the optimum mapping pattern is denoted by [1~10]+[11,13]. If the k value is 13 (i.e., k=13), the optimum mapping pattern is denoted by [1~10]+[11, 13, 14]. If the k value is 14 (i.e., k=14), the optimum mapping pattern is denoted by [1~10]+[11, 12, 13, 14].

As described above, if column allocation is sequentially carried out in proportion to the "k" value, the order of columns may be changed to implement an optimum allocation pattern, as represented by the following Table 17.

TABLE 17

| i / Original column | $M_{i,0}$ [1] | $M_{i,1}$ [2] | $M_{i,2}$ [3] | $M_{i,3}$ [5] | $M_{i,4}$ [4] | $M_{i,5}$ [6] | $M_{i,6}$ [8] | $M_{i,7}$ [9] | $M_{i,8}$ [10] | $M_{i,9}$ [7] | $M_{i,10}$ [11] | $M_{i,11}$ [13] | $M_{i,12}$ [14] | $M_{i,13}$ [12] |
|---|---|---|---|---|---|---|---|---|---|---|---|---|---|---|
| 0 | 1 | 0 | 0 | 0 | 0 | 1 | 0 | 0 | 0 | 0 | 1 | 0 | 0 | 1 |
| 2 | 1 | 1 | 0 | 0 | 0 | 1 | 0 | 0 | 1 | 0 | 1 | 0 | 0 | 1 |
| 3 | 0 | 0 | 1 | 0 | 0 | 1 | 0 | 1 | 1 | 1 | 1 | 1 | 1 | 1 |
| 5 | 0 | 1 | 1 | 0 | 0 | 1 | 0 | 1 | 0 | 0 | 1 | 1 | 1 | 1 |
| 6 | 1 | 1 | 1 | 0 | 0 | 1 | 1 | 0 | 0 | 0 | 1 | 1 | 1 | 1 |
| 8 | 1 | 0 | 0 | 0 | 1 | 1 | 1 | 1 | 0 | 1 | 1 | 1 | 0 | 1 |
| 9 | 0 | 1 | 0 | 0 | 1 | 1 | 0 | 1 | 1 | 1 | 1 | 1 | 0 | 1 |
| 11 | 0 | 0 | 1 | 0 | 1 | 1 | 1 | 1 | 0 | 0 | 1 | 1 | 1 | 1 |
| 12 | 1 | 0 | 1 | 0 | 1 | 1 | 1 | 0 | 1 | 0 | 1 | 1 | 1 | 1 |
| 13 | 0 | 1 | 1 | 0 | 1 | 1 | 0 | 0 | 1 | 1 | 1 | 1 | 1 | 1 |
| 16 | 0 | 1 | 0 | 1 | 0 | 1 | 1 | 0 | 1 | 1 | 1 | 1 | 1 | 1 |
| 17 | 1 | 1 | 0 | 1 | 0 | 1 | 0 | 1 | 0 | 1 | 1 | 1 | 1 | 1 |
| 18 | 0 | 0 | 1 | 1 | 0 | 1 | 1 | 1 | 1 | 0 | 1 | 1 | 1 | 1 |
| 19 | 1 | 0 | 1 | 1 | 0 | 1 | 0 | 1 | 1 | 1 | 1 | 1 | 1 | 1 |
| 22 | 0 | 0 | 0 | 1 | 1 | 1 | 1 | 0 | 0 | 0 | 1 | 1 | 1 | 0 |

TABLE 17-continued

| i Original column | $M_{i,0}$ [1] | $M_{i,1}$ [2] | $M_{i,2}$ [3] | $M_{i,3}$ [5] | $M_{i,4}$ [4] | $M_{i,5}$ [6] | $M_{i,6}$ [8] | $M_{i,7}$ [9] | $M_{i,8}$ [10] | $M_{i,9}$ [7] | $M_{i,10}$ [11] | $M_{i,11}$ [13] | $M_{i,12}$ [14] | $M_{i,13}$ [12] |
|---|---|---|---|---|---|---|---|---|---|---|---|---|---|---|
| 23 | 1 | 0 | 0 | 1 | 1 | 1 | 1 | 0 | 1 | 1 | 1 | 1 | 1 | 0 |
| 25 | 1 | 1 | 0 | 1 | 1 | 1 | 0 | 0 | 1 | 1 | 0 | 1 | 1 | 1 |
| 26 | 0 | 0 | 1 | 1 | 1 | 1 | 0 | 1 | 0 | 0 | 0 | 1 | 1 | 1 |
| 27 | 1 | 0 | 1 | 1 | 1 | 1 | 1 | 0 | 0 | 1 | 0 | 0 | 1 | 0 |
| 31 | 0 | 0 | 0 | 1 | 0 | 1 | 0 | 0 | 0 | 1 | 0 | 0 | 1 | 0 |

Needless to say, besides the method of Table 17, there are a variety of methods for changing the column order simultaneously while satisfying the optimum allocation pattern of Table 16. Besides the methods of Tables 16 and 17, a further another method is shown in the following Table 18.

TABLE 18

| i Original column | $M_{i,0}$ [1] | $M_{i,1}$ [2] | $M_{i,2}$ [3] | $M_{i,4}$ [5] | $M_{i,3}$ [4] | $M_{i,5}$ [6] | $M_{i,8}$ [9] | $M_{i,9}$ [10] | $M_{i,6}$ [7] | $M_{i,7}$ [8] | $M_{i,12}$ [13] | $M_{i,10}$ [11] | $M_{i,13}$ [14] | $M_{i,11}$ [12] |
|---|---|---|---|---|---|---|---|---|---|---|---|---|---|---|
| 0 | 1 | 0 | 0 | 0 | 0 | 1 | 0 | 0 | 0 | 0 | 0 | 1 | 0 | 1 |
| 2 | 1 | 1 | 0 | 0 | 0 | 1 | 0 | 1 | 0 | 0 | 0 | 1 | 0 | 1 |
| 3 | 0 | 0 | 1 | 0 | 0 | 1 | 1 | 1 | 1 | 0 | 1 | 1 | 1 | 1 |
| 5 | 0 | 1 | 1 | 0 | 0 | 1 | 1 | 0 | 0 | 0 | 1 | 1 | 1 | 1 |
| 6 | 1 | 1 | 1 | 0 | 0 | 1 | 0 | 0 | 0 | 1 | 1 | 1 | 1 | 1 |
| 8 | 1 | 0 | 0 | 0 | 1 | 1 | 1 | 0 | 1 | 1 | 1 | 1 | 0 | 1 |
| 9 | 0 | 1 | 0 | 0 | 1 | 1 | 1 | 1 | 1 | 0 | 1 | 1 | 0 | 1 |
| 11 | 0 | 0 | 1 | 0 | 1 | 1 | 1 | 0 | 0 | 1 | 1 | 1 | 1 | 1 |
| 12 | 1 | 0 | 1 | 0 | 1 | 1 | 0 | 1 | 0 | 1 | 1 | 1 | 1 | 1 |
| 13 | 0 | 1 | 1 | 0 | 1 | 1 | 0 | 1 | 1 | 0 | 1 | 1 | 1 | 1 |
| 16 | 0 | 1 | 0 | 1 | 0 | 1 | 0 | 1 | 1 | 1 | 1 | 1 | 1 | 1 |
| 17 | 1 | 1 | 0 | 1 | 0 | 1 | 1 | 0 | 1 | 0 | 1 | 1 | 1 | 1 |
| 18 | 0 | 0 | 1 | 1 | 0 | 1 | 1 | 1 | 0 | 1 | 1 | 1 | 1 | 1 |
| 19 | 1 | 0 | 1 | 1 | 0 | 1 | 0 | 1 | 0 | 1 | 1 | 1 | 1 | 1 |
| 22 | 0 | 0 | 0 | 1 | 1 | 1 | 0 | 0 | 0 | 1 | 1 | 1 | 1 | 0 |
| 23 | 1 | 0 | 0 | 1 | 1 | 1 | 0 | 1 | 1 | 1 | 1 | 1 | 1 | 0 |
| 25 | 1 | 1 | 0 | 1 | 1 | 1 | 0 | 1 | 1 | 0 | 1 | 0 | 1 | 1 |
| 26 | 0 | 0 | 1 | 1 | 1 | 1 | 1 | 0 | 0 | 0 | 1 | 0 | 1 | 1 |
| 27 | 1 | 0 | 1 | 1 | 1 | 1 | 0 | 0 | 1 | 1 | 0 | 0 | 1 | 0 |
| 31 | 0 | 0 | 0 | 1 | 0 | 1 | 0 | 0 | 1 | 0 | 0 | 0 | 1 | 0 |

If the generation matrixes are configured as shown in Table 17 or 18, although columns are sequentially allocated in proportion to the information bit number "k" or columns from the left side are sequentially allocated, the optimum allocation is implemented.

According to still another embodiment of the present invention, if the number of information bits is equal to or less than 4, the column-directional sequence (basis sequence) location may be changed to another. In more detail, with reference to Table 11, According to this embodiment, the sixth column of Table 11, i.e., $M_{i,5}$, is a basis sequence of which all bits is set to "1". This basis sequence greatly contributes to all codewords of a corresponding bit. Therefore, from the viewpoint of the corresponding bit, the use of the basis sequence having many weights may be desirable.

However, several bits in all codewords are exclusive-OR (XOR) operated, such that their combination result must be considered. Thus, in order to reduce the number of the combination cases, the basis sequence in which each of all bits has the value of "1" moves to the frontmost column, resulting in the increase of a contribution rate. In this way, if data is coded under a small number of bits (i.e., a small bit number), the present invention may consider the above method for moving the basis sequence in which each of all bits is "1" to the frontmost column, and the moved result is represented by the following Table 19.

TABLE 19

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ | $M_{i,13}$ |
|---|---|---|---|---|---|---|---|---|---|---|---|---|---|---|
| 0 | 1 | 1 | 0 | 0 | 0 | 0 | 0 | 0 | 0 | 0 | 1 | 1 | 0 | 0 |
| 1 | 1 | 1 | 1 | 0 | 0 | 0 | 0 | 0 | 0 | 1 | 1 | 1 | 0 | 0 |
| 2 | 1 | 0 | 0 | 1 | 0 | 0 | 1 | 0 | 1 | 1 | 1 | 1 | 1 | 1 |
| 3 | 1 | 0 | 1 | 1 | 0 | 0 | 0 | 0 | 1 | 0 | 1 | 1 | 1 | 1 |
| 4 | 1 | 1 | 1 | 1 | 0 | 0 | 0 | 1 | 0 | 0 | 1 | 1 | 1 | 1 |
| 5 | 1 | 1 | 0 | 0 | 1 | 0 | 1 | 1 | 1 | 0 | 1 | 1 | 1 | 0 |
| 6 | 1 | 0 | 1 | 0 | 1 | 0 | 1 | 0 | 1 | 1 | 1 | 1 | 1 | 0 |
| 7 | 1 | 0 | 0 | 1 | 1 | 0 | 0 | 1 | 1 | 0 | 1 | 1 | 1 | 1 |
| 8 | 1 | 1 | 0 | 1 | 1 | 0 | 0 | 1 | 0 | 1 | 1 | 1 | 1 | 1 |
| 9 | 1 | 0 | 1 | 1 | 1 | 0 | 1 | 0 | 0 | 1 | 1 | 1 | 1 | 1 |
| 10 | 1 | 0 | 1 | 0 | 0 | 1 | 1 | 1 | 0 | 1 | 1 | 1 | 1 | 1 |
| 11 | 1 | 1 | 1 | 0 | 0 | 1 | 1 | 0 | 1 | 0 | 1 | 1 | 1 | 1 |
| 12 | 1 | 0 | 0 | 1 | 0 | 1 | 0 | 1 | 1 | 1 | 1 | 1 | 1 | 1 |

TABLE 19-continued

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ | $M_{i,13}$ |
|---|---|---|---|---|---|---|---|---|---|---|---|---|---|---|
| 13 | 1 | 1 | 0 | 1 | 0 | 1 | 0 | 1 | 0 | 1 | 1 | 1 | 1 | 1 |
| 14 | 1 | 0 | 0 | 0 | 1 | 1 | 0 | 1 | 0 | 0 | 1 | 0 | 1 | 1 |
| 15 | 1 | 1 | 0 | 0 | 1 | 1 | 1 | 1 | 0 | 1 | 1 | 0 | 1 | 1 |
| 16 | 1 | 1 | 1 | 0 | 1 | 1 | 1 | 0 | 0 | 1 | 0 | 1 | 1 | 1 |
| 17 | 1 | 0 | 0 | 1 | 1 | 1 | 0 | 0 | 1 | 0 | 0 | 1 | 1 | 1 |
| 18 | 1 | 1 | 0 | 1 | 1 | 1 | 1 | 1 | 0 | 0 | 0 | 0 | 0 | 1 |
| 19 | 1 | 0 | 0 | 0 | 0 | 1 | 1 | 0 | 0 | 0 | 0 | 0 | 0 | 1 |

With reference to Table 19, a sixth sequence (i.e., each bit of the sixth sequence has the value of "1") from among the original column-directional basis sequence moves to the location of a first basis sequence, and the order of other sequences is not changed to another order.

The following Table 20 shows minimum-distance performances on the basis of the concept of Table 19.

TABLE 20

| | n | | | | | | | | | | | | | |
|---|---|---|---|---|---|---|---|---|---|---|---|---|---|---|
| k | 1 | 2 | 3 | 4 | 5 | 6 | 7 | 8 | 9 | 10 | 11 | 12 | 13 | 14 |
| 20 | 20 | 10 | 8 | 8 | 8 | 8 | 6 | 6 | 6 | 6 | 4 | 4 | 4 | 4 |

According to this embodiment of Table 20, if the number of information bits is 1 or 2, the performance becomes better.

According to the coding theory, although row- or column-locations of generation matrixes are permuted, the generation matrixes have the same code characteristics, such that the above modification will herein be omitted for the convenience of description.

However, if the basis sequences are sequentially allocated to the information bit coding in a generation matrix for supporting variable-length information bits, column permutation may unexpectedly change the generation matrix of the corresponding variable-length information bit to another matrix.

Also, according to the coding theory, although "0" and "1" values may be reversed, the original code and the reversed code may be considered to be equal to equal other, a detailed description of this modification will herein be disclosed.

Next, items to be commonly considered in individual embodiments of the present invention will hereinafter be described in detail.

The [n,k] code is a specific code in which the number of coding bits is "n" and the number of information bits is "k".

In this case, if there is no mention in a generation matrix of each code, this generation matrix is represented by a basic-sequence-type table.

As described above, the coding method based on the proposed block code is similar to that of a TFCI code of the 3GPP release 99. In other words, the information bits are sequentially allocated to the left-sided basis sequence, and a sequence corresponding to the product of the basis sequence and the information bit is added by binary operations (i.e., Exclusive OR sum) corresponding to the number of information bits, such that coding bits are generated.

If the code is represented according to the above-mentioned method, although the number of information bits (hereinafter referred to as "information bit number") is variable, the present invention has an advantage in that it can perform the coding process of data on the basis of a matrix-type basis sequence table. The present invention is able to support a variety of information bit numbers using the above-mentioned advantages. Therefore, a basis sequence table or a code generation matrix is represented in consideration of a maximum-sized information bit number. If the maximum number of information bits needed for the actual application is less than the following proposed size, it is preferable that a table excluding a basis sequence corresponding to a bit exceeding a corresponding maximum bit number be used.

The basis sequence proposed by the following embodiments is designed to have a variable number of information bits (i.e., a variable information-bit number), and is also designed to have a variable number of coding bits (i.e., a variable coding bit number). Therefore, in the case of designing the inventive concept of the present invention, a specific code in which a specific column is deleted from a specific basis sequence table was pre-considered. For example, if a basis sequence table is denoted by a specific format such as (32,15), the specific code is one of application examples of the above (32,15)-format basis sequence table.

In brief, the row and column of the basis sequence table according to the present invention have been decided on the basis of the largest-sized row and column of the basis sequence table. In the case of the small-sized row and column, the rows and columns of the largest-sized basis sequence table are sequentially deleted, such that the deleted result is used. Needless to say, as previously stated above, although the row location may be replaced with the column location in the smaller-sized basis sequence table, or although the location of "0" is replaced with the other location of "1" in the basis sequence table, the above replaced results may have the same codes.

For the convenience of description and better understanding of the present invention, in the case of indicating the order of any data of the present invention, the information bits sequentially proceed in the direction from the left column to the right column in the above basis sequence table. The coding bits sequentially proceed in the direction from the upper-most row to the lowermost row in the above basis sequence table. Therefore, provided that a maximum of the information-bit length is 13 bits, if a single rightmost basis sequence is deleted from the basis sequence Table shown in the following Table 19, the following Table 21 can be acquired.

TABLE 21

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|
| 0 | 1 | 1 | 0 | 0 | 0 | 0 | 0 | 0 | 0 | 0 | 1 | 1 | 0 |
| 1 | 1 | 1 | 1 | 1 | 0 | 0 | 0 | 0 | 0 | 0 | 1 | 1 | 1 | 0 |

TABLE 21-continued

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|
| 2 | 1 | 0 | 0 | 1 | 0 | 0 | 1 | 0 | 1 | 1 | 1 | 1 | 1 |
| 3 | 1 | 0 | 1 | 1 | 0 | 0 | 0 | 0 | 1 | 0 | 1 | 1 | 1 |
| 4 | 1 | 1 | 1 | 1 | 0 | 0 | 0 | 1 | 0 | 0 | 1 | 1 | 1 |
| 5 | 1 | 1 | 0 | 0 | 1 | 0 | 1 | 1 | 1 | 0 | 1 | 1 | 1 |
| 6 | 1 | 0 | 1 | 0 | 1 | 0 | 1 | 0 | 1 | 1 | 1 | 1 | 1 |
| 7 | 1 | 0 | 0 | 1 | 1 | 0 | 0 | 1 | 1 | 0 | 1 | 1 | 1 |
| 8 | 1 | 1 | 0 | 1 | 1 | 0 | 0 | 1 | 0 | 1 | 1 | 1 | 1 |
| 9 | 1 | 0 | 1 | 1 | 1 | 0 | 1 | 0 | 0 | 1 | 1 | 1 | 1 |
| 10 | 1 | 0 | 1 | 0 | 0 | 1 | 1 | 1 | 0 | 1 | 1 | 1 | 1 |
| 11 | 1 | 1 | 1 | 0 | 0 | 1 | 1 | 0 | 1 | 0 | 1 | 1 | 1 |
| 12 | 1 | 0 | 0 | 1 | 0 | 1 | 0 | 1 | 1 | 1 | 1 | 1 | 1 |
| 13 | 1 | 1 | 0 | 1 | 0 | 1 | 0 | 1 | 0 | 1 | 1 | 1 | 1 |
| 14 | 1 | 0 | 0 | 0 | 1 | 1 | 0 | 1 | 0 | 0 | 1 | 0 | 1 |
| 15 | 1 | 1 | 0 | 0 | 1 | 1 | 1 | 1 | 0 | 1 | 1 | 0 | 1 |
| 16 | 1 | 1 | 1 | 0 | 1 | 1 | 0 | 0 | 1 | 0 | 1 | 1 | 1 |
| 17 | 1 | 0 | 0 | 1 | 1 | 1 | 0 | 0 | 1 | 0 | 0 | 1 | 1 |
| 18 | 1 | 1 | 0 | 1 | 1 | 1 | 1 | 0 | 0 | 0 | 0 | 0 | 0 |
| 19 | 1 | 0 | 0 | 0 | 0 | 1 | 1 | 0 | 0 | 0 | 0 | 0 | 0 |

Preferably, a specific-pattern basis sequence may not be used in a specific channel estimation method. In this case, a specific Table having no specific basis sequence from among Tables proposed in the individual embodiments of the present invention can be considered. In this case, from the viewpoint of the coding process, a corresponding basis sequence can always be set to "0", such that this means that the same coding performance is made but only the number of information bits is reduced. Therefore, the basis sequence Table having no specific basis sequence in the above-mentioned basis sequence Tables of the individual embodiments also belongs to the scope of the present invention.

Based on the above-mentioned (20,A) block code, the (18, A) block code corresponding to a codeword length of 18 bits or the (16,A) block code corresponding to a codeword length of 16 bits according to another aspect of the present invention will hereinafter be described.

2. Second Aspect (18,A) or (16,A) Block Coding

As described above, the (18,A) and (16,A) block codes can use the (32,10)-format TFCI information code in the same manner as in the (20,A) block code. Therefore, a method for generating the (18,10) or (16,10) block code, modifying the generated (18,10) or (16,10) block code, and generating an arbitrary (18,A) or (16,A) block code according to the present invention will hereinafter be described.

This following embodiment searches for a puncturing pattern using the following three methods, such that it is able to provide the optimum (18,10) and (16,10) code generation matrixes. In the following description, for the convenience of description and better understanding of the present invention, it is assumed that an equivalent format of the TFCI information code is the basis (32,10) code as shown in Table 2.

Firstly, generation matrixes of all codes can be generated by puncturing the (32,10) code generation matrix. For the convenience of description, this method will hereinafter be called a first method. In more detail, the (20,10) code generation matrix can be searched by puncturing the (32,10) code generation matrix. The (18,10) code generation matrix can also be searched by puncturing the (32,10) code generation matrix. The (16,10) code generation matrix can also be searched by puncturing the (32,10) code generation matrix. If the (20,10) code, the (18,10) code, and the 16,10) block code are generated according to the above-mentioned method, the individual codes can be generated in consideration of optimum puncturing patterns.

Figure 2:
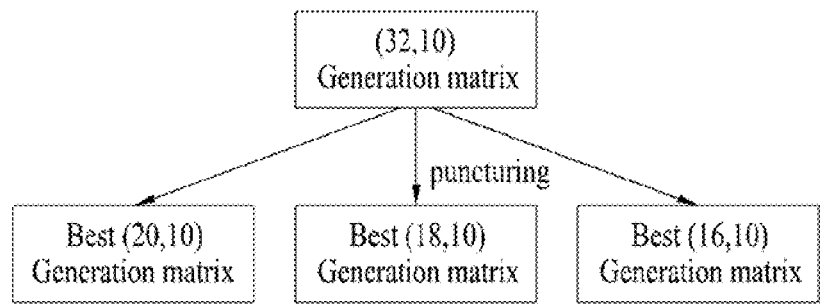
FIG. 2 is a conceptual diagram illustrating a method for generating the (20,10), (18,10), or (16,10) code generation matrix from the (32,10)-format base code according to an embodiment of the present invention.

The above-mentioned first method is shown in FIG. 2.

FIG. 2 is a conceptual diagram illustrating a method for generating the (20,10), (18,10), or (16,10) code generation matrix from the (32,10)-format base code according to an embodiment of the present invention.

However, if the individual block codes are generated as shown in FIG. 2, the number of puncturing patterns to be actually considered geometrically increases, resulting in greater inconvenience of use. In the case of the (20,10) code, 12 columns must be deleted from 32 columns of the original (32,10) code generation matrix, such that the number of all puncturing patterns to be considered is denoted by $$\binom{32}{12} = 225{,}792{,}840.$$

In the case of the (18,10) code, the number of puncturing patterns to be considered further increases, such that the number of puncturing patterns is denoted by $$\binom{32}{14} = 471{,}435{,}600.$$

The (16,10) code must consider a total number of puncturing patterns (i.e., $$\binom{32}{16} = 601{,}080{,}390$$

puncturing patterns). The above-mentioned consideration of all puncturing patterns brings about a large number of calculations, such that a method for effectively searching for the puncturing patterns must be considered.

According to another embodiment of the present invention, all code generation matrixes are not generated from the punctured 32,10) code generation matrix. The (20,10) code generation matrix is firstly searched, such that the generation matrix of the (18,10) or (16,10) code can be configured on the basis of the (20,1) code generation matrix. This method will hereinafter be called a second method. In this case, it should be noted that the (18,10) and (16,10) codes have been generated on the basis of the (20,10) code. This second method is shown in FIG. 3.

Figure 3:
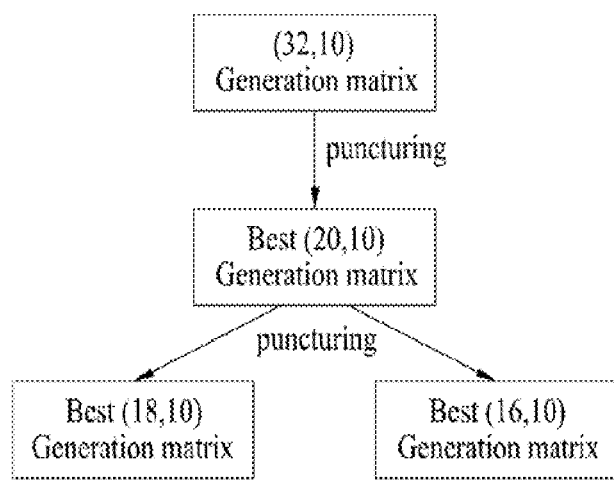
FIG. 3 is a conceptual diagram illustrating a method for generating the (20,10) code from the (32,10)-format base code, and generating each of the (18,10) code and the (16,10) code using the (20,10) code according to another embodiment of the present invention.

FIG. 3 is a conceptual diagram illustrating a method for generating the (20,10) code from the (32,10)-format base code, and generating each of the (18,10) code and the (16,10) code using the (20,10) code according to another embodiment of the present invention.

As previously stated in the above-mentioned first aspect of the present invention, according to the method for generating the (20,10) code generation matrix by puncturing the conventional (32,10) code generation matrix, it can be recognized that there are 360 number of (20,10) code generation matrixes having a maximum $d_{min}$ value of 6 (i.e., $d_{min}$=6). In this case, two columns of the (20,10) code generation matrix are additionally punctured, such that the (18,10) code generation matrix is configured. Also, 4 columns of the (20,10) code generation matrix are additionally punctured independent of the (18,10) code, such that the (16,10) code generation matrix can be configured. In this method, the present invention searches for all available patterns according to the exhaustive search method, such that the (10*18) or (10*16) generation matrix having a maximum $d_{min}$ value can be searched from the (10*20) generation matrix.

Also, according to still another embodiment of the present invention, columns of the (32,10) code generation matrix are sequentially punctured, such that the (20,10) code generation matrix, the (18,10) code generation matrix, and the (16,10) code generation matrix can be searched. This method will hereinafter be called a third method. A detailed description of this third method is as follows.

Firstly, the present invention punctures the (32,10) code generation matrix, such that it acquires an optimum (20,10) code generation matrix having both an optimum Hamming weight distribution and a maximum $d_{min}$ value. By the puncturing process of the optimum (20,1) code generation matrix, the present invention acquires the (18,10) code generation matrix having both an optimum Hamming weight distribution and a maximum $d_{min}$ value. Using the same method, the (18,10) code generation matrix is punctured, such that the (16,10) code generation matrix having both an optimum Hamming weight distribution and a maximum $d_{min}$ value can be acquired. The above-mentioned processes will hereinafter be called a third method, and this third method is shown in FIG. 4.

Figure 4:
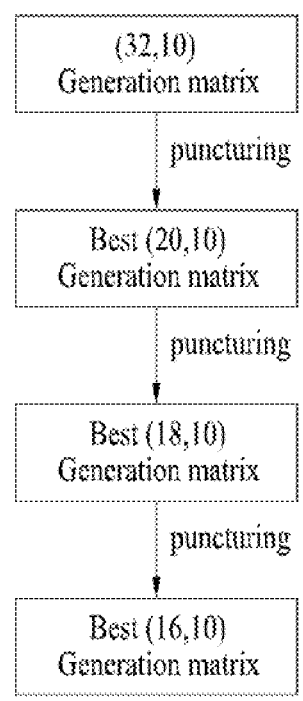
FIG. 4 is a conceptual diagram illustrating a method for generating the (20,10) code generation matrix from the (32, 10)-format base code generation matrix, generating the (18, 10) code generation matrix using the (20,10) code generation matrix, and generating the (16,10) code generation matrix using the (18,10) code generation matrix according to another embodiment of the present invention.

FIG. 4 is a conceptual diagram illustrating a method for generating the (20,10) code generation matrix from the (32,10)-format base code generation matrix, generating the (18,10) code generation matrix using the (20,10) code generation matrix, and generating the (16,10) code generation matrix using the (18,10) code generation matrix according to another embodiment of the present invention.

Referring to FIG. 4, the (32,10) code generation matrix is punctured such that the (20,10) code generation matrix is acquired. Two columns of the (20,10) code generation matrix are punctured, such that the (10*18) matrix acting as the (18,10) code generation matrix having a maximum $d_{min}$ value is acquired. In this case, more 2 columns of the (20,10) code generation matrix are additionally punctured, such that the (10*16) generation matrix acting as the (16,10) code generation matrix having a maximum $d_{min}$ value can be acquired.

Generation matrixes configured by the above-mentioned method maximally shares the same part, such that the generation matrixes have many common points. In the meantime, it is well known in the art that a maximum $d_{min}$ value of the (16,10) code is 4, but a maximum $d_{min}$ value of the code capable of being generated by the third method is 3. Therefore, if the generation matrix is configured by the third method, the performance of the (16,10) code becomes deteriorated.

In the meantime, in order to improve the above-mentioned problems, the present invention provides a method for changing the order of generating the (18,10) code and the (16,10) code. This method will hereinafter be called a fourth method. In the fourth method, the present invention punctures the (32,10) code generation matrix, such that it acquires the (20,10) code generation matrix having both a maximum $d_{min}$ value and an optimum Hamming weight distribution. By the puncturing process of the optimum (20,10) code generation matrix, the present invention acquires the (16,10) code generation matrix having both a maximum $d_{min}$ value and an optimum Hamming weight distribution. 2 columns are added to 4 columns which has been punctured to acquire the (16,10) code generation matrix, such that the (18,10) code generation matrix is acquired. The above-mentioned processes are shown in FIG. 5.

Figure 5:
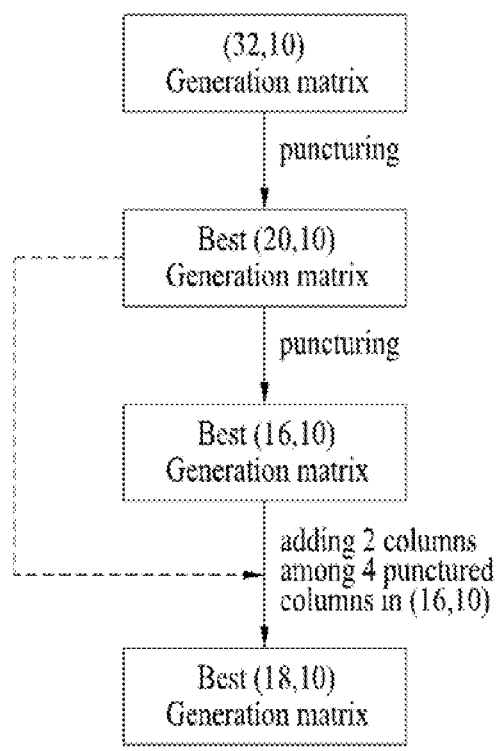
FIG. 5 is a conceptual diagram illustrating a method for generating the (20,10) code generation matrix from the (32, 10)-format base code generation matrix, generating the (16, 10) code generation matrix using the (20,10) code generation matrix, and generating the (18,10) code generation matrix using the (16,10) code generation matrix according to still another embodiment of the present invention.

FIG. 5 is a conceptual diagram illustrating a method for generating the (20,10) code generation matrix from the (32,10)-format base code generation matrix, generating the (16,10) code generation matrix using the (20,10) code generation matrix, and generating the (18,10) code generation matrix using the (16,10) code generation matrix according to still another embodiment of the present invention.

Referring to FIG. 5, the (32,10) code generation matrix is punctured such that the (20,10) code generation matrix is acquired. 4 columns of the (20,10) code generation matrix are punctured, such that the (10*16) generation matrix acting as the (16,10) code having a maximum $d_{min}$ value is acquired. The (10*18) generation matrix of the (18,10) code is generated when two columns from among 4 columns, which have been punctured to generate the (10*16) matrix from the (10*20) generation matrix of the (20,10) code, are added to the (10*16) matrix.

In this case, although the above column addition has occurred at any place, there is no difference in performance between the original code and the modified code. For the convenience of description, it is assumed that the columns be added to the rightmost side of the (10*16) matrix. Also, the present invention provides a method for adding 2 columns to configure the (10*18) matrix which generate the smallest number of codewords having the same Hamming weight as the $d_{min}$ value at which the optimum Hamming weight distribution of the (18,10) codes are acquired.

Next, detailed generation matrixes based on the above-mentioned methods will hereinafter be described.

In this case, as shown in the above-mentioned first method, the case in which all or each of the (20,10)-, (18,10)-, and (16,10)-code generation matrixes were/was generated by the puncturing of the (32,10) code generation matrix, will not be considered for the convenience of description because too many cases exist in the above code generation method, such that it is actually difficult to effectively construct a necessary code. Therefore, the following examples consider a method for constructing an optimum (20,10) code generation matrix by puncturing the (32,10) code generation matrix, and constructing the (18,10) or (16,10) code generation matrix on the basis of the (20,10) code generation matrix. Namely, the following examples consider only the second to fourth methods.

Firstly, the second method will hereinafter be described in detail. In the second method, all or each of the (18,10) code generation matrix and the (16,10) code generation matrix can be generated from the punctured (20,10) code generation matrix.

Firstly, the (20,10) code generation matrix is configured by puncturing the (32,10) code generation matrix. The optimum (20,10) code generation matrix can be acquired by the method of FIG. 1 according to the first aspect of the present invention. A total of 360 (20,10) code generation matrixes having a maximum $d_{min}$ value of 6 ($d_{min}$=6) exist. If 2 columns of the above optimum (20,10) code generation matrix are punctured, the (18,10) code generation is generated. If 4 columns of the above (20,10) code generation matrix are punctured, the (16,10) code generation matrix is generated. All or each of the (18,10) code generation matrix and the (16,10) code generation matrix are/is configured by puncturing the (20,10) code generation matrix, such that the number of common puncturing patterns between two codes (i.e., the (18,10) code and the (20,10) code) may be variable every time.

More detailed description thereof will hereinafter be described in detail. A total number of (20,10) code's puncturing patterns for the (18,10) code generation matrix is denoted by $$360 \times \binom{20}{2} = 68,400.$$

A maximum $d_{min}$ value from among the 68400 puncturing patterns is 4. A total number of optimum (18,10) code generation matrixes is 700. Each optimum (18,10) code generation matrix generates the smallest number of codewords having the same Hamming weight as the $d_{min}$ value (i.e., maximum $d_{min}$=4) at which the optimum Hamming weight distribution of the (18,10) codes are acquired. The Hamming weight distribution of the above-mentioned optimum (18,10) code generation matrix is represented by the following Equation 6.

$A_{B,18}(x)=x^{18}+5x^{14}+44x^{13}+87x^{12}+112x^{11}+163x^{10}+200x^9+163x^8+112x^7+87x^6+44x^5+5x^4+1$

In this case, the (10*20) generation matrix used for constructing the (10*18) generation matrix having the Hamming weight distribution of Equation 6 has two Hamming weight distributions shown in the following Equations 7 and 8.

$A_{A2,20}(x)=x^{20}+94x^{14}+239x^{12}+356x^{10}+239x^8+94x^6+1$ [Equation 7]

$A_{A3,20}(x)=x^{20}+98x^{14}+223x^{12}+380x^{10}+223x^8+98x^6+1$ [Equation 8]

In the case of the (16,10) code generation matrix, a total number of puncturing patterns based on the (20,10) code is denoted by $$360 \times \binom{20}{4} = 1,744,200.$$

A maximum $d_{min}$ value from among the 1744200 puncturing patterns is 4. A total number of optimum (16,10) code generation matrixes is 40. Each optimum (16,10) code generation matrix generates the smallest number of codewords having the same Hamming weight as the $d_{min}$ value (i.e., maximum $d_{min}$=4) at which the optimum Hamming weight distribution of the (16,10) codes are acquired. The Hamming weight distribution of the above-mentioned optimum (16,10) code generation matrix is represented by the following Equation 9.

$A_{B,16}(x)=x^{16}+60x^{12}+256x^{10}+390x^8+256x^6+60x^4+1$ [Equation 9]

In this case, the (10*20) generation matrix used for constructing the (16*10) code generation matrix having the Hamming weight distribution of Equation 9 has the following Hamming weight distribution represented by Equation 10.

$A_{A2,20}(x)=x^{20}+94x^{14}+239x^{12}+356x^{10}+239x^8+94x^6+1$ [Equation 10]

The following Table 22 shows an example of the (10*18) generation matrix of Equation 6. The following Table 23 shows an example of the (10*16) generation matrix based on the Hamming weight distribution of Equation 9.

TABLE 22

| | 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|---|
| $g_{10by18}[1]$ | 1 | 1 | 0 | 1 | 1 | 1 | 0 | 0 | 1 | 0 | 0 | 0 | 0 | 1 | 0 | 1 | 0 | 0 |
| $g_{10by18}[2]$ | 1 | 0 | 0 | 1 | 1 | 0 | 0 | 1 | 0 | 0 | 1 | 0 | 1 | 0 | 0 | 1 | 1 | 0 |
| $g_{10by18}[3]$ | 1 | 1 | 1 | 0 | 1 | 1 | 1 | 0 | 0 | 0 | 1 | 1 | 0 | 0 | 0 | 1 | 1 | 1 |
| $g_{10by18}[4]$ | 1 | 1 | 1 | 1 | 0 | 0 | 0 | 0 | 0 | 0 | 1 | 1 | 1 | 1 | 1 | 0 | 0 | 0 |
| $g_{10by18}[5]$ | 1 | 1 | 1 | 1 | 1 | 1 | 1 | 1 | 1 | 1 | 0 | 0 | 0 | 0 | 0 | 0 | 0 | 0 |
| $g_{10by18}[6]$ | 1 | 1 | 1 | 1 | 1 | 1 | 1 | 1 | 1 | 1 | 1 | 1 | 1 | 1 | 1 | 1 | 1 | 1 |
| $g_{10by18}[7]$ | 1 | 1 | 0 | 1 | 0 | 0 | 0 | 1 | 1 | 1 | 1 | 0 | 1 | 1 | 0 | 0 | 0 | 1 |
| $g_{10by18}[8]$ | 1 | 1 | 0 | 0 | 1 | 1 | 1 | 1 | 1 | 0 | 0 | 1 | 0 | 1 | 1 | 1 | 0 | 0 |
| $g_{10by18}[9]$ | 1 | 0 | 1 | 0 | 1 | 0 | 1 | 0 | 0 | 0 | 0 | 1 | 1 | 1 | 1 | 0 | 1 | 1 |
| $g_{10by18}[10]$ | 1 | 0 | 0 | 1 | 1 | 1 | 1 | 1 | 0 | 0 | 1 | 0 | 1 | 0 | 0 | 0 | 0 | 1 |

TABLE 23

| | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| $g_{10by16}[1]$ | 1 | 0 | 1 | 1 | 0 | 0 | 1 | 1 | 1 | 0 | 0 | 0 | 0 | 1 | 0 | 1 |
| $g_{10by16}[2]$ | 1 | 1 | 0 | 1 | 1 | 0 | 1 | 0 | 1 | 0 | 1 | 0 | 1 | 0 | 0 | 0 |
| $g_{10by16}[3]$ | 1 | 1 | 1 | 0 | 0 | 0 | 0 | 0 | 1 | 1 | 0 | 0 | 1 | 1 | 1 | 0 |
| $g_{10by16}[4]$ | 1 | 1 | 1 | 1 | 1 | 1 | 0 | 0 | 1 | 1 | 1 | 1 | 0 | 0 | 0 | 0 |
| $g_{10by16}[5]$ | 1 | 1 | 1 | 1 | 1 | 1 | 1 | 1 | 0 | 0 | 0 | 0 | 0 | 0 | 0 | 0 |
| $g_{10by16}[6]$ | 1 | 1 | 1 | 1 | 1 | 1 | 1 | 1 | 1 | 1 | 1 | 1 | 1 | 1 | 1 | 1 |
| $g_{10by16}[7]$ | 1 | 1 | 1 | 1 | 1 | 0 | 1 | 1 | 1 | 0 | 1 | 0 | 0 | 0 | 1 | 0 |
| $g_{10by16}[8]$ | 1 | 1 | 1 | 0 | 0 | 1 | 0 | 1 | 1 | 1 | 0 | 1 | 0 | 0 | 0 | 0 |
| $g_{10by16}[9]$ | 1 | 1 | 0 | 0 | 1 | 0 | 1 | 0 | 1 | 1 | 1 | 1 | 1 | 0 | 1 | 0 |
| $g_{10by16}[10]$ | 1 | 0 | 0 | 1 | 0 | 0 | 0 | 0 | 1 | 0 | 1 | 0 | 0 | 1 | 1 | 0 |

The matrixes generated by all puncturing patterns having the Hamming weight distribution of Equation 6 or 9 have the same error correction capability in a minimum distance aspect. A detailed description thereof will hereinafter be described. The (10*18) matrixes generated by all puncturing patterns having the Hamming weight distribution of Equation 6 have the same error correction capability, such that all kinds of matrixes can be freely used without any problems. The (10*16) matrixes generated by all puncturing patterns having the weight distribution of Equation 9 also have the same error correction capability, such that any of the (10*16) matrixes can be freely used without any problems.

Next, the generation matrix for indicating the Hamming weight distribution of the (18,10) or (16,10) codes and the puncturing patterns for indicating the above generation matrix will hereinafter be described in detail. In more detail, the generation matrixes and the puncturing patterns according to the individual Hamming weight distributions will hereinafter be described. In the case of searching the puncturing patterns using the exhaustive search, the searched puncturing patterns are as follows.

The number of puncturing patterns indicating the Hamming weight distribution of Equation 6 in the (18,10) code generation matrix is 700. The individual puncturing patterns have been disclosed in Appendix of U.S. Provisional Application No. 61/016,492. In this case, the value "0" of Table 3 indicates that a column corresponding to the location of "0" is punctured.

In this case, it should be noted that the (18,10) code generation matrix be generated by puncturing the (20,10) code generation matrix and the (20,10) code generation matrix be generated by puncturing the (32,10) code generation matrix. Therefore, the puncturing process of the (32,10) code generation matrix is firstly carried out to construct the (20,10) code generation matrix, and the puncturing process of the (20,10) code generation matrix is carried out to construct the (18,10) code generation matrix.

In the meantime, the (16,10) code generation matrix includes 40 puncturing patterns indicating the Hamming weight distribution of Equation 9. The 40 puncturing patterns have been disclosed in the Appendix of U.S. Provisional Application No. 61/016,492.

In this case, it should be noted that the (16,10) code generation matrix be generated by puncturing the (20,10) code generation matrix and the (20,10) code generation matrix be generated by puncturing the (32,10) code generation matrix. Therefore, the puncturing process of the (32,10) code generation matrix is firstly carried out to construct the (20,10) code generation matrix, and the puncturing process of the (20,10) code generation matrix is carried out to construct the (16,10) code generation matrix.

Next, the fourth method for generating the (16,10) code generation matrix by puncturing the (20,10) code generation matrix, selecting 2 columns from 4 columns punctured for the above (16,10) code generation matrix, adding the selected 2 columns to the (16,10) code generation matrix, and generating the (18,10) code generation matrix will hereinafter be described in detail.

Firstly, the (20,10) code generation matrix is generated by puncturing the (32,10) code generation matrix. The optimum (20,10) code generation matrix is acquired by the method of FIG. 1 disclosed in the above first aspect of the present invention, and a total number of (20,10) code generation matrixes having the maximum $d_{min}=6$ value exist. 4 columns of the optimum (20,10) code generation matrix are punctured such that the (16,10) code generation matrix is generated. 2 columns are selected from among the 4 punctured columns, and the selected 2 columns are added to the (16,10) code generation matrix, such that the (18,10) code generation matrix is generated.

Detailed descriptions of the above-mentioned method are as follows. As for the (16,10) code according to the method of 360 (10*20) matrixes having a maximum $d_{min}$ value of 6 (i.e., $d_{min}=6$), the method of the first aspect of the present invention is able to generate a total of 40 optimum (16,10) code generation matrixes which generate the smallest number of codewords having the same Hamming weight as the $d_{min}$ value at which the optimum Hamming weight distribution shown in Equation 9. The 40 (16,10) code generation matrixes have the maximum $d_{min}=4$ value and the optimum Hamming weight distribution.

The optimum (18,10) code generation matrix can be generated from the above 40 (10*16) matrixes. In more detail, when 2 columns from among 4 columns, which have been punctured to generate the (10*16) matrix from the (20,10) code generation matrix, are selected, and are then added to the right side of the (16,10) code generation matrix, the optimum (18,10) code generation matrix is generated. For the convenience of description, the 2 columns are added to the right-most of the (16,10) code generation matrix. However, in fact, the 2 columns can be freely added to any part of the (16,10) code generation matrix without generating a difference in performance. Therefore, various modifications can be made available according to added locations. In the meantime, 2 columns capable of generating the (10*18) matrix having the optimum Hamming weight distribution of the (18,10) code are selected from the $$\binom{4}{2}$$

number of added combinations (i.e., the $$\binom{4}{2}$$

added combinations). In this case, the optimum Hamming weight distribution indicates that there are the smallest number of codewords having the same Hamming weight as the $d_{min}$ value. In this way, in a total of 240 generation matrixes (i.e., $$40 \times \binom{4}{2} = 240$$

number of generation matrixes) having the maximum $d_{min}=4$ value, the number of matrixes having the optimum hamming weight distribution is 160. The Hamming weight distribution acquired from the above optimum generation matrixes can be represented by the following Equation 11.

$$A_{C,18}(x) = x^{18} + 8x^{14} + 34x^{13} + 94x^{12} + 120x^{11} + 153x^8 + 204x^8 + 153x^8 + 120x^7 + 94x^6 + 34x^5 + 8x^4 + 1 \quad \text{[Equation 11]}$$

In this case, the upper (10*20) generation matrixes used for constructing the (18,10) code generation matrix having the Hamming weight distribution of Equation 11 have the following Hamming weight distribution represented by the following Equation 12.

$$A_{C,18}(x) = x^{20} + 94x^{14} + 239x^{12} + 356x^{10} + 239x^8 + 94x^6 + 1 \quad \text{[Equation 12]}$$

There are 160 (18,10) code generation matrixes having the Hamming weight distribution of Equation 11. The following Table 24 shows an example of the 160 (18,10) code generation matrixes.

TABLE 24

|  | 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|---|
| $g_{10by18}[1]$ | 1 | 0 | 1 | 1 | 0 | 0 | 1 | 1 | 1 | 0 | 0 | 0 | 0 | 1 | 0 | 1 | 1 | 0 |
| $g_{10by18}[2]$ | 1 | 1 | 0 | 1 | 1 | 0 | 1 | 0 | 1 | 0 | 1 | 0 | 1 | 0 | 0 | 0 | 1 | 1 |
| $g_{10by18}[3]$ | 1 | 1 | 1 | 0 | 0 | 0 | 0 | 0 | 1 | 1 | 0 | 0 | 1 | 1 | 1 | 0 | 1 | 0 |
| $g_{10by18}[4]$ | 1 | 1 | 1 | 1 | 1 | 1 | 0 | 0 | 1 | 1 | 1 | 1 | 0 | 0 | 0 | 0 | 0 | 0 |
| $g_{10by18}[5]$ | 1 | 1 | 1 | 1 | 1 | 1 | 1 | 1 | 0 | 0 | 0 | 0 | 0 | 0 | 0 | 0 | 1 | 1 |
| $g_{10by18}[6]$ | 1 | 1 | 1 | 1 | 1 | 1 | 1 | 1 | 1 | 1 | 1 | 1 | 1 | 1 | 1 | 1 | 1 | 1 |
| $g_{10by18}[7]$ | 1 | 1 | 1 | 1 | 1 | 0 | 1 | 1 | 1 | 0 | 1 | 0 | 0 | 0 | 1 | 0 | 0 | 1 |
| $g_{10by18}[8]$ | 1 | 1 | 1 | 0 | 0 | 1 | 0 | 1 | 1 | 1 | 0 | 1 | 0 | 0 | 0 | 0 | 1 | 1 |
| $g_{10by18}[9]$ | 1 | 1 | 0 | 0 | 1 | 0 | 1 | 0 | 1 | 1 | 1 | 1 | 0 | 1 | 0 | 1 | 1 | 0 |
| $g_{10by18}[10]$ | 1 | 0 | 0 | 1 | 0 | 0 | 0 | 0 | 1 | 0 | 1 | 0 | 0 | 1 | 1 | 0 | 1 | 1 |

The matrixes generated by all puncturing patterns having the Hamming weight distribution of Equation 11 have the same error correction capability in a minimum distance aspect. Therefore, the (10*18) matrixes generated by all puncturing patterns having the Hamming weight distribution of Equation 11 have the same error correction capability, such that all kinds of matrixes can be freely used without any problems.

In fact, there are several generation matrixes having the same Hamming weight distribution. A total number of puncturing patterns needed to express the optimum (16,10) code generation matrix is 40. The above 40 puncturing patterns are equal to those of the above-mentioned second method.

In the meantime, the reason why this example has considered the method for puncturing/adding the columns of the generation matrix is that the generation of the (16,10) code having the maximum $d_{min}$=4 value must be firstly considered.

As previously stated in the above-mentioned third method, 2 columns of the 360 (10*20) matrix having the maximum $d_{min}$=6 value are firstly punctured, and 2 columns of 700 optimum (18,10) code generation matrixes are additionally punctured, such that the (16,10) code generation matrix can be generated. In this case, the 700 optimum (18,10) code generation matrixes generate the smallest number of codewords having the same Hamming weight as the $d_{min}$ value, and satisfy Equation 9 including the maximum $d_{min}$=4 value and the optimum Hamming weight distribution. In this case, the maximum $d_{min}$ value of the (16,10) code is 3. In all the (16,10) code generation matrixes having the maximum $d_{min}$=3 value, the number of optimum (16,10) code generation matrixes which generate the smallest number of codewords having the same hamming weight as the $d_{min}$ value indicating an optimum Hamming weight distribution is 2180. In this case, the Hamming weight distribution can be represented by the following Equation 13.

$$A_{D,16}(x) = x^{16} + 2x^{13} + 40x^{12} + 74x^{11} + 112x^{10} + 180x^9 + 206x^8 + 180x^7 + 112x^6 + 74x^5 + 40x^4 + 2x^3 + 1 \quad \text{[Equation 13]}$$

As described above, the (16,10) code generated by the third method has the maximum $d_{min}$ value of 3 (i.e., $d_{min}$=3). In order to generate the (16,10) code generation matrix having the maximum $d_{min}$=4 value by increasing the maximum $d_{min}$ value, the rightmost 2 columns of the 160 (18,10) code generation matrixes having the Hamming weight distribution of Equation 11 must be punctured. If this method is systemically represented, the represented result is indicative of the fourth method.

A detailed description of the fourth method is as follows. The second method requires an independent generation matrix in each case of the (20,10) code, the (18,10) code, and (16,10) code. The fourth method enables the (10*16) and (10*18) matrixes to be derived from a single (10*20) matrix.

Next, based on the above-mentioned concepts, the (20,A) code generation matrix disclosed in the first aspect of the present invention will hereinafter be described.

For the convenience of description, the generation matrixes (See Table 2) used as the (32,10)-format basis generation matrixes can also be represented by the following Table 25. In other words, the following Table 25 is only a vertical-shaped format of Table 2, and is substantially equal to Table 2.

TABLE 25

| Index | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ |
|---|---|---|---|---|---|---|---|---|---|---|
| 0 | 1 | 1 | 1 | 1 | 1 | 1 | 1 | 1 | 1 | 1 |
| 1 | 0 | 1 | 1 | 1 | 1 | 1 | 1 | 1 | 1 | 0 |
| 2 | 1 | 0 | 1 | 1 | 1 | 1 | 1 | 1 | 0 | 0 |
| 3 | 0 | 0 | 1 | 1 | 1 | 1 | 0 | 0 | 1 | 0 |
| 4 | 1 | 1 | 0 | 1 | 1 | 1 | 1 | 0 | 0 | 1 |
| 5 | 0 | 1 | 0 | 1 | 1 | 1 | 1 | 0 | 1 | 0 |
| 6 | 1 | 0 | 0 | 1 | 1 | 1 | 1 | 1 | 0 | 1 |
| 7 | 0 | 0 | 0 | 1 | 1 | 1 | 0 | 1 | 0 | 0 |
| 8 | 1 | 1 | 1 | 0 | 1 | 1 | 0 | 1 | 1 | 1 |
| 9 | 0 | 1 | 1 | 0 | 1 | 1 | 0 | 0 | 1 | 1 |
| 10 | 1 | 0 | 1 | 0 | 1 | 1 | 0 | 1 | 0 | 1 |
| 11 | 0 | 0 | 1 | 0 | 1 | 1 | 0 | 1 | 1 | 1 |
| 12 | 1 | 1 | 0 | 0 | 1 | 1 | 1 | 0 | 1 | 0 |
| 13 | 0 | 1 | 0 | 0 | 1 | 1 | 1 | 1 | 0 | 1 |
| 14 | 1 | 0 | 0 | 0 | 1 | 1 | 1 | 1 | 0 | 0 |
| 15 | 0 | 0 | 0 | 0 | 1 | 1 | 1 | 0 | 0 | 0 |
| 16 | 1 | 1 | 1 | 1 | 0 | 1 | 1 | 1 | 1 | 1 |
| 17 | 0 | 1 | 1 | 1 | 0 | 1 | 1 | 0 | 0 | 1 |
| 18 | 1 | 0 | 1 | 1 | 0 | 1 | 0 | 1 | 0 | 1 |
| 19 | 0 | 0 | 1 | 1 | 0 | 1 | 0 | 1 | 1 | 0 |
| 20 | 1 | 1 | 0 | 1 | 0 | 1 | 0 | 0 | 1 | 1 |
| 21 | 0 | 1 | 0 | 1 | 0 | 1 | 1 | 0 | 1 | 1 |

TABLE 25-continued

| Index | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ |
|---|---|---|---|---|---|---|---|---|---|---|
| 22 | 1 | 0 | 0 | 1 | 0 | 1 | 1 | 1 | 1 | 0 |
| 23 | 0 | 0 | 0 | 1 | 0 | 1 | 0 | 1 | 1 | 0 |
| 24 | 1 | 1 | 1 | 0 | 0 | 1 | 0 | 1 | 0 | 0 |
| 25 | 0 | 1 | 1 | 0 | 0 | 1 | 0 | 0 | 1 | 0 |
| 26 | 1 | 0 | 1 | 0 | 0 | 1 | 0 | 0 | 0 | 1 |
| 27 | 0 | 0 | 1 | 0 | 0 | 1 | 1 | 0 | 1 | 1 |
| 28 | 1 | 1 | 0 | 0 | 0 | 1 | 0 | 0 | 0 | 1 |
| 29 | 0 | 1 | 0 | 0 | 0 | 1 | 1 | 0 | 0 | 0 |
| 30 | 1 | 0 | 0 | 0 | 0 | 1 | 0 | 0 | 0 | 0 |
| 31 | 0 | 0 | 0 | 0 | 0 | 1 | 0 | 0 | 0 | 0 |

The actual coding process using the above-mentioned fact will hereinafter be described in detail. If "k" number of information bits (i.e., "k" information bits) is represented by $a_0, a_1, a_2, a_3, a_4, \ldots, a_{k-1}$, the information bits are coded by the code generation matrixes of the above embodiments of the present invention, such that $b_i$ bits are outputted. The $b_i$ bits configure the codeword. In this case, the coded $b_i$ bits can be represented by the following Equation 14.

$$b_i = \sum_{n=0}^{k-1} (a_n \times M_{i,n}) \bmod 2 \text{ where } i = 0, \ldots, 19 \quad \text{[Equation 14]}$$

Next, optimum code generation matrixes for both the bits and 18 bits will hereinafter be described. The above-mentioned 20 or 18 coding bits are designed when the number of coding bits is variable. In more detail, a method for searching for the (20,10) and (18,10) code generation matrixes in the (10*20) and (10*18) matrixes searched by the above-mentioned methods will be described. The (20,10) and (18,10) code generation matrixes have the maximum $d_{min}$ value and the optimum Hamming weight distribution, and generate the smallest number of codewords having the same Hamming weight. This searching method is based on the above fourth method. In this case, a minimum distance of the generated (20,10) code is 6, and the Hamming weight distribution is represented by Equation 15. A minimum distance of the generated (18,10) code is 4, and the Hamming weight distribution is represented by Equation 16.

$$A_{A2,20}(x) = x^{20} + 94x^{14} + 239x^{12} + 356x^{10} + 239x^8 + 94x^6 + 1 \quad \text{[Equation 15]}$$

$$A_{B,18}(x) = x^{18} + 5x^{14} + 44x^{13} + 87x^{12} + 112x^{11} + 163x^{10} + 200x^9 + 163x^8 + 112x^7 + 87x^6 + 44x^5 + 5x^4 + 1 \quad \text{[Equation 16]}$$

Exemplary optimum codes capable of satisfying the above Hamming weight distribution are shown in the following Table 26. The puncturing patterns for the (20,10) code have already been disclosed in Table 6. For the convenience of description, the puncturing patterns of Table 6 can also be represented by the following Table 26.

TABLE 26

| 10 × 32 matrix | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| Table 25 | 0 | 0 | 1 | 1 | 1 | 0 | 1 | 1 | 0 | 0 | 1 | 1 | 1 | 1 | 0 | 1 |
| 10 × 32 matrix | 17 | 18 | 19 | 20 | 21 | 22 | 23 | 24 | 25 | 26 | 27 | 28 | 29 | 30 | 31 | 32 |
| Table 25 | 0 | 1 | 1 | 1 | 0 | 1 | 1 | 0 | 1 | 1 | 0 | 1 | 1 | 0 | 1 | 0 |

In other words, Table 26 shows the puncturing patterns. The puncturing patterns of Table 26 are acquired when 12 rows from among total 32 rows of Table 25 are punctured to generate the (20,10) code. In Table 26, is indicative of a punctured row, and "1" is indicative of a used row. In the meantime, the puncturing patterns for the (18,10) code are shown in the following Table 27.

TABLE 27

| Puncturing Pattern for generating 10 × 20 mother matrix from 10 × 32 matrix | Puncturing Pattern for generating 10 × 18 matrix from 10 × 20 mother matrix | | | | | | | | | | | | | | | | | | | |
|---|---|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | 18 | 19 | 20 |
| Table 26 | 0 | 1 | 1 | 1 | 1 | 1 | 1 | 1 | 1 | 0 | 1 | 1 | 1 | 1 | 1 | 1 | 1 | 1 | 1 | 1 |

In other words, Table 27 shows the puncturing patterns. The puncturing patterns of Table 27 are acquired when 2 rows from among total 20 rows of Table 26 are further punctured to generate the (18,10) code. Therefore, the Table 26's generation matrix includes the Table 27's generation matrix, i.e., resulting in the implementation of a nested structure. In Table 27, "0" is indicative of a punctured row, and "1" is indicative of a used row. Table 26 includes Table 27, such that Tables 26 and 27 can be integrated with each other as shown in the following Table 28.

TABLE 28

| Index | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | puncturing for (20, 10) | Puncturing for (18, 10) |
|---|---|---|---|---|---|---|---|---|---|---|---|---|
| 0 | 1 | 1 | 1 | 1 | 1 | 1 | 1 | 1 | 1 | 1 | Punctured | Punctured |
| 1 | 0 | 1 | 1 | 1 | 1 | 1 | 1 | 1 | 1 | 0 | Punctured | Punctured |
| 2 | 1 | 0 | 1 | 1 | 1 | 1 | 1 | 1 | 0 | 0 |  | Punctured |
| 3 | 0 | 0 | 1 | 1 | 1 | 1 | 0 | 0 | 1 | 0 |  |  |
| 4 | 1 | 1 | 0 | 1 | 1 | 1 | 1 | 0 | 0 | 1 |  |  |
| 5 | 0 | 1 | 0 | 1 | 1 | 1 | 1 | 0 | 1 | 0 | Punctured | Punctured |
| 6 | 1 | 0 | 0 | 1 | 1 | 1 | 1 | 1 | 0 | 1 |  |  |
| 7 | 0 | 0 | 0 | 1 | 1 | 1 | 0 | 1 | 0 | 0 |  |  |
| 8 | 1 | 1 | 1 | 0 | 1 | 1 | 0 | 1 | 1 | 1 | Punctured | Punctured |
| 9 | 0 | 1 | 1 | 0 | 1 | 1 | 0 | 0 | 1 | 1 | Punctured | Punctured |
| 10 | 1 | 0 | 1 | 0 | 1 | 1 | 0 | 1 | 0 | 1 |  |  |
| 11 | 0 | 0 | 1 | 0 | 1 | 1 | 0 | 1 | 1 | 1 |  |  |
| 12 | 1 | 1 | 0 | 0 | 1 | 1 | 1 | 0 | 1 | 0 |  |  |
| 13 | 0 | 1 | 0 | 0 | 1 | 1 | 1 | 1 | 0 | 1 |  |  |
| 14 | 1 | 0 | 0 | 0 | 1 | 1 | 1 | 1 | 0 | 0 | Punctured | Punctured |
| 15 | 0 | 0 | 0 | 0 | 1 | 1 | 1 | 0 | 0 | 0 |  | Punctured |
| 16 | 1 | 1 | 1 | 1 | 0 | 1 | 1 | 1 | 1 | 1 | Punctured | Punctured |
| 17 | 0 | 1 | 1 | 1 | 0 | 1 | 1 | 0 | 0 | 1 |  |  |
| 18 | 1 | 0 | 1 | 1 | 0 | 1 | 0 | 1 | 0 | 1 |  |  |
| 19 | 0 | 0 | 1 | 1 | 0 | 1 | 0 | 1 | 1 | 0 |  |  |
| 20 | 1 | 1 | 0 | 1 | 0 | 1 | 0 | 0 | 1 | 1 | Punctured | Punctured |
| 21 | 0 | 1 | 0 | 1 | 0 | 1 | 1 | 0 | 1 | 1 |  |  |
| 22 | 1 | 0 | 0 | 1 | 0 | 1 | 1 | 1 | 1 | 0 |  |  |
| 23 | 0 | 0 | 0 | 1 | 0 | 1 | 0 | 1 | 1 | 0 | Punctured | Punctured |
| 24 | 1 | 1 | 1 | 0 | 0 | 1 | 0 | 1 | 0 | 0 |  |  |
| 25 | 0 | 1 | 1 | 0 | 0 | 1 | 0 | 0 | 1 | 0 |  |  |
| 26 | 1 | 0 | 1 | 0 | 0 | 1 | 0 | 0 | 0 | 1 | Punctured | Punctured |
| 27 | 0 | 0 | 1 | 0 | 0 | 1 | 1 | 0 | 1 | 1 |  |  |
| 28 | 1 | 1 | 0 | 0 | 0 | 1 | 0 | 0 | 0 | 1 |  |  |
| 29 | 0 | 1 | 0 | 0 | 0 | 1 | 1 | 0 | 0 | 0 | Punctured | Punctured |
| 30 | 1 | 0 | 0 | 0 | 0 | 1 | 0 | 0 | 0 | 0 |  |  |
| 31 | 0 | 0 | 0 | 0 | 0 | 1 | 0 | 0 | 0 | 0 | Punctured | Punctured |

In the meantime, the row order of Table 28 may be slightly different from the order of 3GPP TFCI coding matrixes. Therefore, if the row order of Table 28 is adjusted as in the TFCI code matrix, the adjusted result is represented by the following Table 29.

TABLE 29

| # 28 Index | TFCI Index | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | Puncturing for (20, 10) | Puncturing for (18, 10) |
|---|---|---|---|---|---|---|---|---|---|---|---|---|---|
| 30 | 0 | 1 | 0 | 0 | 0 | 0 | 1 | 0 | 0 | 0 | 0 |  |  |
| 29 | 1 | 0 | 1 | 0 | 0 | 0 | 1 | 1 | 0 | 0 | 0 | Punctured | Punctured |
| 28 | 2 | 1 | 1 | 0 | 0 | 0 | 1 | 0 | 0 | 0 | 1 |  |  |
| 27 | 3 | 0 | 0 | 1 | 0 | 0 | 1 | 1 | 0 | 1 | 1 |  |  |
| 26 | 4 | 1 | 0 | 1 | 0 | 0 | 1 | 0 | 0 | 0 | 1 | Punctured | Punctured |
| 25 | 5 | 0 | 1 | 1 | 0 | 0 | 1 | 0 | 0 | 1 | 0 |  |  |
| 24 | 6 | 1 | 1 | 1 | 0 | 0 | 1 | 0 | 1 | 0 | 0 |  |  |
| 23 | 7 | 0 | 0 | 0 | 1 | 0 | 1 | 0 | 1 | 1 | 0 | Punctured | Punctured |
| 22 | 8 | 1 | 0 | 0 | 1 | 0 | 1 | 1 | 1 | 1 | 0 |  |  |
| 21 | 9 | 0 | 1 | 0 | 1 | 0 | 1 | 1 | 0 | 1 | 1 |  |  |
| 20 | 10 | 1 | 1 | 0 | 1 | 0 | 1 | 0 | 0 | 1 | 1 | Punctured | Punctured |
| 19 | 11 | 0 | 0 | 1 | 1 | 0 | 1 | 0 | 1 | 1 | 0 |  |  |
| 18 | 12 | 1 | 0 | 1 | 1 | 0 | 1 | 0 | 1 | 0 | 1 |  |  |
| 17 | 13 | 0 | 1 | 1 | 1 | 0 | 1 | 1 | 0 | 0 | 1 |  |  |
| 16 | 14 | 1 | 1 | 1 | 1 | 0 | 1 | 1 | 1 | 1 | 1 | Punctured | Punctured |
| 14 | 15 | 1 | 0 | 0 | 0 | 1 | 1 | 1 | 1 | 0 | 0 | Punctured | Punctured |
| 13 | 16 | 0 | 1 | 0 | 0 | 1 | 1 | 1 | 1 | 0 | 1 |  |  |
| 12 | 17 | 1 | 1 | 0 | 0 | 1 | 1 | 1 | 0 | 1 | 0 |  |  |
| 11 | 18 | 0 | 0 | 1 | 0 | 1 | 1 | 0 | 1 | 1 | 1 |  |  |
| 10 | 19 | 1 | 0 | 1 | 0 | 1 | 1 | 0 | 1 | 0 | 1 |  |  |
| 9 | 20 | 0 | 1 | 1 | 0 | 1 | 1 | 0 | 0 | 1 | 1 | Punctured | Punctured |
| 8 | 21 | 1 | 1 | 1 | 0 | 1 | 1 | 0 | 1 | 1 | 1 | Punctured | Punctured |
| 7 | 22 | 0 | 0 | 0 | 1 | 1 | 1 | 0 | 1 | 0 | 0 |  |  |

TABLE 29-continued

| # 28 Index | TFCI Index | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | Puncturing for (20, 10) | Puncturing for (18, 10) |
|---|---|---|---|---|---|---|---|---|---|---|---|---|---|
| 6 | 23 | 1 | 0 | 0 | 1 | 1 | 1 | 1 | 1 | 0 | 1 | | |
| 5 | 24 | 0 | 1 | 0 | 1 | 1 | 1 | 1 | 0 | 1 | 0 | Punctured | Punctured |
| 4 | 25 | 1 | 1 | 0 | 1 | 1 | 1 | 1 | 0 | 0 | 1 | | |
| 3 | 26 | 0 | 0 | 1 | 1 | 1 | 1 | 0 | 0 | 1 | 0 | | |
| 2 | 27 | 1 | 0 | 1 | 1 | 1 | 1 | 1 | 1 | 0 | 0 | | Punctured |
| 1 | 28 | 0 | 1 | 1 | 1 | 1 | 1 | 1 | 1 | 1 | 0 | Punctured | Punctured |
| 0 | 29 | 1 | 1 | 1 | 1 | 1 | 1 | 1 | 1 | 1 | 1 | Punctured | Punctured |
| 31 | 30 | 0 | 0 | 0 | 0 | 0 | 1 | 0 | 0 | 0 | 0 | Punctured | Punctured |
| 15 | 31 | 0 | 0 | 0 | 0 | 1 | 1 | 1 | 0 | 0 | 0 | | Punctured |

Only the row order of Table 29 is different from that of Table 28, but the remaining factors other than the row order are completely equal to those of Table 28. In this case, Tables 28 and 29 have the same coding characteristics according to the coding theory. However, the method of Table 29 has an advantage in that the last 2 bits are punctured during the puncturing time from the (20,10) code to the (18,10) code. In more detail, if the last 2 bits from among 20 coding bits are punctured after the (20,10) code has been configured, the (18,10) code can be immediately generated. In other words, since the (20,10) code includes the (18,10) code, the code can be easily generated.

In the meantime, according to the second step of the first aspect of the present invention, 4 columns of the (20,10) code generation matrix are added so that the (20,10) code generation matrix is extended to the (20,14) code generation matrix. According to this embodiment, the present invention provides a generation matrix of Table 11 used as the (20,14) code generation matrix. Also, as previously stated above, maximum-/minimum-distance characteristics based on individual information-bit lengths are equal to Table 10. In addition, if the structure of Table 11 is used for both the coding length of 20 bits and the other coding length of 18 bits, the following maximum-/minimum-distance characteristics are represented by the following Table 30.

TABLE 30

| | n | | | | | | | | | | |
|---|---|---|---|---|---|---|---|---|---|---|---|
| k | 4 | 5 | 6 | 7 | 8 | 9 | 10 | 11 | 12 | 13 | 14 |
| 20 | 8 | 8 | 8 | 6 | 6 | 6 | 6 | 4 | 4 | 4 | 4 |
| 18 | 8 | 6 | 6 | 5 | 5 | 4 | 4 | 2 | 2 | 2 | 2 |

In the meantime, the code based on Table 11 has the following performance within an actual channel. A detailed description thereof is as follows.

Figure 6:
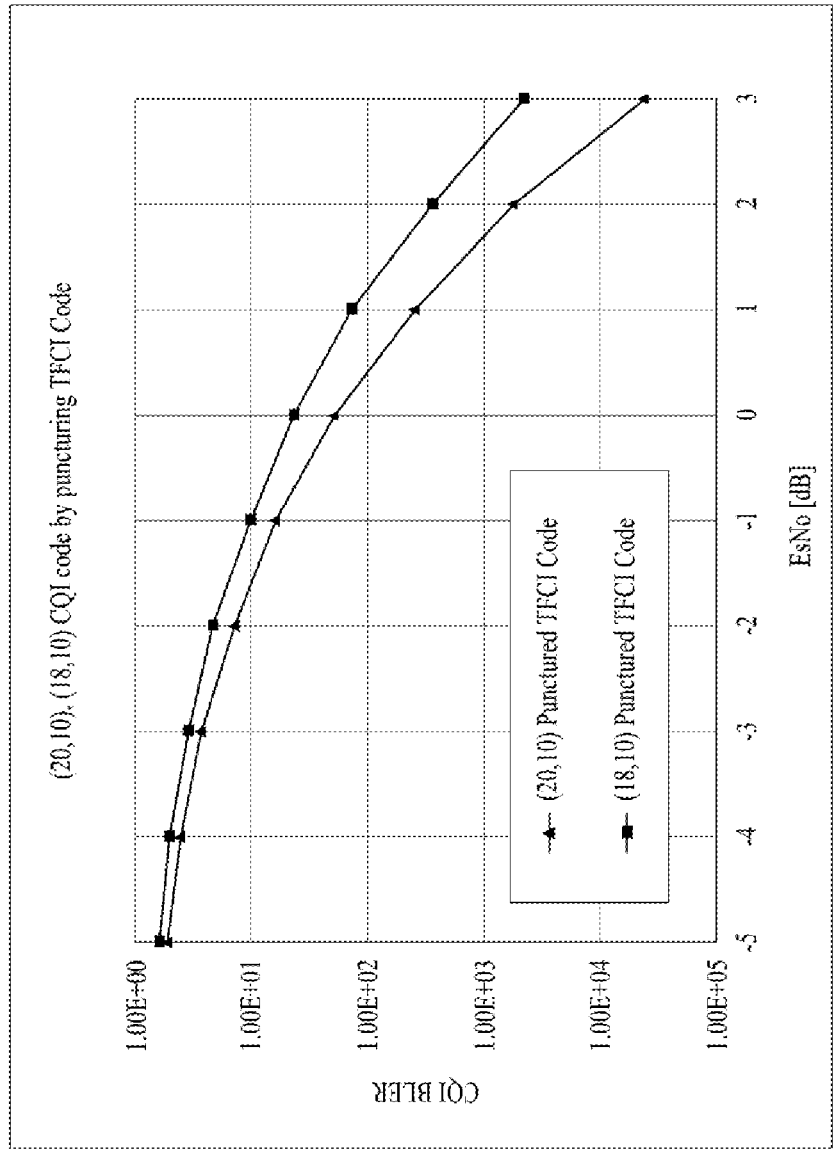
FIGS. 6 and 7 show (20,A) and (18,A) coding performances according to the present invention, respectively.
Figure 7:
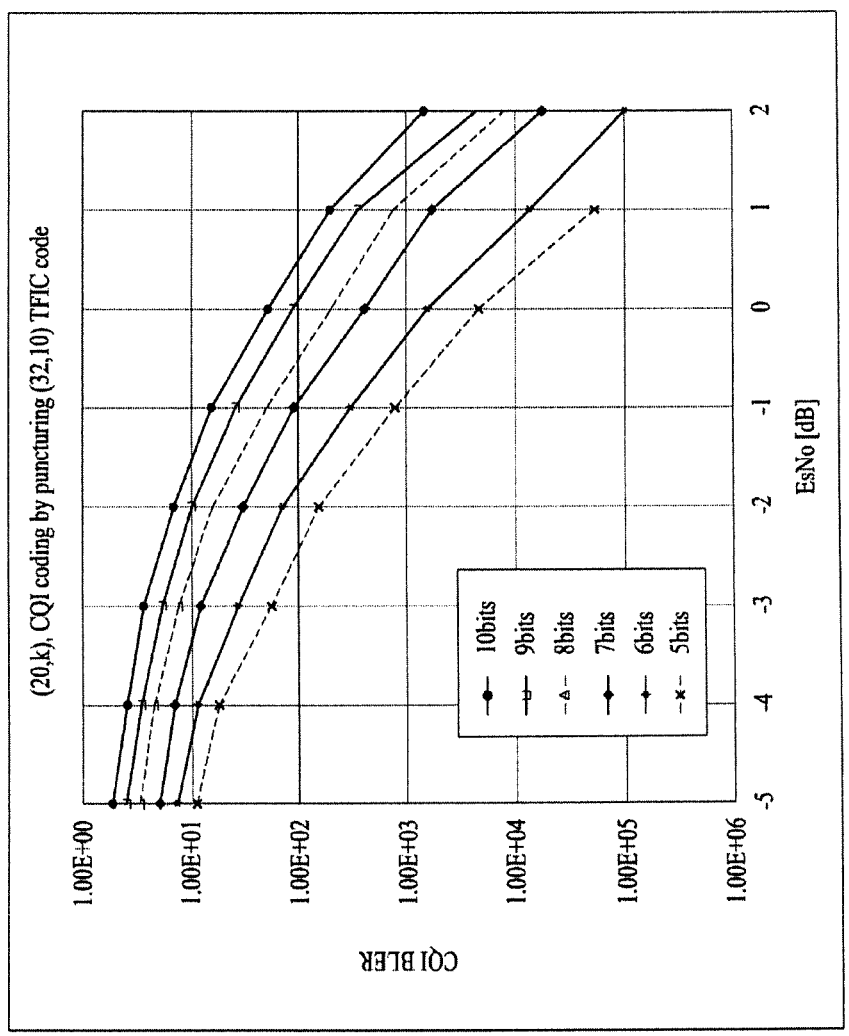

FIGS. 6 and 7 show (20,A) and (18,A) coding performances according to the present invention, respectively.

In more detail, the AWGN performances of the (20,10) and (18,10) codes are shown in FIG. 6. The performance of the (20,k) code having various information-bit lengths is shown in FIG. 7.

In the meantime, according to the third step of the first aspect of the present invention, Table 19 shows a modified generation matrix. In the modified generation matrix, the basis sequence composed of all components of "1" is located at the leftmost part of Table 19. Therefore, the (18,14)-structured generation matrix can also be modified as shown in the following Table 31.

TABLE 31

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ | $M_{i,13}$ | (18, k) |
|---|---|---|---|---|---|---|---|---|---|---|---|---|---|---|---|
| 0 | 1 | 1 | 0 | 0 | 0 | 0 | 0 | 0 | 0 | 0 | 1 | 1 | 0 | 0 | |
| 1 | 1 | 1 | 1 | 0 | 0 | 0 | 0 | 0 | 0 | 1 | 1 | 1 | 0 | 0 | |
| 2 | 1 | 0 | 0 | 1 | 0 | 0 | 1 | 0 | 1 | 1 | 1 | 1 | 1 | 1 | |
| 3 | 1 | 0 | 1 | 1 | 0 | 0 | 0 | 0 | 1 | 0 | 1 | 1 | 1 | 1 | |
| 4 | 1 | 1 | 1 | 1 | 0 | 0 | 0 | 1 | 0 | 0 | 1 | 1 | 1 | 1 | |
| 5 | 1 | 1 | 0 | 0 | 1 | 0 | 1 | 1 | 1 | 0 | 1 | 1 | 1 | 0 | |
| 6 | 1 | 0 | 1 | 0 | 1 | 0 | 1 | 0 | 1 | 1 | 1 | 1 | 1 | 0 | |
| 7 | 1 | 0 | 0 | 1 | 1 | 0 | 0 | 1 | 1 | 0 | 1 | 1 | 1 | 1 | |
| 8 | 1 | 1 | 0 | 1 | 1 | 0 | 0 | 1 | 0 | 1 | 1 | 1 | 1 | 1 | |
| 9 | 1 | 0 | 1 | 1 | 1 | 0 | 1 | 0 | 0 | 1 | 1 | 1 | 1 | 1 | |
| 10 | 1 | 0 | 1 | 0 | 0 | 1 | 1 | 1 | 0 | 1 | 1 | 1 | 1 | 1 | |
| 11 | 1 | 1 | 1 | 0 | 0 | 1 | 1 | 0 | 1 | 0 | 1 | 1 | 1 | 1 | |
| 12 | 1 | 0 | 0 | 1 | 0 | 1 | 0 | 1 | 1 | 1 | 1 | 1 | 1 | 1 | |
| 13 | 1 | 1 | 0 | 1 | 0 | 1 | 0 | 1 | 0 | 1 | 1 | 1 | 1 | 1 | |
| 14 | 1 | 0 | 0 | 0 | 1 | 1 | 0 | 1 | 0 | 0 | 1 | 0 | 1 | 1 | |
| 15 | 1 | 1 | 0 | 0 | 1 | 1 | 1 | 1 | 0 | 1 | 1 | 0 | 1 | 1 | |
| 16 | 1 | 1 | 1 | 0 | 1 | 1 | 1 | 0 | 0 | 1 | 0 | 1 | 1 | 1 | |
| 17 | 1 | 0 | 0 | 1 | 1 | 1 | 0 | 0 | 1 | 0 | 0 | 1 | 1 | 1 | |
| 18 | 1 | 1 | 0 | 1 | 1 | 1 | 1 | 1 | 0 | 0 | 0 | 0 | 0 | 1 | Puncturing |
| 19 | 1 | 0 | 0 | 0 | 0 | 1 | 1 | 0 | 0 | 0 | 0 | 0 | 0 | 1 | Puncturing |

In other words, the (18,14) code generation matrix may be generated when the last 2 rows of the generation matrix of Table 19 are punctured.

If the (20,14) generation matrix is used as shown in Table 19 and the (18,14) generation matrix is used as shown in Table 31, the minimum distance characteristics based on the information bit numbers can be represented by the following Table 32.

TABLE 32

| n | k | | | | | | | | | | | | | |
|---|---|---|---|---|---|---|---|---|---|---|---|---|---|---|
| | 1 | 2 | 3 | 4 | 5 | 6 | 7 | 8 | 9 | 10 | 11 | 12 | 13 | 14 |
| 20 | 20 | 10 | 8 | 8 | 8 | 8 | 6 | 6 | 6 | 6 | 4 | 4 | 4 | 4 |
| Last two row puncturing 18 | 18 | 9 | 8 | 6 | 6 | 6 | 5 | 5 | 4 | 4 | 2 | 2 | 2 | 2 |

In the case of generating the (20,10) code by puncturing the (32,10) code, the channel coding method according to the present invention is designed to have the best performance in all the (20,10), (18,10), and (16,10) codes. The (32,10) code of Table 28 is formed by the permutation of only rows of the 3GPP release99 (32,10) TFCI code, such that the (32,10) code of Table 28 and the 3GPP release99 (32,10) TFCI code are equal to each other in the aspect of the coding theory. However, from the viewpoint of the puncturing process, an index of the (32,10) code of Table 28 may be different from that of the 3GPP release99 (32,10) TFCI code, and the results are shown the following Tables 33, 34, and 35.

TABLE 33

| | TFCI | | | | | | | | | | | | | | | | |
|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 |
| (20, k) | | P | | | P | | | P | | | P | | | | P | P | |
| (18, k) | | P | | | P | | | P | P | | P | | | | P | P | |
| (16, k) | | P | | | P | | | P | P | | P | P | | | P | P | |

| | TFCI | | | | | | | | | | | | | | |
|---|---|---|---|---|---|---|---|---|---|---|---|---|---|---|---|
| | 17 | 18 | 19 | 20 | 21 | 22 | 23 | 24 | 25 | 26 | 27 | 28 | 29 | 30 | 31 |
| (20, k) | | | | P | P | | | P | | | | P | P | P | |
| (18, k) | | | | P | P | | | P | | | P | P | P | P | |
| (16, k) | | | | P | P | P | | P | | | | P | P | P | P |

TABLE 34

| | TFCI | | | | | | | | | | | | | | | | | | | |
|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 | 18 | 19 |
| (20, k) | | | | | | | | | | | | | | | | | | | | |
| (18, k) | | | | | | P | | | | | | | | | | | | | P | |
| (16, k) | | | | | | P | | P | | | | | | | | | P | | P | |

TABLE 35

| | Patent | | | | | | | | | | | | | | | |
|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 |
| (20, k) | P | P | | | | P | | | P | P | | | | | P | |
| (18, k) | | | P | | | | | | | P | | | | | | |
| (16, k) | | | P | | | | | | P | | | | | | | |

| | Patent | | | | | | | | | | | | | | | |
|---|---|---|---|---|---|---|---|---|---|---|---|---|---|---|---|---|
| | 16 | 17 | 18 | 19 | 20 | 21 | 22 | 23 | 24 | 25 | 26 | 27 | 28 | 29 | 30 | 31 |
| (20, k) | P | | | P | | P | | | P | | | P | | P | | P |
| (18, k) | | | | | | P | | | | | | | | | | |
| (16, k) | | | P | | P | | | | | | | | | | | |

Table 33 shows the puncturing locations of the best-performance (20,10), (18,10), and (16,10) codes on the basis of the row index of the 3GPP release99 (32,10) TFCI code. Table 34 shows the puncturing locations of the (18,10) and (16,10) codes on the basis of the index of the (20,10) code. Table 35 shows the puncturing patterns on the basis of the (32,10)-format index of Table 28.

In the meantime, the following Table 36 is indicative of a conventional sequence table indicating optimum puncturing locations.

TABLE 36

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ | $M_{i,13}$ | (18, k) | (16, k) |
|---|---|---|---|---|---|---|---|---|---|---|---|---|---|---|---|---|
| 0 | 1 | 0 | 0 | 0 | 0 | 1 | 0 | 0 | 0 | 0 | 1 | 1 | 0 | 0 | | |
| 1 | 1 | 1 | 0 | 0 | 0 | 1 | 0 | 0 | 0 | 1 | 1 | 1 | 0 | 0 | | |
| 2 | 0 | 0 | 1 | 0 | 0 | 1 | 1 | 0 | 1 | 1 | 1 | 1 | 1 | 1 | | |
| 3 | 0 | 1 | 1 | 0 | 0 | 1 | 0 | 0 | 1 | 0 | 1 | 1 | 1 | 1 | | |
| 4 | 1 | 1 | 1 | 0 | 0 | 1 | 0 | 1 | 0 | 0 | 1 | 1 | 1 | 1 | | |
| 5 | 1 | 0 | 0 | 1 | 0 | 1 | 1 | 1 | 1 | 0 | 1 | 1 | 1 | 0 | Puncturing | Puncturing |
| 6 | 0 | 1 | 0 | 1 | 0 | 1 | 1 | 0 | 1 | 1 | 1 | 1 | 1 | 0 | | |
| 7 | 0 | 0 | 1 | 1 | 0 | 1 | 0 | 1 | 1 | 0 | 1 | 1 | 1 | 1 | | Puncturing |
| 8 | 1 | 0 | 1 | 1 | 0 | 1 | 0 | 1 | 0 | 1 | 1 | 1 | 1 | 1 | | |
| 9 | 0 | 1 | 1 | 1 | 0 | 1 | 1 | 0 | 0 | 1 | 1 | 1 | 1 | 1 | | |
| 10 | 0 | 1 | 0 | 0 | 1 | 1 | 1 | 1 | 0 | 1 | 1 | 1 | 1 | 1 | | |
| 11 | 1 | 1 | 0 | 0 | 1 | 1 | 1 | 0 | 1 | 0 | 1 | 1 | 1 | 1 | | |
| 12 | 0 | 0 | 1 | 0 | 1 | 1 | 0 | 1 | 1 | 1 | 1 | 1 | 1 | 1 | | |
| 13 | 1 | 0 | 1 | 0 | 1 | 1 | 0 | 1 | 0 | 1 | 1 | 1 | 1 | 1 | | |
| 14 | 0 | 0 | 0 | 1 | 1 | 1 | 0 | 0 | 0 | 1 | 0 | 1 | 1 | 1 | | Puncturing |
| 15 | 1 | 0 | 0 | 1 | 1 | 1 | 1 | 0 | 1 | 1 | 0 | 1 | 1 | 1 | | |
| 16 | 1 | 1 | 0 | 1 | 1 | 1 | 1 | 0 | 0 | 1 | 0 | 1 | 1 | 1 | | |
| 17 | 0 | 0 | 1 | 1 | 1 | 1 | 0 | 0 | 1 | 0 | 0 | 1 | 1 | 1 | | |
| 18 | 1 | 0 | 1 | 1 | 1 | 1 | 1 | 1 | 0 | 0 | 0 | 0 | 0 | 1 | Puncturing | Puncturing |
| 19 | 0 | 0 | 0 | 0 | 1 | 1 | 1 | 0 | 0 | 0 | 0 | 0 | 0 | 1 | | |

As can be seen from Table 36, the puncturing locations of the (18,10) and (16,10) codes are maximally overlapped with each other. Also, the minimum-distance performance is shown in the following Table 37.

TABLE 37

| | k | | | | | | | | | | | | | |
|---|---|---|---|---|---|---|---|---|---|---|---|---|---|---|
| n | 1 | 2 | 3 | 4 | 5 | 6 | 7 | 8 | 9 | 10 | 11 | 12 | 13 | 14 |
| 20 | 20 | 10 | 8 | 8 | 8 | 8 | 6 | 6 | 6 | 6 | 4 | 4 | 4 | 4 |
| 18 last two | 18 | 9 | 8 | 6 | 6 | 6 | 5 | 5 | 4 | 4 | 2 | 2 | 2 | 2 |
| 18 intermediate | 18 | 8 | 8 | 7 | 7 | 6 | 5 | 4 | 4 | 4 | 2 | 2 | 2 | 2 |
| 16 last four | 16 | 8 | 7 | 6 | 6 | 4 | 3 | 3 | 3 | 3 | 0 | 0 | 0 | 0 |
| 16 intermediate | 16 | 8 | 8 | 6 | 6 | 4 | 4 | 4 | 4 | 4 | 1 | 1 | 1 | 1 |
| 16 (first 2 + last 2) | 16 | 7 | 7 | 6 | 6 | 5 | 3 | 3 | 3 | 3 | 2 | 2 | 0 | 0 |

In Table 37, "20" is indicative of the (20,k) code, "18 last two" is indicative of the (18,k) code formed by the puncturing of the last 2 rows of the (20,k) code, and "18 intermediate" is indicative of another (18,k) code formed by the puncturing of the 5-th and 18-th rows on the basis of the (20,k) code of Table 36. "16 last four" is indicative of the (16,k) code formed by the puncturing of the last 4 rows of the (20,k) code. "16 intermediate" is indicative of the (16,k) code formed by the puncturing of the 5-th, 7-th, 14-th and 18-th rows on the basis of the (20,k) code of Table 36. "16 (first2+last2)" is indicative of another (16,k) code formed by the puncturing of the front 2 rows and the last 2 rows.

In the meantime, the (n,k) code (where n=20, 18, 16, k≤14) formed when the order of columns is changed for the (18,k) and (16,k) codes will hereinafter be described in detail.

The following Table 38 is a basis sequence Table formed when the 10-th basis sequence $M_{i,10}$ is replaced with the other basis sequence $M_{i,11}$, such that the code performance increases.

TABLE 38

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ | $M_{i,13}$ | (18, k) | (16, k) |
|---|---|---|---|---|---|---|---|---|---|---|---|---|---|---|---|---|
| 0 | 1 | 0 | 0 | 0 | 0 | 1 | 0 | 0 | 0 | 0 | 1 | 1 | 0 | 0 | | |
| 1 | 1 | 1 | 0 | 0 | 0 | 1 | 0 | 0 | 0 | 1 | 1 | 1 | 0 | 0 | | |

TABLE 38-continued

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ | $M_{i,13}$ | (18, k) | (16, k) |
|---|---|---|---|---|---|---|---|---|---|---|---|---|---|---|---|---|
| 2 | 0 | 0 | 1 | 0 | 0 | 1 | 1 | 0 | 1 | 1 | 1 | 1 | 1 | 1 | | |
| 3 | 0 | 1 | 1 | 0 | 0 | 1 | 0 | 0 | 1 | 0 | 1 | 1 | 1 | 1 | | |
| 4 | 1 | 1 | 1 | 0 | 0 | 1 | 0 | 1 | 0 | 0 | 1 | 1 | 1 | 1 | | |
| 5 | 1 | 0 | 0 | 1 | 0 | 1 | 1 | 1 | 1 | 0 | 1 | 1 | 1 | 0 | Puncturing | Puncturing |
| 6 | 0 | 1 | 0 | 1 | 0 | 1 | 1 | 0 | 1 | 1 | 1 | 1 | 1 | 0 | | |
| 7 | 0 | 0 | 1 | 1 | 0 | 1 | 0 | 1 | 1 | 0 | 1 | 1 | 1 | 1 | | Puncturing |
| 8 | 1 | 0 | 1 | 1 | 0 | 1 | 0 | 1 | 0 | 1 | 1 | 1 | 1 | 1 | | |
| 9 | 0 | 1 | 1 | 1 | 0 | 1 | 1 | 0 | 0 | 1 | 1 | 1 | 1 | 1 | | |
| 10 | 0 | 1 | 0 | 0 | 1 | 1 | 1 | 1 | 0 | 1 | 1 | 1 | 1 | 1 | | |
| 11 | 1 | 1 | 0 | 0 | 1 | 1 | 1 | 0 | 1 | 0 | 1 | 1 | 1 | 1 | | |
| 12 | 0 | 0 | 1 | 0 | 1 | 1 | 0 | 1 | 1 | 1 | 1 | 1 | 1 | 1 | | |
| 13 | 1 | 0 | 1 | 0 | 1 | 1 | 0 | 1 | 0 | 1 | 1 | 1 | 1 | 1 | | |
| 14 | 0 | 0 | 0 | 1 | 1 | 1 | 0 | 1 | 0 | 0 | 0 | 1 | 1 | 1 | | Puncturing |
| 15 | 1 | 0 | 0 | 1 | 1 | 1 | 1 | 1 | 0 | 1 | 0 | 1 | 1 | 1 | | |
| 16 | 1 | 1 | 0 | 1 | 1 | 1 | 1 | 0 | 0 | 1 | 1 | 0 | 1 | 1 | | |
| 17 | 0 | 0 | 1 | 1 | 1 | 1 | 0 | 0 | 1 | 0 | 1 | 0 | 1 | 1 | | |
| 18 | 1 | 0 | 1 | 1 | 1 | 1 | 1 | 1 | 0 | 0 | 0 | 0 | 0 | 1 | Puncturing | Puncturing |
| 19 | 0 | 0 | 0 | 0 | 1 | 1 | 1 | 0 | 0 | 0 | 0 | 0 | 0 | 1 | | |

Based on the above-mentioned Table 38, the minimum-distance performance is shown in the following Table 39.

TABLE 39

| n | k | | | | | | | | | | | | | |
|---|---|---|---|---|---|---|---|---|---|---|---|---|---|---|
| | 1 | 2 | 3 | 4 | 5 | 6 | 7 | 8 | 9 | 10 | 11 | 12 | 13 | 14 |
| 20 | 20 | 10 | 8 | 8 | 8 | 8 | 6 | 6 | 6 | 6 | 4 | 4 | 4 | 4 |
| 18 last | 18 | 9 | 8 | 6 | 6 | 6 | 5 | 5 | 4 | 4 | 2 | 2 | 2 | 2 |
| 18 intermediate | 18 | 8 | 8 | 7 | 7 | 6 | 5 | 4 | 4 | 4 | 2 | 2 | 2 | 2 |
| 16 | 16 | 8 | 8 | 6 | 6 | 4 | 4 | 4 | 4 | 4 | 2 | 1 | 1 | 1 |

As can be seen from Table 39, a minimum distance of the (16,11) code increases from "1" to "2".

In the meantime, the (n,k) code (where n=20, 18, 16, k≤15) formed when the order of columns is changed for the (18,k) and (16,k) codes will hereinafter be described in detail.

The following Table 40 shows the (20,15) generation matrix to which a single basis sequence is added to support 15 information bits.

TABLE 40

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ | $M_{i,13}$ | $M_{i,14}$ | (18, k) | (16, k) |
|---|---|---|---|---|---|---|---|---|---|---|---|---|---|---|---|---|---|
| 0 | 1 | 0 | 0 | 0 | 0 | 1 | 0 | 0 | 0 | 0 | 1 | 1 | 0 | 0 | 0 | | |
| 1 | 1 | 1 | 0 | 0 | 0 | 1 | 0 | 0 | 0 | 1 | 1 | 1 | 0 | 0 | 1 | | |
| 2 | 0 | 0 | 1 | 0 | 0 | 1 | 1 | 0 | 1 | 1 | 1 | 1 | 1 | 1 | 0 | | |
| 3 | 0 | 1 | 1 | 0 | 0 | 1 | 0 | 0 | 1 | 0 | 1 | 1 | 1 | 1 | 1 | | |
| 4 | 1 | 1 | 1 | 0 | 0 | 1 | 0 | 1 | 0 | 0 | 1 | 1 | 1 | 1 | 0 | | |
| 5 | 1 | 0 | 0 | 1 | 0 | 1 | 1 | 1 | 1 | 0 | 1 | 1 | 1 | 0 | 0 | Puncturing | Puncturing |
| 6 | 0 | 1 | 0 | 1 | 0 | 1 | 1 | 0 | 1 | 1 | 1 | 1 | 1 | 0 | 1 | | |
| 7 | 0 | 0 | 1 | 1 | 0 | 1 | 0 | 1 | 1 | 0 | 1 | 1 | 1 | 1 | 0 | | Puncturing |
| 8 | 1 | 0 | 1 | 1 | 0 | 1 | 0 | 1 | 0 | 1 | 1 | 1 | 1 | 1 | 0 | | |
| 9 | 0 | 1 | 1 | 1 | 0 | 1 | 1 | 0 | 0 | 1 | 1 | 1 | 1 | 1 | 1 | | |
| 10 | 0 | 1 | 0 | 0 | 1 | 1 | 1 | 1 | 0 | 1 | 1 | 1 | 1 | 1 | 1 | | |
| 11 | 1 | 1 | 0 | 0 | 1 | 1 | 1 | 0 | 1 | 0 | 1 | 1 | 1 | 1 | 0 | | |
| 12 | 0 | 0 | 1 | 0 | 1 | 1 | 0 | 1 | 1 | 1 | 1 | 1 | 1 | 1 | 0 | | |
| 13 | 1 | 0 | 1 | 0 | 1 | 1 | 0 | 1 | 0 | 1 | 1 | 1 | 1 | 1 | 1 | | |
| 14 | 0 | 0 | 0 | 1 | 1 | 1 | 0 | 1 | 0 | 0 | 0 | 1 | 1 | 1 | 0 | | Puncturing |
| 15 | 1 | 0 | 0 | 1 | 1 | 1 | 1 | 1 | 0 | 1 | 0 | 1 | 1 | 1 | 0 | | |
| 16 | 1 | 1 | 0 | 1 | 1 | 1 | 1 | 0 | 0 | 1 | 1 | 0 | 1 | 1 | 0 | | |
| 17 | 0 | 0 | 1 | 1 | 1 | 1 | 0 | 0 | 1 | 0 | 1 | 0 | 1 | 1 | 0 | | |
| 18 | 1 | 0 | 1 | 1 | 1 | 1 | 1 | 1 | 0 | 0 | 0 | 0 | 0 | 1 | 0 | Puncturing | Puncturing |
| 19 | 0 | 0 | 0 | 0 | 1 | 1 | 1 | 0 | 0 | 0 | 0 | 0 | 0 | 1 | 1 | | |

As can be seen from the above-mentioned Table 40, the 15-th basis sequence is added to Table 38. Although the 15-th basis sequence is added to other Tables indicating the (20,14) generation matrix, the same performance appears. Any one of all methods described in the above-mentioned embodiments can also be used to puncture the coding bits. In this case, if some parts of the all methods are used, the following example is provided.

In the example of Table 40, minimum-distance characteristics are shown in Table 41.

TABLE 41

| n | k |   |   |   |   |   |   |   |   |    |    |    |    |    |    |
|---|---|---|---|---|---|---|---|---|---|----|----|----|----|----|----|
|   | 1 | 2 | 3 | 4 | 5 | 6 | 7 | 8 | 9 | 10 | 11 | 12 | 13 | 14 | 15 |
| 20 | 20 | 10 | 8 | 8 | 8 | 8 | 6 | 6 | 6 | 6 | 4 | 4 | 4 | 4 | 3 |
| 18 last | 18 | 9 | 8 | 6 | 6 | 6 | 5 | 5 | 4 | 4 | 2 | 2 | 2 | 2 | 2 |
| 18 intermediate | 18 | 8 | 8 | 7 | 7 | 6 | 5 | 4 | 4 | 4 | 2 | 2 | 2 | 2 | 1 |
| 16 intermediate | 16 | 8 | 8 | 6 | 6 | 4 | 4 | 4 | 4 | 4 | 2 | 1 | 1 | 1 | 1 |

It should be noted that most terminology disclosed in the present invention is defined in consideration of functions of the present invention, and can be differently determined according to intention of those skilled in the art or usual practices. Therefore, it is preferable that the above-mentioned terminology be understood on the basis of all contents disclosed in the present invention. It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

That is, the present invention is not limited to only the embodiments described herein and includes the widest range equivalent to principles and features disclosed herein.

As apparent from the above description, the channel coding method according to the present invention can be easily applied to the other channel coding of the 3GPP LTE system which transmits CQI information to an uplink via a PUSCH channel. However, the above-mentioned methods are not limited to only the above 3GPP LTE system, but they can also be applied to a variety of communication schemes, each of which performs the block coding on variable-length information.

What is claimed is:

1. A method for channel-coding information bits, the method comprising:
channel-coding the information bits using 'A' basis sequences $M_{i,0}$ to $M_{i,A-1}$ from among a plurality of basis sequences for a block code,
wherein the plurality of basis sequences for the block code include $M_{i,0}$ to $M_{i,12}$ as defined in the following Table 1:

TABLE 1

| i | $M_{i,0}$ | $M_{i,1}$ | $M_{i,2}$ | $M_{i,3}$ | $M_{i,4}$ | $M_{i,5}$ | $M_{i,6}$ |
|---|---|---|---|---|---|---|---|
| 0 | 1 | 1 | 0 | 0 | 0 | 0 | 0 |
| 1 | 1 | 1 | 1 | 0 | 0 | 0 | 0 |
| 2 | 1 | 0 | 0 | 1 | 0 | 0 | 1 |
| 3 | 1 | 0 | 1 | 1 | 0 | 0 | 0 |
| 4 | 1 | 1 | 1 | 1 | 0 | 0 | 0 |
| 5 | 1 | 1 | 0 | 0 | 1 | 0 | 1 |
| 6 | 1 | 0 | 1 | 0 | 1 | 0 | 1 |
| 7 | 1 | 0 | 0 | 1 | 1 | 0 | 1 |
| 8 | 1 | 1 | 0 | 1 | 1 | 0 | 0 |
| 9 | 1 | 0 | 1 | 1 | 1 | 0 | 1 |

TABLE 1-continued

| 10 | 1 | 0 | 1 | 0 | 0 | 1 | 1 |
| 11 | 1 | 1 | 1 | 0 | 0 | 1 | 1 |
| 12 | 1 | 0 | 0 | 1 | 0 | 1 | 0 |
| 13 | 1 | 1 | 0 | 1 | 0 | 1 | 0 |
| 14 | 1 | 0 | 0 | 0 | 1 | 1 | 0 |
| 15 | 1 | 1 | 0 | 0 | 1 | 1 | 1 |
| 16 | 1 | 1 | 1 | 0 | 1 | 1 | 1 |
| 17 | 1 | 0 | 0 | 1 | 1 | 1 | 0 |
| 18 | 1 | 1 | 0 | 1 | 1 | 1 | 1 |
| 19 | 1 | 0 | 0 | 0 | 0 | 1 | 1 |

| i | $M_{i,7}$ | $M_{i,8}$ | $M_{i,9}$ | $M_{i,10}$ | $M_{i,11}$ | $M_{i,12}$ |
|---|---|---|---|---|---|---|
| 0 | 0 | 0 | 0 | 1 | 1 | 0 |
| 1 | 0 | 0 | 1 | 1 | 1 | 0 |
| 2 | 0 | 1 | 1 | 1 | 1 | 1 |
| 3 | 0 | 1 | 0 | 1 | 1 | 1 |
| 4 | 1 | 0 | 0 | 1 | 1 | 1 |
| 5 | 1 | 1 | 0 | 1 | 1 | 1 |
| 6 | 0 | 1 | 1 | 1 | 1 | 1 |
| 7 | 1 | 1 | 0 | 1 | 1 | 1 |
| 8 | 1 | 0 | 1 | 1 | 1 | 1 |
| 9 | 0 | 0 | 1 | 1 | 1 | 1 |
| 10 | 1 | 0 | 1 | 1 | 1 | 1 |
| 11 | 0 | 1 | 0 | 1 | 1 | 1 |
| 12 | 1 | 1 | 1 | 1 | 1 | 1 |
| 13 | 1 | 0 | 1 | 1 | 1 | 1 |
| 14 | 1 | 0 | 0 | 1 | 0 | 1 |
| 15 | 1 | 0 | 1 | 1 | 0 | 1 |
| 16 | 0 | 0 | 1 | 0 | 1 | 1 |
| 17 | 0 | 1 | 0 | 0 | 1 | 1 |
| 18 | 1 | 0 | 0 | 0 | 0 | 0 |
| 19 | 0 | 0 | 0 | 0 | 0 | 0, | and
wherein 'A' is 11, 12 or 13.

2. The method according to claim 1, wherein the information bits include at least one of a channel quality information (CQI) bit, a precoding matrix indicator (PMI), a channel rank indicator (RI), and acknowledgement/negative-acknowledgement (ACK/NACK) data.

3. The method according to claim 1, wherein the channel-coded information bits are transmitted via a physical uplink control channel (PUCCH).

4. A device for channel-coding information bits, the device configured to:
channel-code the information bits using 'A' basis sequences $M_{i,0}$ to $M_{i,A-1}$ from among a plurality of basis sequences for a block code,
wherein the plurality of basis sequences for the block code include $M_{i,0}$ to $M_{i,12}$ as defined in the following Table 1:

TABLE 1

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|
| 0 | 1 | 1 | 0 | 0 | 0 | 0 | 0 | 0 | 0 | 0 | 1 | 1 | 0 |
| 1 | 1 | 1 | 1 | 0 | 0 | 0 | 0 | 0 | 0 | 1 | 1 | 1 | 0 |
| 2 | 1 | 0 | 0 | 1 | 0 | 0 | 1 | 0 | 1 | 1 | 1 | 1 | 1 |

TABLE 1-continued

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|
| 3 | 1 | 0 | 1 | 1 | 0 | 0 | 0 | 0 | 1 | 0 | 1 | 1 | 1 |
| 4 | 1 | 1 | 1 | 1 | 0 | 0 | 0 | 1 | 0 | 0 | 1 | 1 | 1 |
| 5 | 1 | 1 | 0 | 0 | 1 | 0 | 1 | 1 | 1 | 0 | 1 | 1 | 1 |
| 6 | 1 | 0 | 1 | 0 | 1 | 0 | 1 | 0 | 1 | 1 | 1 | 1 | 1 |
| 7 | 1 | 0 | 0 | 1 | 1 | 0 | 0 | 1 | 1 | 0 | 1 | 1 | 1 |
| 8 | 1 | 1 | 0 | 1 | 1 | 0 | 0 | 0 | 1 | 1 | 1 | 1 | 1 |
| 9 | 1 | 0 | 1 | 1 | 1 | 0 | 1 | 0 | 0 | 1 | 1 | 1 | 1 |
| 10 | 1 | 0 | 1 | 0 | 0 | 1 | 1 | 1 | 0 | 1 | 1 | 1 | 1 |
| 11 | 1 | 1 | 1 | 0 | 0 | 1 | 1 | 0 | 1 | 0 | 1 | 1 | 1 |
| 12 | 1 | 0 | 0 | 1 | 0 | 1 | 0 | 1 | 1 | 1 | 1 | 1 | 1 |
| 13 | 1 | 1 | 0 | 1 | 0 | 1 | 0 | 1 | 0 | 1 | 1 | 1 | 1 |
| 14 | 1 | 0 | 0 | 0 | 1 | 1 | 0 | 1 | 0 | 0 | 1 | 0 | 1 |
| 15 | 1 | 1 | 0 | 0 | 1 | 1 | 1 | 1 | 0 | 1 | 1 | 0 | 1 |
| 16 | 1 | 1 | 1 | 0 | 1 | 1 | 1 | 0 | 0 | 1 | 0 | 1 | 1 |
| 17 | 1 | 0 | 0 | 1 | 1 | 1 | 0 | 0 | 1 | 0 | 0 | 1 | 1 |
| 18 | 1 | 1 | 0 | 1 | 1 | 1 | 1 | 1 | 0 | 0 | 0 | 0 | 0 |
| 19 | 1 | 0 | 0 | 0 | 0 | 1 | 1 | 0 | 0 | 0 | 0 | 0 | 0, | and wherein 'A' is 11, 12 or 13.

5. The device according to claim 4, wherein the information bits include at least one of a channel quality information (CQI) bit, a precoding matrix indicator (PMI), a channel rank indicator (RI), and acknowledgement/negative-acknowledgement (ACK/NACK) data.

6. The device according to claim 4, wherein the device is further configured to transmit the channel-coded information bits via a physical uplink control channel (PUCCH).

* * * * *